(12) United States Patent
Kawabe et al.

(10) Patent No.: US 8,050,572 B2
(45) Date of Patent: Nov. 1, 2011

(54) RECEIVER AND ELECTRONIC DEVICE

(75) Inventors: Isamu Kawabe, Kashiba (JP); Naruichi Yokogawa, Kashihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 811 days.

(21) Appl. No.: 12/127,680

(22) Filed: May 27, 2008

(65) Prior Publication Data

US 2008/0298816 A1    Dec. 4, 2008

(30) Foreign Application Priority Data

May 29, 2007  (JP) .................................. 2007-142638
Nov. 8, 2007  (JP) .................................. 2007-290865
May 20, 2008  (JP) .................................. 2008-132223

(51) Int. Cl.
*H04B 10/06* (2006.01)
(52) U.S. Cl. ........................... 398/202; 398/15; 398/208
(58) Field of Classification Search .................. 398/202, 398/203, 204, 208, 209, 15, 25
See application file for complete search history.

(56) References Cited

U.S. PATENT DOCUMENTS

2004/0062362 A1   4/2004 Matsuya
2005/0087688 A1 * 4/2005 Yokogawa et al. ........ 250/338.1
2006/0008280 A1 * 1/2006 Yokogawa et al. ........... 398/202
2007/0127604 A1 * 6/2007 Inoue et al. .................... 375/341

FOREIGN PATENT DOCUMENTS

| JP | 2004135321 A | 4/2004 |
| JP | 2006211510 A | 8/2006 |
| JP | 2006304076 A | 11/2006 |
| JP | 200727833 A | 2/2007 |

* cited by examiner

*Primary Examiner* — Leslie Pascal
(74) *Attorney, Agent, or Firm* — Birch, Stewart, Kolasch & Birch, LLP

(57) ABSTRACT

An abnormal pulse detection circuit in a receiver of the present invention includes: an incoming pulse edge detection circuit which detects the moment of rise of an input signal and outputs the result of the detection as an edge detection signal; a muting reference pulse generation circuit which generates a muting reference pulse based on the edge detection signal; a logic circuit which outputs a signal indicating a negative AND of the muting reference pulse and the input signal; a muting signal generation circuit which generates a muting signal from the output signal of the logic circuit; and a switching circuit which outputs the input signal or the muting signal. The receiver of the present invention can therefore reduce discomfort in hearing reproduced sound in case where a noise occurs in an audio signal due to a variation in pulse width.

6 Claims, 31 Drawing Sheets

F I G. 1
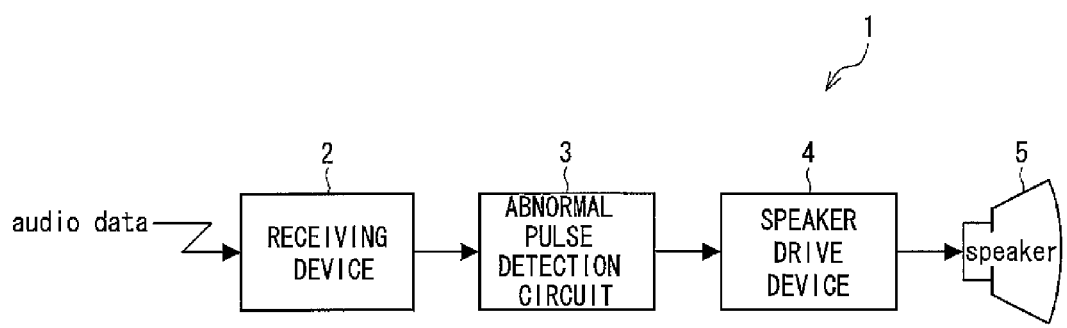

FIG. 6
(a)
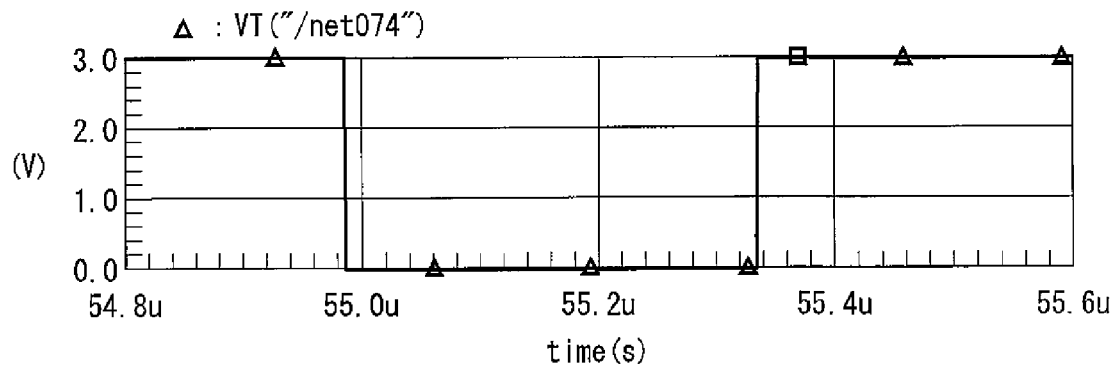
(b)
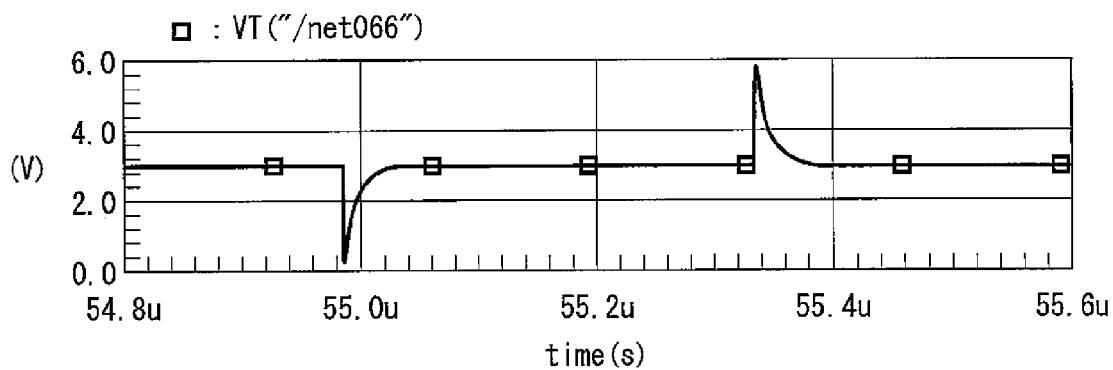
(c)
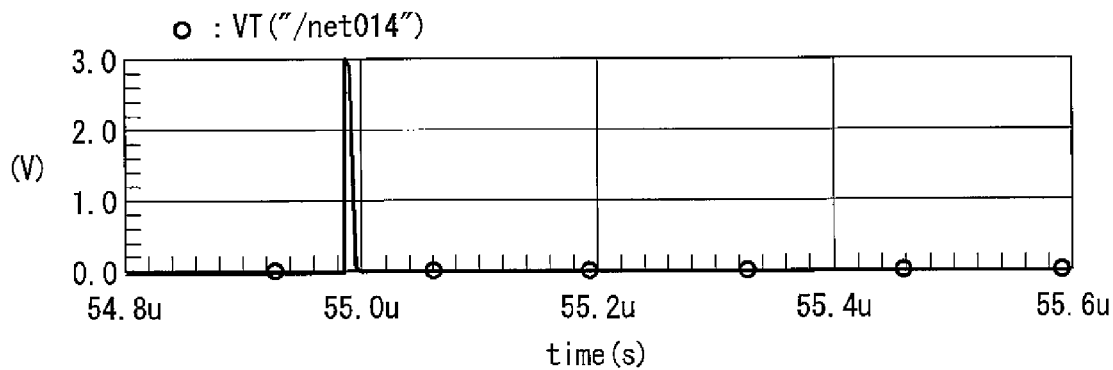

FIG. 11
(a)
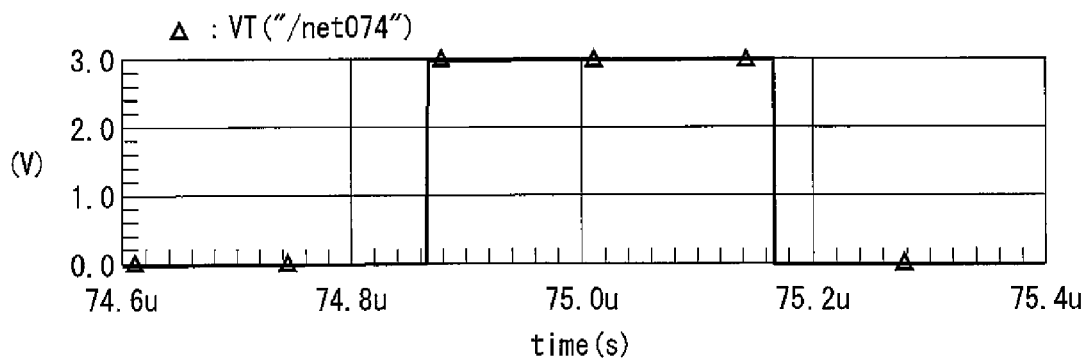
(b)
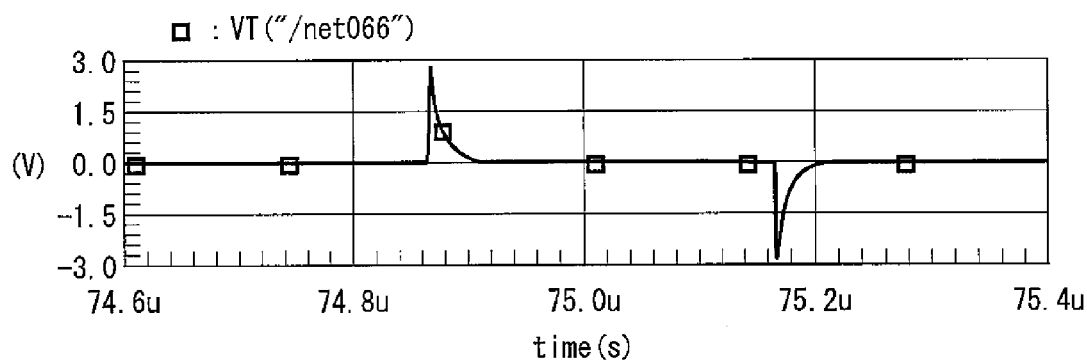
(c)
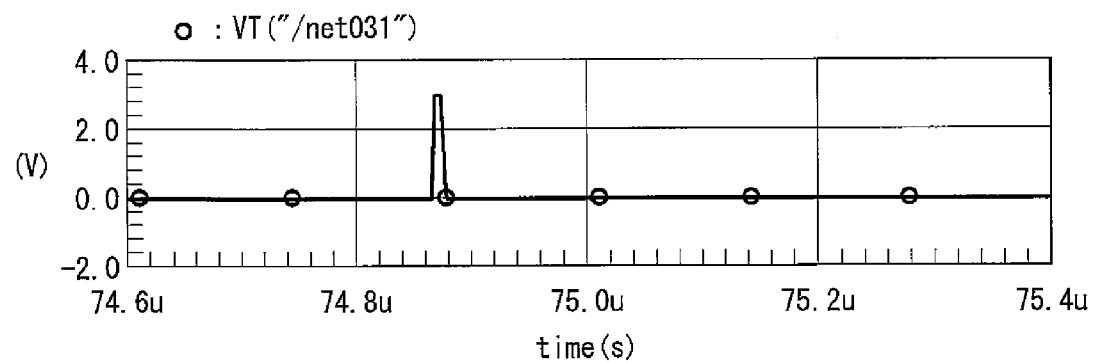

F I G. 1 9
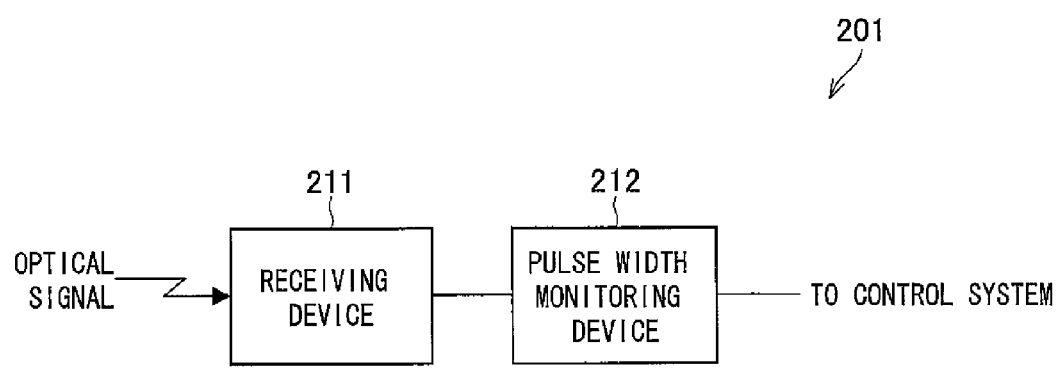

FIG. 21
(a)
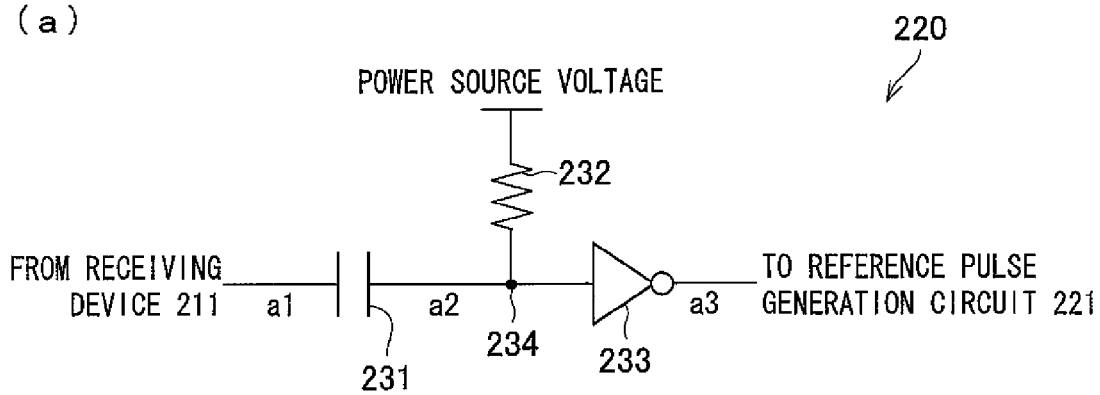
(b)
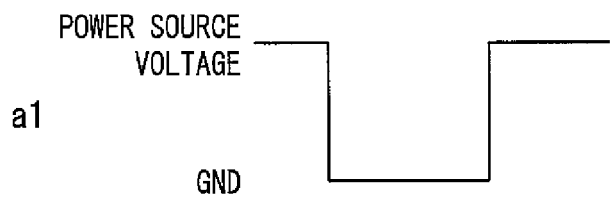
(c)
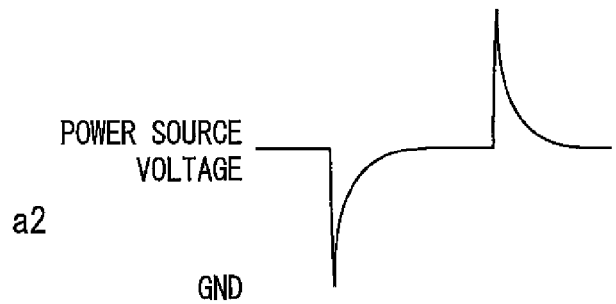
(d)
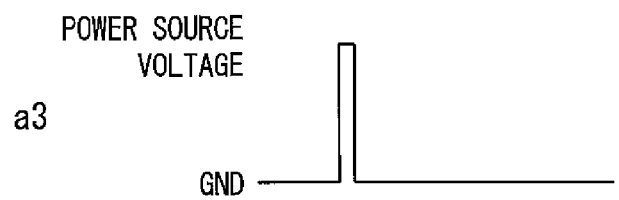

FIG. 22
(a)
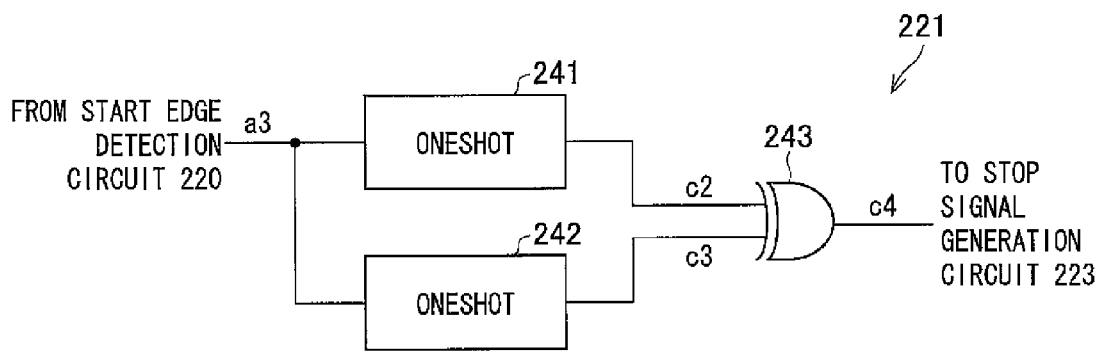
(b)
(c)
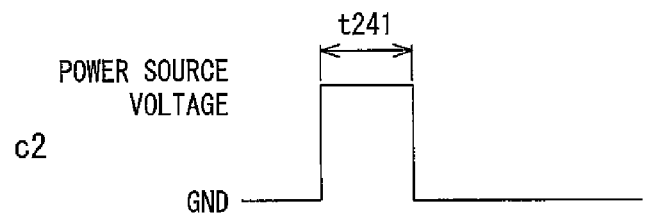
(d)
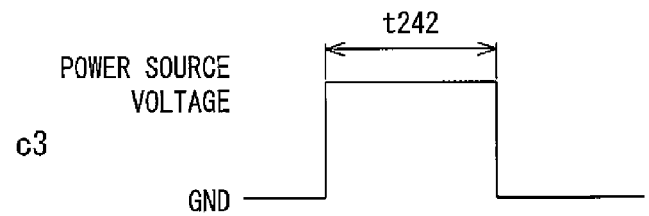
(e)

FIG. 26
(a)
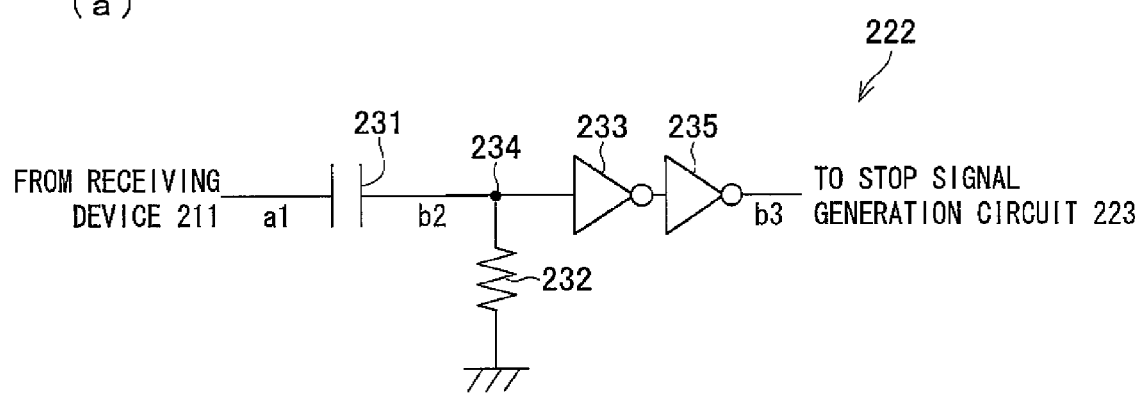
(b)
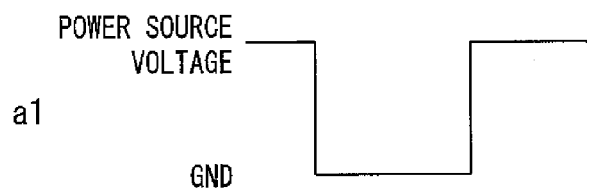
(c)
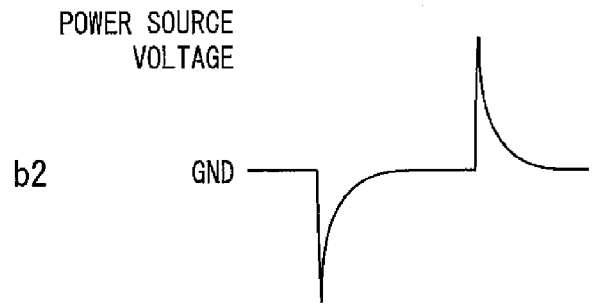
(d)
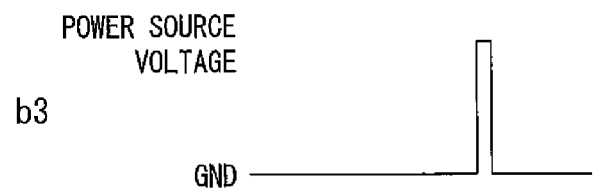

FOUR-VALUED PPM

RECEIVER AND ELECTRONIC DEVICE

This Nonprovisional application claims priority under 35 U.S.C. §119(a) on Patent Application No. 142638/2007 filed in Japan on May 29, 2007, Patent Application No. 290865/2007 filed in Japan on Nov. 8, 2007, and Patent Application No. 132223/2008 filed in Japan on May 20, 2008, the entire contents of which are hereby incorporated by reference.

FIELD OF THE INVENTION

The present invention relates to a receiver. The present invention particularly relates to a receiver which is provided in an electronic device or the like receiving a transmitted optical signal in a wireless manner, and which receives the optical signal as a data string constituted by a pulse train with a known pulse width.

BACKGROUND OF THE INVENTION

In the last the years, much effort has been made to develop an electronic device which processes an audio signal having been converted into digital data such as a one-bit data string. Such a device is advantageous in various ways for data communications between plural devices, in comparison with devices processing audio signals which are analog data. Accompanied with the development of the aforesaid device, a digital audio signal technology suitable for data communications between plural devices has been actively researched. In addition, in consideration of the downsizing of devices such as mobile phone terminals, the reduction in the number of components and the downsizing have become technical problems in the field of communications devices.

In the field of data communications between plural electronic devices, infrared communications have attracted attention.

Infrared communications are communication means used in a variety of types of electronic devices such as mobile phone terminals and wireless earphones. Among various types, IrDA communication devices are infrared communication devices compliant with IrDA (Infra-red Data Association) which is a worldwide standard in infrared communications, and popularly adopted as inter-user information exchange means by many mobile phone terminals. In recent years, FIR (Fast Infra Red)-compliant IrDA communication devices with the maximum transmission rates of 4 Mbps have rapidly been diffused.

Such an IrDA communication device adopts, for transmission of audio data, i.e. for modulation of a transmitted optical signal, a method in which audio data is transmitted by a one-bit data string having been modulated by PDM (Pulse Density Modulation) or a method in which data transmission is performed by a two-bit data string having been modulated by four-valued PPM (Pulse Position Modulation).

The aforesaid method adopting PDM is disclosed by Japanese Unexamined Patent Publication No. 2004-135321 (published on Apr. 30, 2004; hereinafter Patent Document 1).

The method adopting the four-valued PDM is mainly used in FIR-compliant IrDA communication devices. In this method, an optical signal to be transmitted is modulated into a data string in which a pulse position is specified in units of two bits. A data string in which a pulse position is specified by two bits is made up of four types of pulses "00", "01", "10", and "11" which have the same known pulse width but have different pulse positions (see FIG. 32). As shown in FIG. 32, if a data string made up of the aforesaid four types of pulses is arranged such that a pulse of "00" is transmitted after a pulse of "11", a pulse whose pulse width is twice as long as the known pulse width is generated because the pulse of "11" is joined with the pulse of "00". In the FIR standard, a pulse whose pulse width is twice as long as the known pulse width (i.e. a pulse after the aforesaid joining) is termed double pulse, whereas a pulse with the known pulse width (i.e. a pulse without the joining) is termed single pulse.

Infrared communication devices such as IrDA communication devices are inherently accompanied with a variation in pulse width at the time of transmission of a pulse train (data string). In this patent application, "variation in pulse width" indicates a case where a pulse train that a receiving communication device receives is different on the time axis from a pulse train that a sending communication device sends. Examples of such a variation in pulse width includes: pulse widening (the pulse width of a particular pulse is widened), pulse shortening (the pulse width of a particular pulse is shortened on account of loss of a part of the pulse), pulse division (a single pulse is broken up into plural pulses due to loss of a part of the pulse), and generation of false pulse (a pulse which should not have existed). Such a variation in pulse width occurs in both the method adopting PDM and the method adopting four-valued PPM, and the frequency of the occurrence of a variation increases as the distance of data communications increases. In addition to this, a variation in pulse width may occur on account of an influence of disturbance light or the like.

For example, in case where a variation in pulse width occurs in audio data to be received by a receiving infrared communication device, the DC (Direct Current) level of the audio data is unnecessarily varied and hence noise is superposed into the audio data, with the result that the quality of reproduced sound is deteriorated.

In consideration of this, a receiving infrared communication device, i.e. a receiver (optical receiver) preferably has a muting function by which the reproduction of received audio data is stopped if a variation in pulse width occurs in the audio data.

To implement this muting function, Japanese Unexamined Patent Publication No. 2006-304076 (published on Nov. 2, 2006; hereinafter Patent Document 2) discloses a muting judgment circuit which stops the reproduction of audio data constituted by a pulse train with known pulse width, pulse cycle, and average pulse duty, when the reception condition becomes bad.

The muting judgment circuit disclosed by Patent Document 2 includes a smoothing circuit and a judgment circuit. The smoothing circuit converts the time density of a pulse into a voltage. The judgment circuit gives a decision on an output voltage from the smoothing circuit with reference to a predetermined threshold corresponding to a known average transmission rate. If the voltage is below the predetermined threshold, it is judged that the receipt condition of a digital signal is bad, and a signal for stopping the reproduction of the digital signal is output. In this way, the reproduction of a digital signal whose receipt condition is bad is stopped.

However, the technology disclosed by Patent Document 2 is unable to detect a defect in a pulse, which is a result of conversion of the time density of a pulse into a voltage by a smoothing circuit and is small but is large enough to allow the voltage to be not lower than a predetermined threshold. Furthermore, in the technology disclosed by Patent Document 2, it is not possible to detect a variation (e.g. pulse widening) of pulse width in the width direction of the pulse, with which a voltage value after the conversion by the smoothing circuit does not decrease.

Japanese Unexamined Patent Publication No. 2007-27833 (published on Feb. 1, 2007; hereinafter Patent Document 3) discloses a muting judgment circuit includes a logical OR circuit, a low-pass filter, and judging means. The logical OR circuit outputs a logical OR of digital signals of plural channels. The low-pass filter receives an output signal from the logical OR circuit and fetches a signal component whose pulse width, pulse cycle, and average pulse duty are known. The judging means makes, with a predetermined threshold, a judgment about the signal output from the low-pass filter. When the number of times the signal exceeds the predetermined threshold is below the transmission rate figured out by adding up the average transmission rates of the respective digital signals of plural channels, the judging means judges that the pulse width is decreased on account of deterioration of pulse waveform of a digital signal, and outputs a signal instructing to stop the reproduction of the digital signal. In this way, the reproduction of incoming signals of plural channels, whose pulse waveforms are deteriorated, is stopped.

However, with the technology disclosed in Patent Document 3, it is not possible to detect a defect in pulse, which is small but large enough to allow the number of times the output signal of the low-pass filter exceeds the predetermined threshold not to be below the transmission rate figured out by adding up the average transmission rates of the respective digital signals of plural channels. Also, being similar to the technology disclosed by Patent Document 2, the technology disclosed by Patent Document 3 cannot detect a variation in pulse width in the width direction of the pulse.

In the technologies disclosed by Patent Documents 2 and 3, the range of detectable noise is limited in case where noise occurs in an audio signal on account of a variation in pulse width. Therefore it is often impossible to stop the reproduction of the audio signal even if the noise occurs. As a result, such an audio signal with noise is reproduced and hence the result of the reproduction sounds unpleasant.

Assume that the aforesaid four-valued PPM is used for FIR-compliant infrared communications and the aforesaid variation of pulse width occurs in a data string in which a pulse position is specified by two bits. In such a case, an electronic device in which an infrared communication device is used as a receiver may confuse a single pulse with a double pulse. For example, when pulse widening occurs in a signal pulse, the electronic device may falsely recognize such a single pulse as a double pulse. On the other hand, when pulse shortening occurs in a double pulse, the electronic device may falsely recognize such a double pulse as a single pulse. With this kind of confusion of pulse, the electronic device cannot correctly receive data. Therefore the electronic device is required to discern a single pulse from a double pulse.

In electronic devices, the discernment of the type of pulses has conventionally been carried out mostly on the control system side. However, the scheme in which the discernment is carried out on the control system side is disadvantageous in that the discernment is not correctly done when the performance of the control system is not good. That is to say, as the distance of data communications increases, the control system more frequently misrecognizes a single pulse with pulse widening as a double pulse, and misrecognizes a double pulse with pulse shortening as a single pulse. As a result, the control system receives incorrect data. It is also pointed out that, to construct the aforesaid control system, the compatibility between the control system and the infrared communication device must be sufficiently contemplated. It is therefore not easily to construct a control system which is certainly compatible with an infrared communication device.

In this regard, Japanese Unexamined Patent Publication No. 2006-211510 (published on Aug. 10, 2006; hereinafter Patent Document 4) proposed a pulse data demodulator disclosed below, as a technology to realize data reception without confusion of single and double pulses.

In the demodulator disclosed by Patent Document 4, the pulse width of each of single and double pulses, which is specified by a packet format, is analyzed in every packet, and a threshold for discerning a single pulse from a double pulse is determined based on the result of the analysis. Furthermore, the demodulator of Patent Document 4 discerns a single pulse from a double pulse by comparing pulse data with the threshold. Therefore the demodulator of Patent Document 4 can receive pulse data without confusing a single pulse with a double pulse, even if the pulse data is accompanied by a variation in pulse width.

In the technology taught by Patent Document 4, the discernment of pulses is carried out with reference to a threshold determined based on single pulse and double pulse which are specified by a packet format. In particular, the demodulator of Patent Document 4 uses preamble as a single pulse for determining a threshold and uses start flag as a double pulse for determining a threshold.

However, in case where, on account of a rapid change in the reception characteristic of a receiver, a variation in pulse width occurs in a double pulse or single pulse specified by the packet format, the threshold thus determined is improper for the discernment of pulses in pulse data, and hence the discernment may not be properly carried out. In this way, the technology of Patent Document 4 is prone to misrecognition of a pulse. If the receiver sends an incorrect signal to the control system on account of the misrecognition, the control system cannot properly control the receiver, and reception errors occur in the entirety of the electronic device.

In the meanwhile, in the technology of Patent Document 4, the pulse width of a pulse train including a single pulse and a double pulse is adjusted by an adjusting circuit.

However, when the reception characteristic of the receiver rapidly changes after the adjustment of the pulse width by the adjusting circuit, a variation in the pulse width may occur in the pulse train after the adjustment. With such a variation in the pulse width, the receiver eventually sends an incorrect signal to the control system of the subsequent stage. As a result, the control system receiving the incorrect signal cannot properly control the receiver, and reception errors occur in the entirety of the electronic device.

SUMMARY OF THE INVENTION

The present invention was done to solve the problem above, and an objective of the present invention is to provide a receiver which can reduce discomfort in hearing reproduced sound when noise occurs in the audio signal on account of a variation in pulse width, and also to provide an electronic device including the receiver.

Another objective of the present invention is to provide a receiver which performs data transmission by an optical signal with two types of known pulse width and has a lower possibility of externally outputting an erroneous signal, and also to provide an electronic device including the receiver.

To achieve the objective, the present invention optical receiver (receiver) of the present invention, which receives a transmitted optical signal as a digital signal constituted by a pulse train with a known pulse width, includes an abnormal pulse detection circuit which detects, by comparing the received optical signal with a reference digital signal generated based on the optical signal, a variation in pulse width in the optical signal being transmitted, and stops external output of the received optical signal for a predetermined period of time if a variation in the pulse width is detected in the optical signal.

In this arrangement, the received optical signal is compared with a reference digital signal generated by the circuit based on the optical signal so that detection of a variation in the pulse width of the optical signal being transmitted is carried out, and external output of the received optical signal is stopped for a predetermined period of time if a variation in the pulse width is detected.

It is therefore possible to realize an optical receiver which can reduce discomfort in hearing reproduced sound when noise occurs in the audio signal on account of a variation in pulse width.

In the arrangement above, furthermore, the received optical signal is compared with a reference digital signal generated by the circuit based on the optical signal. Therefore, it is possible to realize an optical receiver which can detect a minute loss of the pulse and a variation in the pulse width in the width direction of the pulse, when noise occurs in the audio signal for the reason of a variation in the pulse width.

The optical receiver of the present invention, which receives a transmitted optical signal as a digital signal which is a pulse train constituted by a first pulse having a known pulse width and a second pulse having another known pulse width which is longer than the known pulse width of the first pulse, includes a pulse width variation monitoring device for generating a first reference digital signal and a second reference digital signal based on the received optical signal, detecting a variation in pulse width in the received optical signal by comparing the first and second reference digital signals with one another, and stopping external output of the received optical signal for a predetermined period of time if the variation in pulse width is detected.

In the arrangement above, the optical receiver of the present invention receives a transmitted optical signal as a digital signal which is a pulse train constituted by a first pulse having a known pulse width and a second pulse having another known pulse width which is longer than the pulse width of the first pulse. When the optical receiver of the present invention receives a signal in compliant with FIR of IrDA, the first pulse corresponds to a single pulse and the second pulse corresponds to a double pulse.

The optical receiver of the present invention includes a pulse width monitoring device. This pulse width monitoring device stops the external output of the received optical signal for a predetermined period of time, when a variation in pulse width is detected in the received optical signal.

In the arrangement above, when a variation in pulse width occurs in the optical signal for the reason of, for example, a rapid change in the reception characteristic of the optical receiver, the external output of the optical signal is stopped. Therefore the optical receiver of the present invention has a significantly lower possibility of outputting an erroneous signal to the outside.

The pulse width monitoring device generates a first reference digital signal and a second reference digital signal based on the received optical signal, and performs a detection of a variation in pulse width occurring in the received optical signal by comparing the first and second reference digital signals with one another.

Therefore, when a pulse in which a variation in pulse width occurs is a single pulse or double pulse defined by the packet format, it is possible to detect a variation in the single pulse or double pulse defined by the packet format, by the operation above. When a pulse in which a variation in pulse width occurs is a single pulse or double pulse of the aforesaid pulse data, it is possible to detect a variation in the single pulse or double pulse of the pulse data, by the operation above. It other words, a variation in pulse width occurring in a single pulse or double pulse defined by the packet format does not interfere the correct discernment of a single pulse from a double pulse in the pulse data. The optical receiver of the present invention can therefore further reduce a possibility of outputting an erroneous signal to the outside.

On this account, in an optical receiver which performs data transmission by an optical signal with two types of known pulse widths, it is possible to reduce a possibility of outputting an erroneous signal to the outside.

Additional objects, features, and strengths of the present invention will be made clear by the description below. Further, the advantages of the present invention will be evident from the following explanation in reference to the drawings.

BRIEF DESCRIPTION OF THE DRAWINGS

FIG. 1 is a block diagram showing the outline of a receiver of the present invention.

FIG. 6 is a timing chart for illustrating how an incoming pulse edge detection circuit generates an edge detection signal, and shows the waveforms of an input signal, a voltage at a connection point, and the aforesaid edge detection signal.

FIG. 11 is a timing chart for illustrating how an incoming pulse edge detection circuit generates an edge detection signal, and shows the waveforms of an input signal, a voltage at a connection point, and the aforesaid edge detection signal.

FIG. 19 is a block diagram showing the outline of another receiver of the present invention.

FIG. 21 includes a circuit diagram showing an example of a start edge detection circuit of the present invention and a graph showing the waveform of a signal passing through the start edge detection circuit.

FIG. 22 includes a block diagram showing a reference pulse generation circuit of the present invention and a graph showing a signal passing through the reference pulse generation circuit.

FIG. 26 includes a circuit diagram showing an example of an end edge detection circuit of the present invention and a graph showing the waveform of a signal passing through the end edge detection circuit.

DESCRIPTION OF THE EMBODIMENTS

Comparative Example 1

Figure 18:
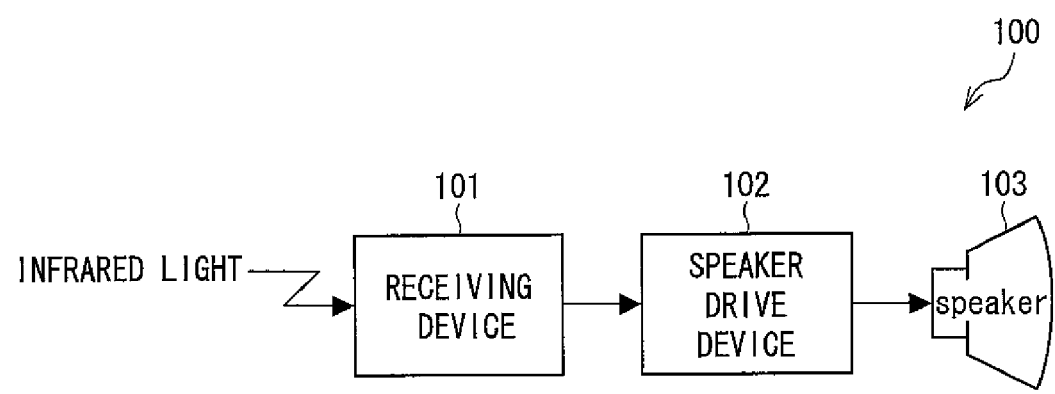
FIG. 18 relates to a comparative example 1 and is a block diagram showing the outline of a receiver of conventional art.

FIG. 18 relates to a comparative example 1 and is a block diagram showing the outline of a receiver (optical receiver) of a conventional technology.

The optical receiver 100 shown in FIG. 18 includes a receiving device 101, a speaker driver 102, and a speaker 103.

The receiving device 101 receives audio data as a pulse-density-modulated one-bit data string (e.g. infrared light). The audio data received by the receiving device 101 is demodulated into an analog signal by the speaker driver 102, and the speaker 103 reproduces the analog signal.

The optical receiver 100 shown in FIG. 18 receives audio data which has been converted by PDM into compressional data constituted by a one-bit data string, demodulates the audio data into an analog signal, and reproduces the analog signal by the speaker 103. In this case, the optical receiver can easily reproduce audio data only with the receiving infrared communication device, the speaker driver, and the speaker.

However, in the optical receiver 100 shown in FIG. 18, the aforesaid problem associated with a variation in pulse width occurs. That is to say, when, in the optical receiver 100 shown in FIG. 18, a variation in pulse width occurs in received audio data, an unnecessary variation in the DC level occurs in the audio data. Such an unnecessary variation in the DC level induces superposition of noise onto the audio data. The quality of reproduced sound is low when the audio data on which noise is superposed is reproduced by the speaker 103.

Therefore the receiver preferably has a muting function to stop the reproduction of received audio data when a variation in pulse width has occurred in the audio data.

As a receiver of the present invention, the following will describe a receiver which can reduce discomfort in hearing sound when noise has occurred in an audio signal due to a variation in pulse width.

Embodiment 1

The following will discuss an embodiment of the present invention with reference to FIG. 1 through FIG. 6.

FIG. 1 is a block diagram showing the outline of a receiver of the present invention.

An optical receiver (receiver) 1 shown in FIG. 1 is, for example, a receiver provided in an electronic device which receives in a wireless manner an optical signal transmitted by a transmission system adopting infrared light or light, and includes a receiving device 2, an abnormal pulse detection circuit (abnormal pulse detection means) 3, a speaker driver 4, and a speaker 5.

The receiving device 2 receives in a wireless manner audio data supplied from, for example, an optical transmitter (not illustrated), and amplifies the received audio data. Then the receiving device 2 sends the amplified audio data to the abnormal pulse detection circuit 3. It is noted that in the present invention the receiving device 2 does not have to have the function of amplifying audio data. It is therefore possible to arrange the receiving device 2 not to have this function.

The receiving device 2 receives audio data as, for example, a one-bit data string acquired as a result of PDM. In other words, the audio data that the receiving device 2 receives is a digital signal constituted by a pulse train whose pulse width is known. Non-limiting examples of the audio data includes an infrared signal and optical signals such as a visible light signal. To put it differently, any type of signal may be used as a signal used as the audio data, on condition that the signal is a digital signal constituted by a pulse train whose pulse width is known.

In case of data communications by infrared light, the receiving device 2 can be easily constructed by adopting an IrDA communication device. The IrDA communication device has three types of communication rates, namely FIR (communication rate of 4 Mbps) for high speed, MIR (communication rate of 1.152 Mbps) for middle speed, and SIR (communication rate of 2.4 kbps to 115.2 kbps) for low speed. For the transmission of audio data, FIR for high speed or MIR for middle speed is preferable in consideration of communication rate.

It is noted that any other devices other than the aforesaid device may be used as the receiving device 2.

The abnormal pulse detection circuit 3 compares audio data supplied from the receiving device 2 with a muting reference pulse (reference digital signal) which is a target of comparison with the audio data and generated by the circuit 3 based on the audio data. If a variation in pulse width is found in the audio data as a result of the comparison, the abnormal pulse detection circuit 3 instructs the speaker driver 4 to stop external output of the audio data for a predetermined period of time. The external output of the audio data is stopped in such a way that a muting signal is output for said predetermined period of time. Details of the abnormal pulse detection circuit 3 will be given later.

In the subject application, a variation in pulse width indicates so-called jitter. That is to say, a variation in pulse width in the subject application is a state such that, when a transmitting device (e.g. the aforesaid optical transmitter (not illustrated)) sends audio data to a receiving device (optical receiver 1), a one-bit data string constituted by a pulse train with a known pulse width (i.e. pulse-density-modified one-bit data string), which is transmitted by the transmitting device, is different on the time axis from a one-bit data string that the receiving device receives. Specific examples of such a variation in pulse width include pulse widening (the pulse width of a particular pulse is widened), pulse shortening (the pulse width of a particular pulse is shortened on account of loss of a part of the pulse), pulse division (a single pulse is broken up into plural pulses due to loss of a part of the pulse), and generation of false pulse (a pulse which should not have existed).

It is noted that the abnormal pulse detection circuit 3 transfers the audio data supplied from the receiving device 2 to the speaker driver 4 without making any changes thereto, when the muting signal is not output, i.e. a variation in pulse width is not detected in the audio data supplied from the receiving device 2.

The speaker driver 4 includes a low-pass filter which is not illustrated. When the audio data is supplied from the abnormal pulse detection circuit 3 to the speaker driver 4, the audio data is demodulated into an analog signal while passing through the low-pass filter of the speaker driver 4, and the analog signal is output from the speaker 5, as sound.

Figure 2:
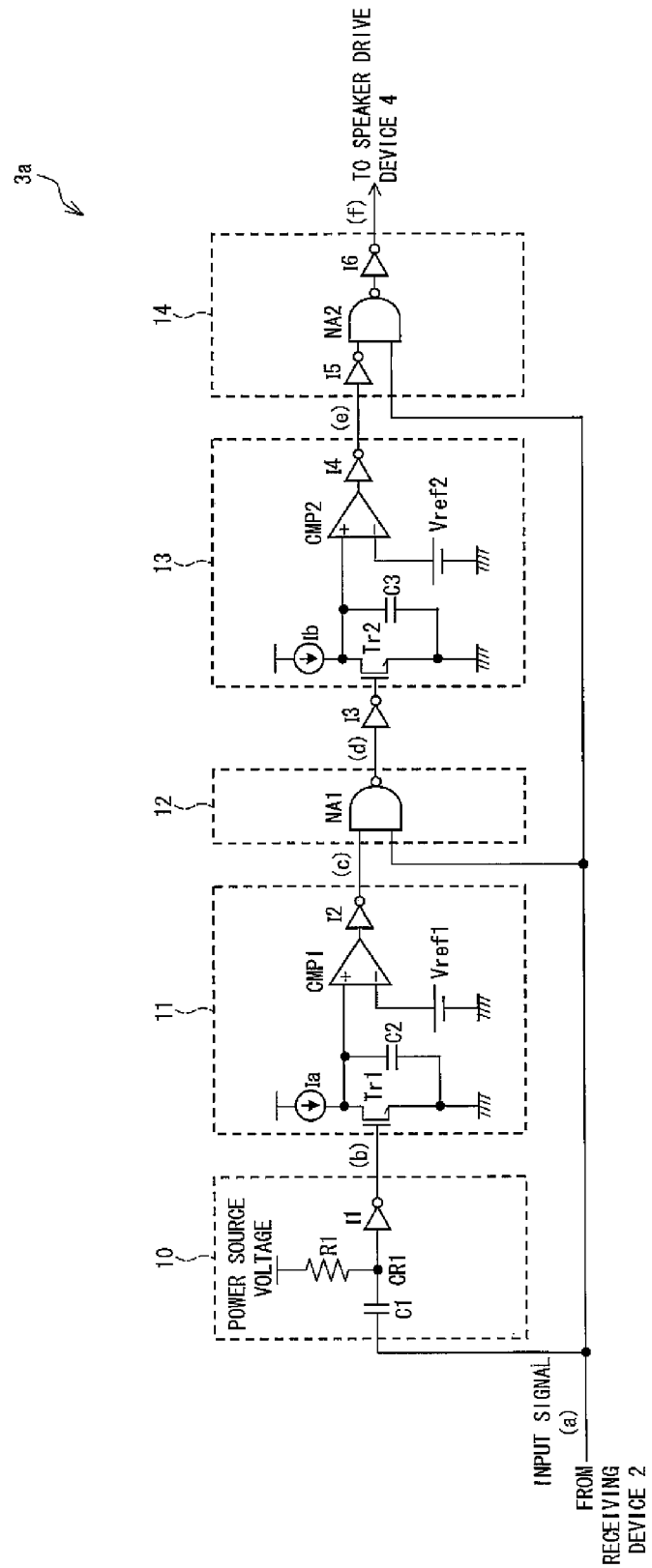
FIG. 2 relates to an embodiment of the present invention and is a block diagram showing an abnormal pulse detection circuit provided in the receiver of the present invention.

Now, referring to FIG. 2, in what manner the abnormal pulse detection circuit of the optical receiver 1 is arranged is discussed.

FIG. 2 is a block diagram showing an example of the abnormal pulse detection circuit. The abnormal pulse detection circuit (abnormal pulse detection means) 3a shown in FIG. 2 is suitably used as the abnormal pulse detection circuit 3 of the optical receiver 1 shown in FIG. 1.

The abnormal pulse detection circuit 3a shown in FIG. 2 receives, as a negative-logic digital signal constituted by a low-level indicating a signal "1" and a high level indicating a signal "0", an input signal supplied from the receiving device 2 (i.e. receives audio data). Hereinafter this input signal will be simply referred to as input signal.

In the subject application, high level is a level of a power source voltage in each member of the present invention (for example, a voltage supplied from a drive voltage source in case of the below-mentioned incoming pulse edge detection circuit 10), and low level is a ground level.

Also, in the subject application one cycle of an input signal indicates a period from the rise (or fall) of a particular pulse in a typical input signal in which no variation in pulse width has occurred to the rise (or fall) of the pulse directly subsequent to the aforesaid particular pulse.

The abnormal pulse detection circuit 3a shown in FIG. 2 is an embodiment suitable for detecting an abnormal pulse (e.g. pulse shortening, pulse division, and generation of a false pulse whose pulse width is shorter than a known pulse width) whose pulse width is shorter than a known pulse width and occurs in an input signal.

The abnormal pulse detection circuit 3a shown in FIG. 2 includes an incoming pulse edge detection circuit (incoming pulse edge detection means) 10, a muting reference pulse generation circuit (reference pulse generation means) 11, a logic circuit (logic means) 12, a muting signal generation circuit (muting signal generation means) 13, and a switching circuit (output stop means) 14.

The incoming pulse edge detection circuit 10 includes a capacitor C1, a resistor R1, and an inverter I1. One terminal of the capacitor C1 is connected to the same power source line as the receiving device 2. The other terminal of the capacitor C1 is connected to the input terminal of the inverter I1. The output terminal of the inverter I1 is connected to the muting reference pulse generation circuit 11. One terminal of the resistor R1 is connected to the connection point CR1 provided between the other terminal of the capacitor C1 and the input terminal of the inverter I1. The other terminal of the resistor R1 is connected to a drive voltage source which is not illustrated, and this terminal receives a supply voltage from the drive voltage source.

This incoming pulse edge detection circuit 10 receives the input signal, and the incoming pulse edge detection circuit 10 generates and outputs an edge detection signal by which the rising edge or falling edge (i.e. the moment of rise or fall of a pulse of the input signal) of the input signal is detected.

In case where the input signal is a negative-logic digital signal as in the present embodiment, the incoming pulse edge detection circuit 10 generates and outputs an edge detection signal for detecting the falling edge (the moment of falling) of the input signal. In case of a positive-logic digital signal constituted by a low level indicating a signal "0" and a high level indicating a signal "1", the incoming pulse edge detection circuit 10 generates and outputs an edge detection signal for detecting the rising edge (the moment of rising) of the input signal.

The incoming pulse edge detection circuit 10 outputs the generated edge detection signal to the muting reference pulse generation circuit 11.

The muting reference pulse generation circuit 11 is arranged to include a transistor Tr1, a current source Ia, a capacitor C2, a reference voltage source Vref1, a comparator CMP1, and an inverter I2. The base terminal of the transistor Tr1 is connected to the output terminal of the inverter I1 of the incoming pulse edge detection circuit 10. The collector terminal of the transistor Tr1 is connected to the current source Ia. The emitter terminal of the transistor Tr1 is grounded. Between the collector terminal of the transistor Tr1 and the current source Ia, the noninverting input terminal of the comparator CMP1 is provided. One terminal of the capacitor C2 is connected to the collector terminal of the transistor Tr1, whereas the other terminal is connected to the emitter terminal of the transistor Tr1. The inverting input terminal of the comparator CMP1 is connected to the positive-side terminal of the reference voltage source Vref1, and the negative-side terminal of the reference voltage source Vref1 is grounded. The output terminal of the comparator CMP1 is connected to the input terminal of the inverter I2. The output terminal of the inverter I2 is connected to the logic circuit 12.

This muting reference pulse generation circuit 11 generates and outputs a muting reference pulse based on the edge detection signal supplied from the incoming pulse edge detection circuit 10. How the muting reference pulse generation circuit 11 specifically generates the muting reference pulse based on the edge detection signal supplied from the incoming pulse edge detection circuit 10 will be discussed later.

In Embodiments 1-4, if the input signal is a negative-logic digital signal, the muting reference pulse generated by the muting reference pulse generation circuit 11 is a positive-logic pulse with constant pulse width. In case where the input signal is a positive logic digital signal, the muting reference pulse generated by the muting reference pulse generation circuit 11 is a negative-logic pulse with constant pulse width.

The muting reference pulse generation circuit 11 outputs the generated muting reference pulse to the logic circuit 12.

The logic circuit 12 is arranged to include a typical NAND (negative AND) circuit NA1. One input terminal of the NAND circuit NA1 is connected to the output terminal of the inverter I2 of the muting reference pulse generation circuit 11. The other input terminal of the NAND circuit NA1 is connected to the same power source line as the receiving device 2. The output terminal of the NAND circuit NA1 is connected to the input terminal of the inverter I3.

The output terminal of the inverter I3 is connected to the muting signal generation circuit 13.

The logic circuit 12 receives the input signal and the muting reference pulse generated by the muting reference pulse generation circuit 11. That is to say, one input terminal of the NAND circuit NA1 of the logic circuit 12 receives the muting reference pulse, and the other input terminal of the NAND circuit NA1 of the logic circuit 12 receives the input signal. Receiving the muting reference pulse and the input signal, the logic circuit 12 outputs an output signal indicating a negative AND of the muting reference pulse and the input signal.

Receiving the output signal from the logic circuit 12, the inverter I3 performs logical inversion of the output signal supplied from the logic circuit 12 and outputs the resultant signal to the muting signal generation circuit 13.

The muting signal generation circuit 13 is arranged to include a transistor Tr2, a current source Ib, a capacitor C3, a reference voltage source Vref2, a comparator CMP2, and an inverter I4. The base terminal of the transistor Tr2 is connected to the output terminal of the inverter I3. The collector terminal of the transistor Tr2 is connected to the current source Ib. The emitter terminal of the transistor Tr2 is grounded. Between the collector terminal of the transistor Tr2 and the current source Ib, the noninverting input terminal of the comparator CMP2 is provided. One terminal of the capacitor C3 is connected to the collector terminal of the transistor Tr2, whereas the other terminal is connected to the emitter terminal of the transistor Tr2. The inverting input terminal of the comparator CMP2 is connected to the positive-side terminal of the reference voltage source Vref2, whereas the negative-side terminal of the reference voltage source Vref2 is grounded. The output terminal of the comparator CMP2 is connected to the input terminal of the inverter I4. The output terminal of the inverter I4 is connected to the switching circuit 14.

This muting signal generation circuit 13 generates and outputs the muting signal based on the output signal of the inverter I3 (i.e. based on the signal generated as a result of logical inversion of the output signal of the logic circuit 12). How the muting signal generation circuit 13 generates the muting signal based on the output signal of the inverter I3 will be specifically described later.

The muting signal generation circuit 13 outputs the generated muting signal to the switching circuit 14.

The switching circuit 14 includes inverters I5 and I6 and a NAND circuit NA2. The input terminal of the inverter I5 is connected to the output terminal of the inverter I4 of the muting signal generation circuit 13. The output terminal of the inverter I5 is connected to one input terminal of the NAND circuit NA2. The other input terminal of the NAND circuit NA2 is connected to the same power source line as the receiving device 2. The output terminal of the NAND circuit NA2 is connected to the input terminal of the inverter I6. The output terminal of the inverter I6 is connected to the speaker driver 4.

This switching circuit 14 receives the input signal and the muting signal generated by the muting signal generation circuit 13. That is to say, one input terminal of the NAND circuit NA2 of the switching circuit 14 receives the muting signal after the logical inversion by the inverter I5, and the other input terminal of the NAND circuit NA2 of the switching circuit 14 receives the input signal. The switching circuit 14 outputs an output signal which indicates a negative AND of the output signal of the inverter I5 (i.e. the signal obtained by the logical inversion of the muting signal by the inverter I5) and the input signal. The output signal of the switching circuit 14 is subjected to logical inversion by the inverter I6, and the resultant signal is output to the speaker driver 4.

The switching circuit 14 outputs the input signal or the muting signal to the speaker driver 4. If the switching circuit 14 outputs the muting signal, the speaker 5 does not externally output the input signal that the optical receiver 1 has received, for a predetermined period of time.

Figure 3:
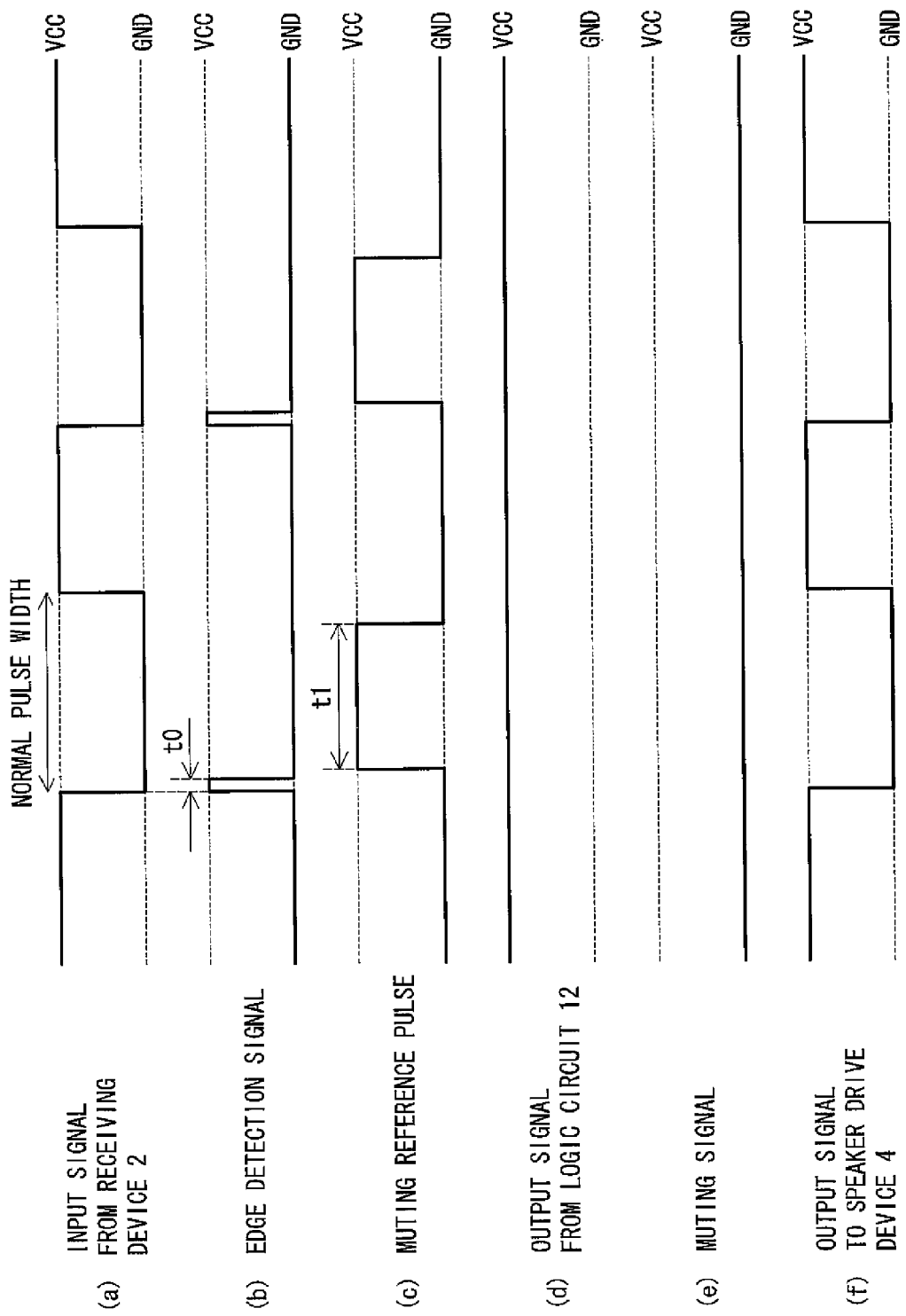
FIG. 3 is a timing chart for illustrating the principle of operation of the abnormal pulse detection circuit shown in FIG. 2 when no variation in pulse width occurs in an input signal, and shows waveforms of the input signal, an edge detection signal, a muting reference pulse, an output signal supplied to a logic circuit, a muting signal, and an output signal supplied to a speaker driver.
Figure 4:
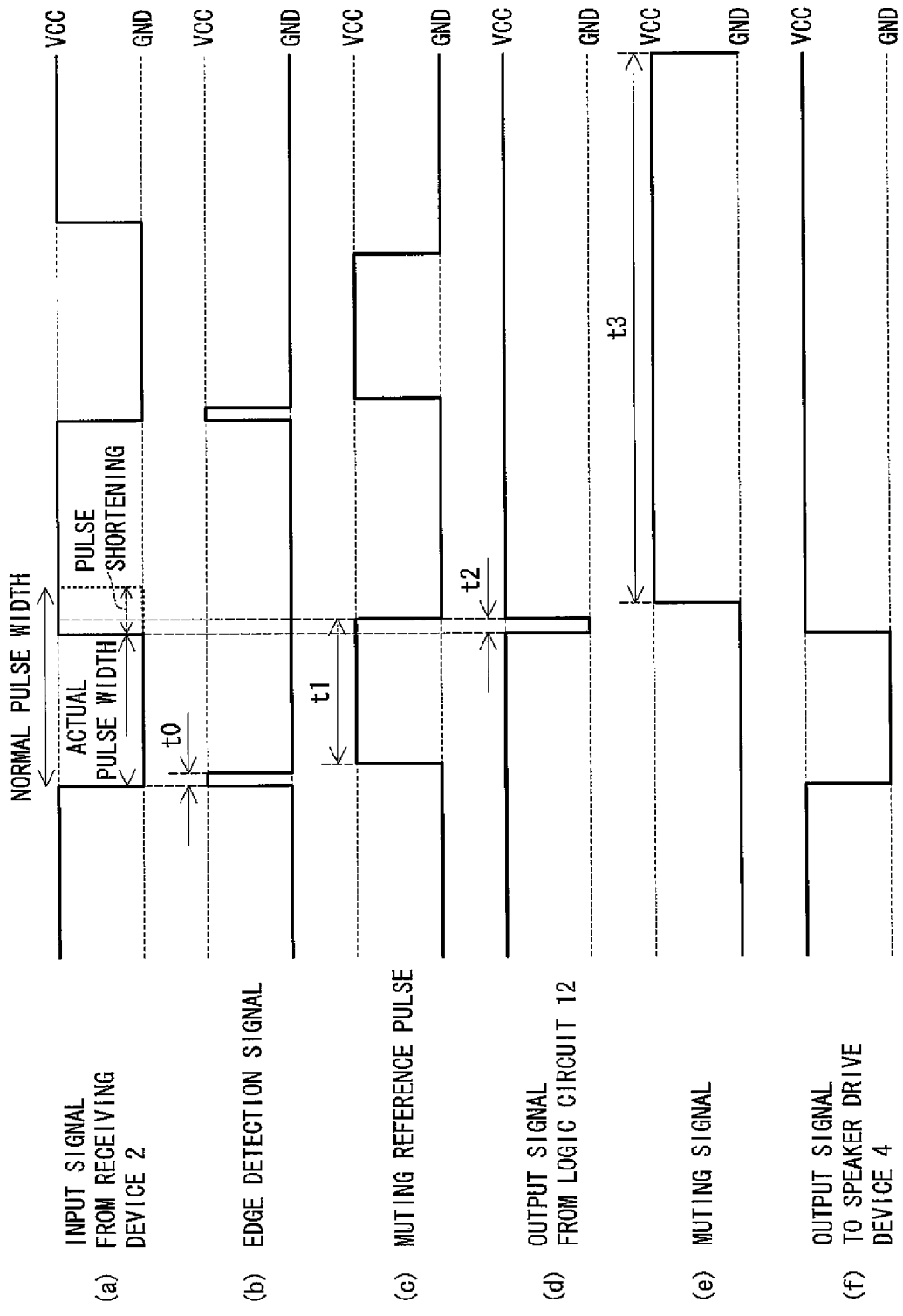
FIG. 4 is a timing chart specifically illustrating the principle of operation of the abnormal pulse detection circuit shown in FIG. 2 when pulse shortening or a false pulse having the pulse width shorter than a known pulse width occurs in an input signal, and shows the waveforms of the input signal, an edge detection signal, a muting reference pulse, an output signal supplied to a logic circuit, a muting signal, and an output signal supplied to a speaker driver.
Figure 5:
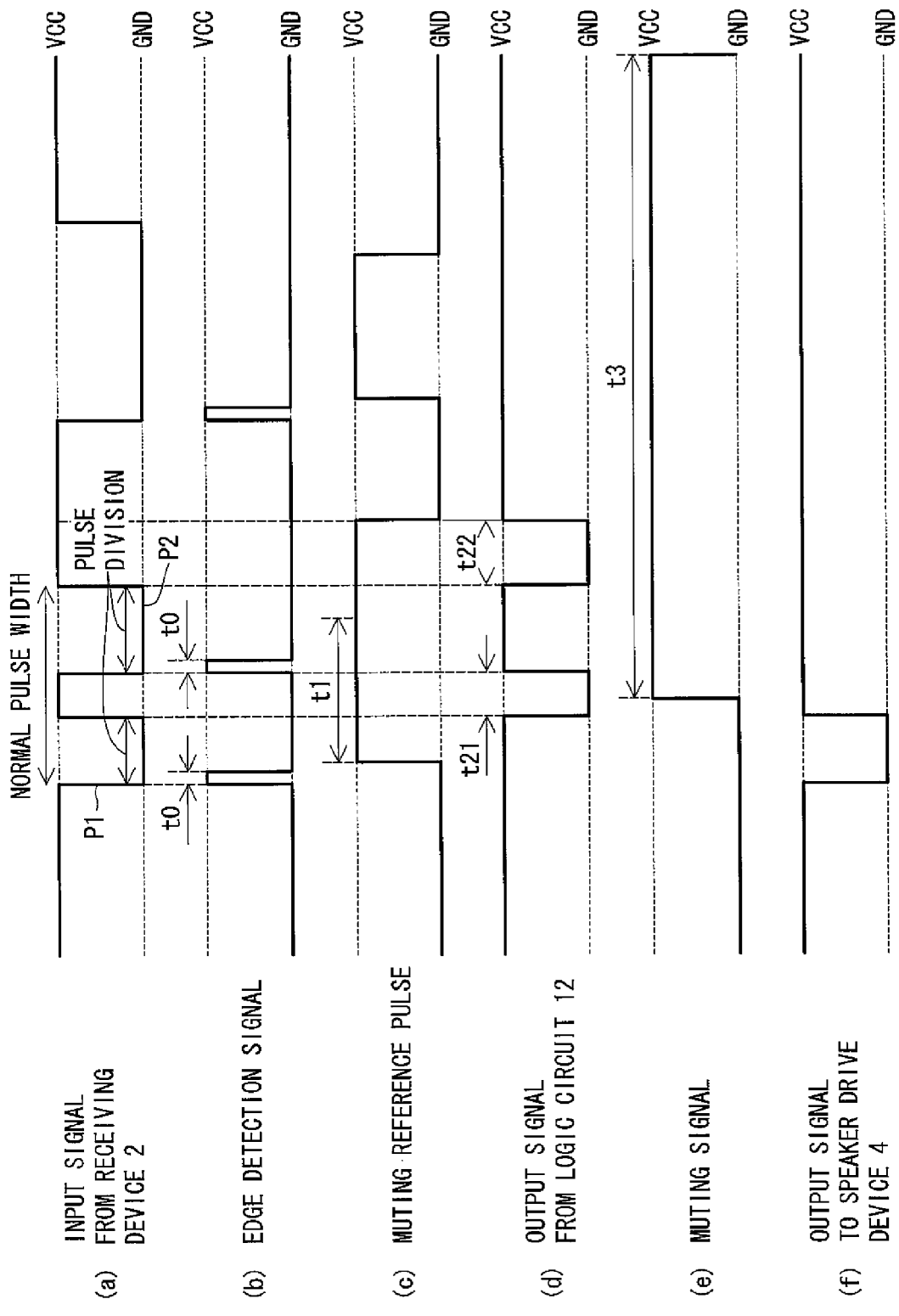
FIG. 5 is a timing chart for specifically illustrating the principle of operation of the abnormal pulse detection circuit shown in FIG. 2 when pulse division occurs in an input signal, and shows the waveforms of the input signal, an edge detection signal, a muting reference pulse, an output signal supplied to a logic circuit, a muting signal, and an output signal supplied to a speaker driver.

The following will specifically describe the principle of operation of the abnormal pulse detection circuit 3a, with reference to FIGS. 3 through 5.

FIG. 3 is a timing chart for specifically explaining the principle of operation of the abnormal pulse detection circuit 3a when no variation of pulse width has occurred in the input signal. FIG. 4 is a timing chart for specifically explaining the principle of operation of the abnormal pulse detection circuit 3a when pulse shortening or a false pulse with a pulse width shorter than a known pulse width has occurred in the input signal. FIG. 5 is a timing chart for specifically explaining the principle of operation of the abnormal pulse detection circuit 3a when pulse division has occurred in the input signal.

In each of the timing charts of FIGS. 3 through 5, the horizontal axis indicates time (period) and the vertical axis indicates a voltage level of the one-bit data string, which is either high level (Vcc) or low level (GND). The pulse width of a particular pulse of the one-bit data string is equal to a period in which the particular pulse outputs a high-level (or low-level) signal. Also, in each of the timing charts of FIGS. 3 through 5, the graph (a) indicates the waveform of the input signal, the graph (b) indicates the waveform of the edge detection signal, the graph (c) indicates the waveform of the muting reference pulse, the graph (d) indicates the waveform of the output signal of the logic circuit 12, the graph (e) indicates the waveform of the muting signal, and the graph (f) indicates the waveform of the output signal supplied to the speaker driver 4.

As discussed above, the abnormal pulse detection circuit 3a shown in FIG. 2 receives the input signal as a negative-logic digital signal.

Described first is the operation of the abnormal pulse detection circuit 3a when no variation in pulse width occurs in the input signal, with reference to FIG. 3.

When no variation occurs in pulse width, the input signal has a normal pulse width, i.e. a known pulse width, as shown in (a) in FIG. 3.

The input signal shown in (a) in FIG. 3 is supplied to the incoming pulse edge detection circuit 10. The incoming pulse edge detection circuit 10 generates an edge detection signal for detecting the falling edge of the input signal shown in (a) in FIG. 3.

Now, how the incoming pulse edge detection circuit 10 generates the edge detection signal when the input signal is input is described with reference to FIG. 6.

FIG. 6 is a timing chart for explaining how the incoming pulse edge detection circuit 10 generates the edge detection signal. In FIG. 6, the graph (a) shows the waveform of the input signal, the graph (b) shows the voltage waveform at the connection point CR1, and the graph (c) shows the waveform of the edge detection signal.

The resistor R1 and the capacitor C1 of the incoming pulse edge detection circuit 10 form a typical differentiation circuit.

The input signal supplied to the incoming pulse edge detection circuit 10 (see (a) in FIG. 6) has a significantly high frequency component at the moments of rise and fall of a pulse. For this reason, at the moment of fall of the input signal, the voltage at the connection point CR1 rapidly changes from the high level to the low level on account of the differentiation by the resistor R1 and the capacitor C1 (see (b) in FIG. 6). Thereafter, the input signal is kept constantly at the low level, and hence the voltage at the connection point CR1 gradually increases from the low level to the high level.

In the meanwhile, at the moment of rise of the input signal, the voltage at the connection point CR1 rapidly changes to a voltage exceeding the high level, on account of the aforesaid differentiation (see (b) in FIG. 6). At this moment, the connection point CR1 has a voltage exceeding the high level. Since the input signal is constantly kept at the high level, the voltage at the connection point CR1 gradually approaches to the high level.

As a result of the above, the input signal is converted to a signal with the waveform shown in (b) in FIG. 6 at the connection point CR1. This signal is arranged so as to be at the low level for a predetermined period of time after the moment of fall of the input signal, and to be at the high level in other periods of time. This signal is logically inverted by the inverter I1 so that the incoming pulse edge detection circuit 10 generates an edge detection signal (see (c) in FIG. 6) which is a pulse changed to the high level at the moment of fall of the input signal and has a predetermined pulse width (period in which a pulse is output) t0 (e.g. a pulse width equivalent to about 5 to 10 nanoseconds).

When the input signal shown in (a) in FIG. 3 is supplied, the incoming pulse edge detection circuit 10 generates an edge detection signal shown in (b) in FIG. 3, which is a pulse changed to the high level at the moment of the fall of the input signal shown in (a) in FIG. 3 and which has a predetermined pulse width t0.

The edge detection signal in (b) in FIG. 3, which is generated by the incoming pulse edge detection circuit 10, is supplied to the muting reference pulse generation circuit 11. The muting reference pulse generation circuit 11 generates a muting reference pulse from the edge detection signal shown in (b) in FIG. 3.

Receiving the edge detection signal, the muting reference pulse generation circuit 11 generates the muting reference pulse in the following manner.

The edge detection signal is first input to the base terminal of the transistor Tr1 of the muting reference pulse generation circuit 11. The transistor Tr1 is turned on only while the edge detection signal indicates the high level. When the transistor Tr1 is turned on, the capacitor C2 releases the accumulated electric charge via the transistor Tr1. In doing so, the power source line connected to the capacitor C2 is at a ground potential and the voltage supplied to the noninverting input terminal of the comparator CMP1 is zero. In the meanwhile, the inverting input terminal of the comparator CMP1 receives a reference voltage vref1 from the reference voltage source Vref1. As a result, the voltage on the noninverting input terminal of the comparator CMP1 is lower than the voltage on the inverting input terminal of the comparator CMP1, and hence the output from the comparator CMP1 is at the low level.

Subsequently, when the edge detection signal changes from the high level to the low level, the transistor Tr1 is turned off. As the transistor Tr1 is turned off, a current from the current source Ia starts to charge the capacitor C2. The voltage of the power source line connected to the capacitor C2 gradually increases, with the result that the voltage supplied to the noninverting input terminal of the comparator CMP1 also gradually increases. When the voltage supplied to the noninverting input terminal of the comparator CMP1 becomes equal to or higher than the reference voltage vref1, the output of the comparator CMP1 is changed to the high level.

By inverting the resultant output of the comparator CMP1 by using the inverter I2, the muting reference pulse generation circuit 11 generates the muting reference pulse which is changed to the high level after a predetermined period of time passes from the rise of the edge detection signal and has a pulse width t1.

The pulse width of the muting reference pulse, i.e. the period t1 during which the comparator CMP1 outputs the low-level signal can be optionally set by the following numerical expression (1).

$$t1=(C2 \cdot vref1)/Ia \text{(nanoseconds)} \quad (1)$$

(In the expression, C2 indicates the electrostatic capacity of the capacitor C2, vref1 indicates the reference voltage supplied from the reference voltage source Vref1, and Ia indicates the current supplied from the current source Ia.)

As discussed above, when the input signal is a negative-logic digital signal, the muting reference pulse is output as a positive-logic digital signal.

To detect in the input signal an abnormal pulse whose pulse width is shorter than a known pulse width, the pulse width t1 of the muting reference pulse, which is sent by the aforesaid numerical expression (1), is arranged to be shorter than the known pulse width. In the present case, the pulse width t1 of the muting reference pulse is preferably set so as to be about 0.5 to 0.9 times as long as the known pulse width.

As described above, when the edge detection signal shown in (b) in FIG. 3 is input, the muting reference pulse generation circuit 11 generates the muting reference pulse shown in (c) in FIG. 3.

The muting reference pulse shown in (c) in FIG. 3 and the input signal shown in (a) in FIG. 3 are supplied to the logic circuit 12. The logic circuit 12 outputs a signal which indicates a negative AND of the muting reference pulse shown in (c) in FIG. 3 and the input signal shown in (a) in FIG. 3.

Receiving two types of signals, the NAND circuits NA1 and NA2 output a low-level signal if both of these signals are at the high level, or output a high-level signal in other cases. In short, the NAND circuits NA1 and NA2 are negative AND circuits.

If no variation in pulse width occurs in the input signal, there is no period in which both of the muting reference pulse shown in (c) in FIG. 3 and the input signal shown in (a) in FIG. 3 are at the high level. Therefore, as shown in (d) in FIG. 3, the output signal of the NAND circuit NA1 of the logic circuit 12 is kept at the high level, and hence the logic circuit 12 does not output anything.

The output signal of the logic circuit 12 shown in the graph (d) in FIG. 3 is logically inverted by the inverter I3 and then supplied to the muting signal generation circuit 13. The muting signal generation circuit 13 generates a muting signal from the output signal of the inverter I3.

Receiving the output signal of the inverter I3, the muting signal generation circuit 13 generates the muting signal in the following manner.

In the present embodiment, the muting signal generation circuit 13 has a substantially identical circuitry with the muting reference pulse generation circuit 11. Therefore, how the muting signal generation circuit 13 generates the muting signal is substantially identical with how the muting reference pulse generation circuit 11 generates the muting reference pulse as above.

That is, the output signal of the inverter I3 is first input to the base terminal of the transistor Tr2 of the muting signal generation circuit 13. The transistor Tr2 is turned on only when the output signal of the inverter I3 is at the high level. When the transistor Tr2 is turned on, the capacitor C3 releases the accumulated electric charge via the transistor Tr2. In doing so, the power source line to which the capacitor C3 is connected has a ground potential, and the voltage supplied to the noninverting input terminal of the comparator CMP2 is zero. In the meanwhile, the inverting input terminal of the comparator CMP2 receives a reference voltage vref2 from the reference voltage source Vref2. As a result, the voltage on the noninverting input terminal of the comparator CMP2 is lower than the voltage on the inverting input terminal of comparator CMP2, and hence the output of the comparator CMP2 is at the low level.

Subsequently, when the output signal of the inverter 13 changes from the high level to the low level, the transistor Tr2 is turned off. As the transistor Tr2 is turned off, a current from the current source Ib starts to charge the capacitor C3. The electric potential of the power source line to which the capacitor C3 is connected gradually increases, with the result that the voltage supplied to the noninverting input terminal of the comparator CMP2 also gradually increases. When the voltage supplied to the noninverting input terminal of the comparator CMP2 becomes equal to or higher than the reference voltage vref2, the output of the comparator CMP2 is changed to the high level.

By logically inverting the resultant output of the comparator CMP2 by using the inverter I4, the muting signal generation circuit 13 generates the muting signal.

In case where the output signal of the logic circuit 12, which is shown in the graph (d) in FIG. 3, is logically inverted by the inverter I3 and supplied to the muting signal generation circuit 13, the signal supplied to the muting signal generation circuit 13 is always at the low level. Therefore the transistor Tr2 is always turned off and the voltage of the power source line connected to the capacitor C3 is maintained at a voltage not lower than the reference voltage vref2. For this reason the output of the comparator CMP2 is maintained at the high level. Therefore the muting signal output from the muting signal generation circuit 13 in this case is maintained at the low level as shown in the graph (e) in FIG. 3.

The muting signal shown in the graph (e) in FIG. 3 and the input signal shown in the graph (a) in FIG. 3 are supplied to the switching circuit 14.

Receiving the input signal and the muting signal, the switching circuit 14 outputs a signal to the speaker driver 4 in the following manner.

When the muting signal is logically inverted by the inverter I5 and supplied to one input terminal of the NAND circuit NA2 of the switching circuit 14 whereas the input signal is supplied to the other input terminal of the NAND circuit NA2 of the switching circuit 14, the NAND circuit NA2 outputs a negative AND of the input signal and a signal generated by inverting the high and low levels of the muting signal. The negative AND output from the NAND circuit NA2 is further logically inverted by the inverter I6 and supplied to the speaker driver 4.

As discussed above, in the case of FIG. 3, the muting signal shown in the graph (e) in FIG. 3 is maintained at the low level. Therefore the signal supplied to one input terminal of the NAND circuit NA2 of the switching circuit 14 is maintained at the high level.

Therefore the NAND circuit NA2 of the switching circuit 14 outputs a signal which is generated by logically inverting by the inverter I6 the signal which has been input to the other input terminal and then logically inverted, i.e. outputs the signal shown in the graph (f) in FIG. 3.

As a result, the abnormal pulse detection circuit 3a outputs, to the speaker driver 4, the signal shown in the graph (f) in FIG. 3, i.e. a signal whose waveform is identical with that of the input signal shown in the graph (a) in FIG. 3. In other words, the abnormal pulse detection circuit 3a outputs the input signal shown in the graph (a) in FIG. 3 to the speaker driver 4, without making any changes to the signal.

Now, referring to FIG. 4, the following will discuss the operation of the abnormal pulse detection circuit 3a when pulse shortening or a false pulse whose pulse width is shorter than a known pulse width has occurred in the input signal.

In this case, due to the pulse shortening, the input signal has a pulse width shorter than a normal pulse width as shown in the graph (a) in FIG. 4.

The input signal shown in the graph (a) in FIG. 4 is supplied to the incoming pulse edge detection circuit 10. The incoming pulse edge detection circuit 10 generates, in the aforesaid manner, an edge detection signal which is changed to the high level at the moment of fall of the input signal shown in the graph (a) in FIG. 4 and has a predetermined pulse width t0 (see (b) in FIG. 4).

The edge detection signal generated by the incoming pulse edge detection circuit 10 is supplied to the muting reference pulse generation circuit 11. The muting reference pulse generation circuit 11 generates, in the aforesaid manner, a positive-logic muting reference pulse which is changed to the high level after a predetermined period of time passes from the rise of the edge detection signal and has a pulse width t1 (see (c) in FIG. 4).

The muting reference pulse shown in the graph (c) in FIG. 4 and the input signal shown in the graph (a) in FIG. 4 are supplied to the logic circuit 12. The logic circuit 12 outputs a signal indicating a negative AND of the muting reference pulse shown in the graph (c) in FIG. 4 and the input signal shown in the graph (a) in FIG. 4.

As shown in the graph (a) in FIG. 4, a pulse of the input signal has a shorter pulse width than a normal pulse width, at a part where the pulse shortening has occurred. As a result, there is a period t2 in which both the muting reference pulse shown in the graph (c) in FIG. 4 and the input signal shown in the graph (a) in FIG. 4 are at the high level. Therefore the output signal of the logic circuit 12 is at the low level in the period t2, as shown in the graph (d) in FIG. 4. In other words, the logic circuit 12 outputs a signal during the period t2.

The output signal of the logic circuit 12 shown in the graph (d) in FIG. 4 is logically inverted by the inverter I3 and then supplied to the muting signal generation circuit 13. The muting signal generation circuit 13 generates, in the aforesaid manner, a muting signal from the output signal of the inverter I3. That is, the muting signal generation circuit 13 generates a muting signal which is changed to the high level after a predetermined period of time passes from the fall of the output signal of the logic circuit 12 (i.e. the fall of the output signal of the inverter 13) and has a pulse width t3 (see (e) in FIG. 4).

As discussed above, in the present embodiment how the muting signal generation circuit 13 generates the muting signal is substantially identical with how the muting reference pulse generation circuit 11 generates the muting reference pulse. Therefore, by using the following numerical expression (2) it is possible to optionally determine the period in which the comparator CMP2 outputs a low-level signal, i.e. the pulse width t3 (which is a predetermined period of time of the present invention, during which the abnormal pulse detection circuit does not externally output an optical signal) of the muting signal.

$$t3 = (C3 \cdot vref2)/Ib \text{(nanoseconds)} \quad (2)$$

(In the numerical expression, C3 indicates the electrostatic capacity of the capacitor C3, vref2 indicates the reference voltage supplied from the reference voltage source Vref2, and Ib indicates the current supplied from the current source Ib.)

To detect an abnormal pulse which occurs in the input signal and whose pulse width is shorter than a known pulse width, the pulse width t3 of the muting signal, which is determined by the numerical expression (2), is arranged to be not shorter than a single cycle of the input signal, more preferably arranged to be sufficiently longer than the known pulse width. In particular, the pulse width t3 of the muting signal is preferably set so as to be not shorter than the pulse width equivalent to the maximum cycle in which no pulse occurs in the input signal. That is to say, in case where one or more pulse occurs during 4 cycles of the input signal, the pulse width t3 of the muting signal is preferably set so as to be, for example, at least four times as long as the cycle of the input signal.

The muting signal shown in the graph (e) in FIG. 4 and the input signal shown in the graph (a) in FIG. 4 are supplied to the switching circuit 14. The switching circuit 14 outputs a signal to the speaker driver 4 in the aforesaid manner.

As a result, the abnormal pulse detection circuit 3a outputs, to the speaker driver 4, a signal which is generated by inverting by the inverter I6 the signal indicating a negative AND of the input signal shown in the graph (a) and a signal generated by logically inverting by the inverter I5 the muting signal shown in the graph (e) in FIG. 4, i.e. the abnormal pulse detection circuit 3a outputs the signal shown in the graph (f) in FIG. 4 to the speaker driver 4.

As shown in the graph (f) in FIG. 4, the output signal supplied to the speaker driver 4 is kept at the high level while the muting signal from the muting signal generation circuit 13 is maintained at the high level.

Since the input signal has originally been supplied as a negative-logic signal, no signal is substantially supplied from the receiving device 2 to the speaker driver 4 when the output to the speaker driver 4 is maintained at the high level. In other words, while the output to the speaker driver 4 is maintained at the high level, the speaker driver 4 does not allow the speaker 5 to reproduce the input signal, i.e. the audio data.

Lastly, referring to FIG. 5, the following will discuss the operation of the abnormal pulse detection circuit 3a when pulse division has occurred in the input signal.

In this case, as a result of pulse division, the input signal is arranged such that a pulse which should have been a single pulse has been divided into two pulses P1 and P2, as shown in the graph (a) in FIG. 5. As a result of this, the pulse width of the input signal is shorter than a normal pulse width.

The input signal shown in the graph (a) in FIG. 5 is supplied to the incoming pulse edge detection circuit 10. The incoming pulse edge detection circuit 10 generates, in the aforesaid manner, an edge detection signal which is changed to the high level at the moment of fall of the input signal and has a predetermined pulse width t0.

As a matter of course, as shown in the graph (b) in FIG. 5, the edge detection signal is generated both at the falling edge of the pulse P1 and the falling edge of the pulse P2.

The edge detection signal generated by the incoming pulse edge detection circuit 10 is supplied to the muting reference pulse generation circuit 11. The muting reference pulse generation circuit 11 generates, in the aforesaid manner, a positive-logic muting reference pulse which is changed to the high level after a predetermined period of time passes from the rise of the edge detection signal and has a pulse width t1.

In doing so, the muting reference pulse generation circuit 11 generates a muting reference pulse from the edge detection signal generated based on the pulse P1 and also generates another muting reference pulse from the edge detection signal generated based on they pulse P2.

In (c) in FIG. 5, these two muting reference pulses overlap one another so as to form a single muting reference pulse whose pulse width is longer than t1. These two muting reference pulses, however, do not always overlap one another.

The muting reference pulse shown in the graph (c) in FIG. 5 and the input signal shown in the graph (a) in FIG. 5 are supplied to the logic circuit 12. The logic circuit 12 outputs a signal indicating a negative AND of the muting reference pulse shown in the graph (c) in FIG. 5 and the input signal shown in the graph (a) in FIG. 5.

Periods during which both the muting reference pulse shown in the graph (c) in FIG. 5 and the input signal shown in the graph (a) in FIG. 5 are at the high level are periods t21 and t22 shown in the graph (d) in FIG. 5. The output signal of the logic circuit 12 is therefore at the low level in the periods t21 and t22, as shown in the graph (d) in FIG. 5. In other words, the logic circuit 12 outputs a signal in the periods t21 and t22.

Then the output signal of the logic circuit 12, which is shown in the graph (d) in FIG. 5, is logically inverted by the inverter I3 and then supplied to the muting signal generation circuit 13. The muting signal generation circuit 13 generates, in the aforesaid manner, a muting signal from the output signal of the inverter I3. That is to say, the muting signal generation circuit 13 generates a muting signal which is changed to the high level after a predetermined period of time passes from the fall of the output signal of the logic circuit 12 and has a pulse width t3 (see (e) in FIG. 5). For the sake of convenience, (e) in FIG. 5 only illustrates the muting signal generated based on the pulse P1, and hence the muting signal generated based on the P2 is not illustrated therein.

The muting signal shown in the graph (e) in FIG. 5 and the output signal shown in the graph (a) in FIG. 5 are supplied to the switching circuit 14. The switching circuit 14 outputs a signal to the speaker driver 4 in the aforesaid manner.

As a result, the abnormal pulse detection circuit 3a outputs, to the speaker driver 4, a signal which is generated by logically inverting by the inverter I6 the signal indicating a negative AND of the input signal shown in the graph (a) in FIG. 5 and a signal generated by logically inverting, by the inverter I5, the muting signal shown in the graph (e) in FIG. 5. In other words, the abnormal pulse detection circuit 3a outputs the signal shown in the graph (f) in FIG. 5 to the speaker driver 4.

The output signal supplied to the speaker driver 4 is, as shown in the graph (f) in FIG. 5, kept at the high level while the muting signal supplied from the muting signal generation circuit 13 is maintained at the high level.

Since the input signal is originally input as a negative-logic signal, substantially no signal is supplied from the receiving device 2 to the speaker driver 4 while the output signal supplied to the speaker driver 4 is kept at the high level. In other words, while the output signal supplied to the speaker driver 4 is kept at the high level, the speaker driver 4 does not allow the speaker 5 to reproduce the input signal, i.e. the audio data.

In this way, the abnormal pulse detection circuit 3a shown in FIG. 2 disallows the reproduction of the input signal, i.e. the audio data, when pulse shortening or a false pulse whose pulse width is shorter than a known pulse width has occurred.

Embodiment 2

The following will describe another embodiment of the present invention with reference to FIGS. 7 through 11. By the way, members having the same functions as those already described with reference to figures are given the same numbers, so that the descriptions are omitted for the sake of convenience.

Figure 7:
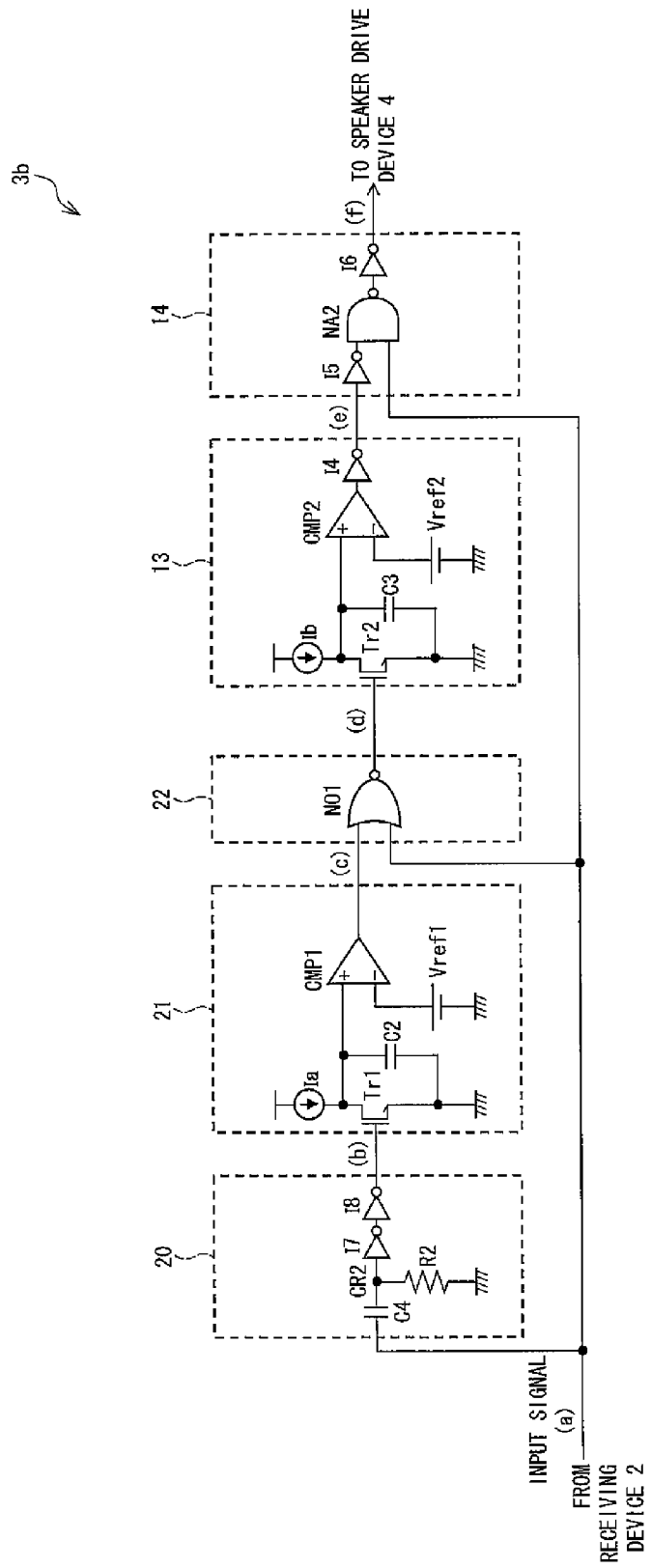
FIG. 7 relates to another embodiment of the present invention and is a block diagram showing an abnormal pulse detection circuit of a receiver of the present invention.

FIG. 7 is a block diagram showing another example of the abnormal pulse detection circuit. Being similar to the abnormal pulse detection circuit 3a shown in FIG. 2, the abnormal pulse detection circuit (abnormal pulse detection means) 3b shown in FIG. 7 is suitably used as an abnormal pulse detection circuit 3 in the optical receiver 1 shown in FIG. 1. The abnormal pulse detection circuit 3b shown in FIG. 7 receives a positive-logic digital signal as an input signal.

Being similar to the abnormal pulse detection circuit 3a shown in FIG. 2, the abnormal pulse detection circuit 3b shown in FIG. 7 is an example suitable for the detection of an abnormal pulse which occurs in an input signal and whose pulse width is shorter than a known pulse width.

The abnormal pulse detection circuit 3b shown in FIG. 7 is identical with the abnormal pulse detection circuit 3a shown in FIG. 2, except that an incoming pulse edge detection circuit (incoming pulse edge detection means) 20 is provided in place of the incoming pulse edge detection circuit 10, a muting reference pulse generation circuit (reference pulse generation means) 21 is provided in place of the muting reference pulse generation circuit 11, and a logic circuit (logic means) 22 is provided in place of the logic circuit 12. Also, in the abnormal pulse detection circuit 3b shown in FIG. 7, a member corresponding to the inverter I3 is omitted, in comparison with the abnormal pulse detection circuit 3a shown in FIG. 2.

The incoming pulse edge detection circuit 20 is arranged to include a capacitor C4, a resistor R2, and inverters 17 and 18. One terminal of the capacitor C4 is connected to the same power source line as the receiving device 2. The other terminal of the capacitor C4 is connected to the input terminal of the inverter I7. The output terminal of the inverter I7 is connected to the input terminal of the inverter I8. The output terminal of the inverter I8 is connected to the muting reference pulse generation circuit 21. One terminal of the resistor R2 is connected to the connection point CR2 provided between the other terminal of the capacitor C4 and the input terminal of the inverter I7. The other terminal of the resistor R2 is grounded.

This incoming pulse edge detection circuit 20 receives the input signal. The incoming pulse edge detection circuit 20 generates and outputs an edge detection signal by which the rising edge or falling edge of the input signal is detected.

In case where the input signal is a positive-logic input signal as in the present embodiment, the incoming pulse edge detection circuit 20 generates and outputs an edge detection signal for detecting the rising edge of the input signal. In case where the input signal is a negative-logic digital signal, the incoming pulse edge detection circuit 20 generates and outputs an edge detection signal for detecting the falling edge of the input signal.

The incoming pulse edge detection circuit 20 outputs the generated edge detection signal to the muting reference pulse generation circuit 21.

The muting reference pulse generation circuit 21 is arranged to include a transistor Tr1, a current source Ia, a capacitor C2, a reference voltage source Vref1, and a comparator CMP1.

The circuitry of the muting reference pulse generation circuit 21 is identical with the circuit of the muting reference pulse generation circuit 11 of the abnormal pulse detection circuit 3a shown in FIG. 2, except that the base terminal of the transistor Tr1 is connected to the output terminal of the inverter I8 of the incoming pulse edge detection circuit 20, the output terminal of the comparator CMP1 is connected to the logic circuit 22, and the inverter I2 is omitted. Therefore the details of the circuitry of the muting reference pulse generation circuit 21 is not given.

The muting reference pulse generation circuit 21 generates a muting reference pulse based on the edge detection signal supplied from the incoming pulse edge detection circuit 20, and outputs the generated pulse.

In case where the input signal is a positive-logic digital signal as in the present embodiment, the muting reference pulse generated by the muting reference pulse generation circuit 21 is a negative-logic pulse with a constant pulse width. In case where the input signal is a negative-logic digital signal, the muting reference pulse generated by the muting reference pulse generation circuit 21 is a positive-logic pulse with a constant pulse width.

The muting reference pulse generation circuit 21 outputs the generated muting reference pulse to the logic circuit 22.

The logic circuit 22 is arranged to include a typical NOR (negative OR) circuit NO1. One input terminal of the NOR circuit NO1 is connected to the output terminal of the comparator CMP1 of the muting reference pulse generation circuit 21. The other terminal of the NOR circuit NO1 is connected to the same power source line as the receiving device 2. The output terminal of the NOR circuit NO1 is connected to the muting signal generation circuit 13.

This logic circuit 22 receives the input signal and the muting reference pulse generated by the muting reference pulse generation circuit 21. That is to say, one input terminal of the NOR circuit NO1 of the logic circuit 22 receives the muting reference pulse, whereas the other input terminal of the NOR circuit NO1 of the logic circuit 22 receives the input signal. Receiving the muting reference pulse and the input signal, the logic circuit 22 outputs, to the muting signal generation circuit 13, an output signal indicating a negative OR of the muting reference pulse and the input signal.

The base terminal of the transistor Tr2 of the muting signal generation circuit 13 is connected to the output terminal of the NOR circuit NO1 of the logic circuit 22. The muting signal generation circuit 13 receives the output signal of the logic circuit 22. The muting signal generation circuit 13 and the switching circuit 14 operate in the same manner as those in the abnormal pulse detection circuit 3a shown in FIG. 2, and hence the operations thereof are not detailed here.

Figure 8:
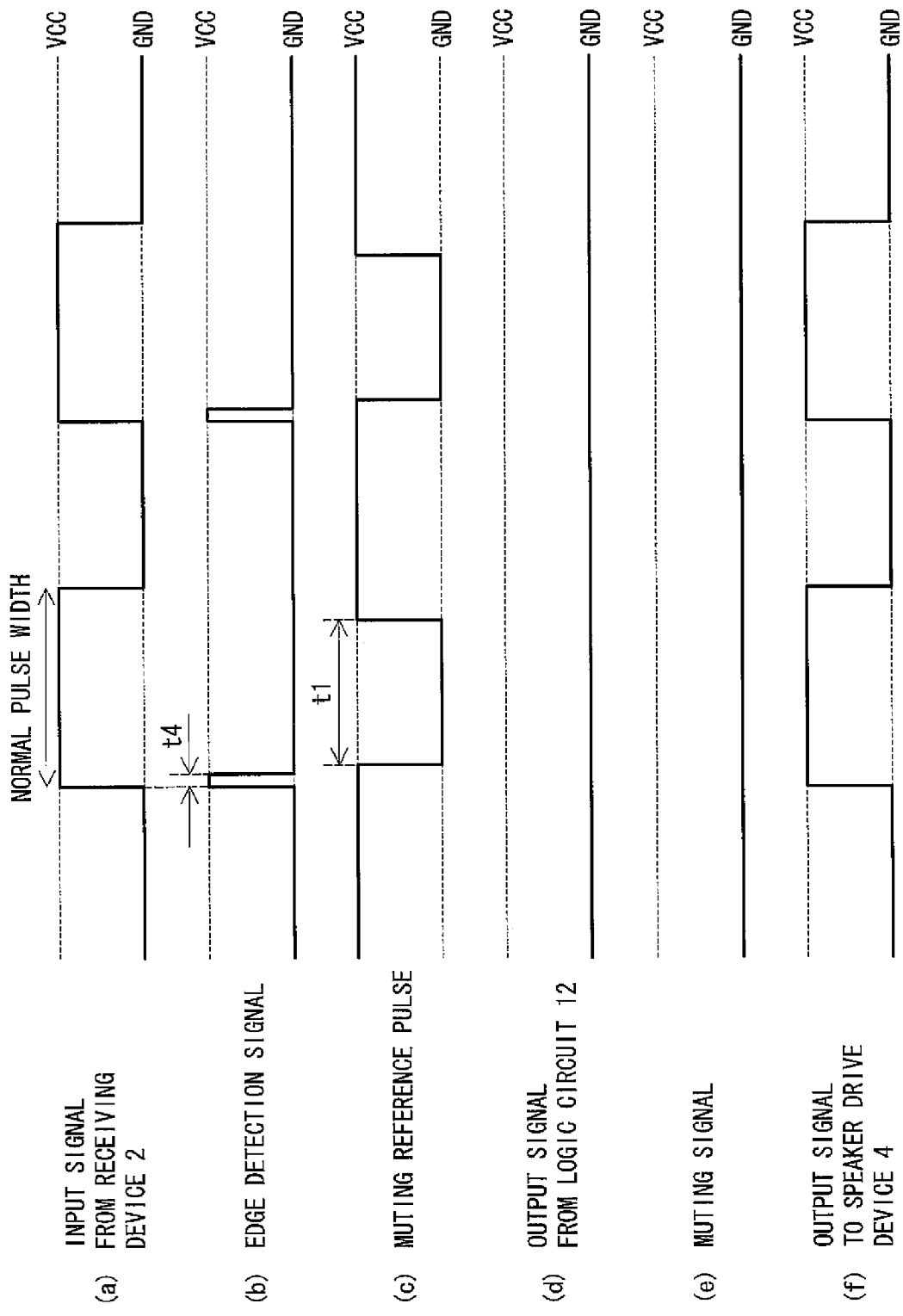
FIG. 8 is a timing chart for illustrating the principle of operation of the abnormal pulse detection circuit shown in FIG. 7 when no variation in pulse width occurs in an input signal, and shows waveforms of the input signal, an edge detection signal, a muting reference pulse, an output signal supplied to a logic circuit, a muting signal, and an output signal supplied to a speaker driver.
Figure 9:
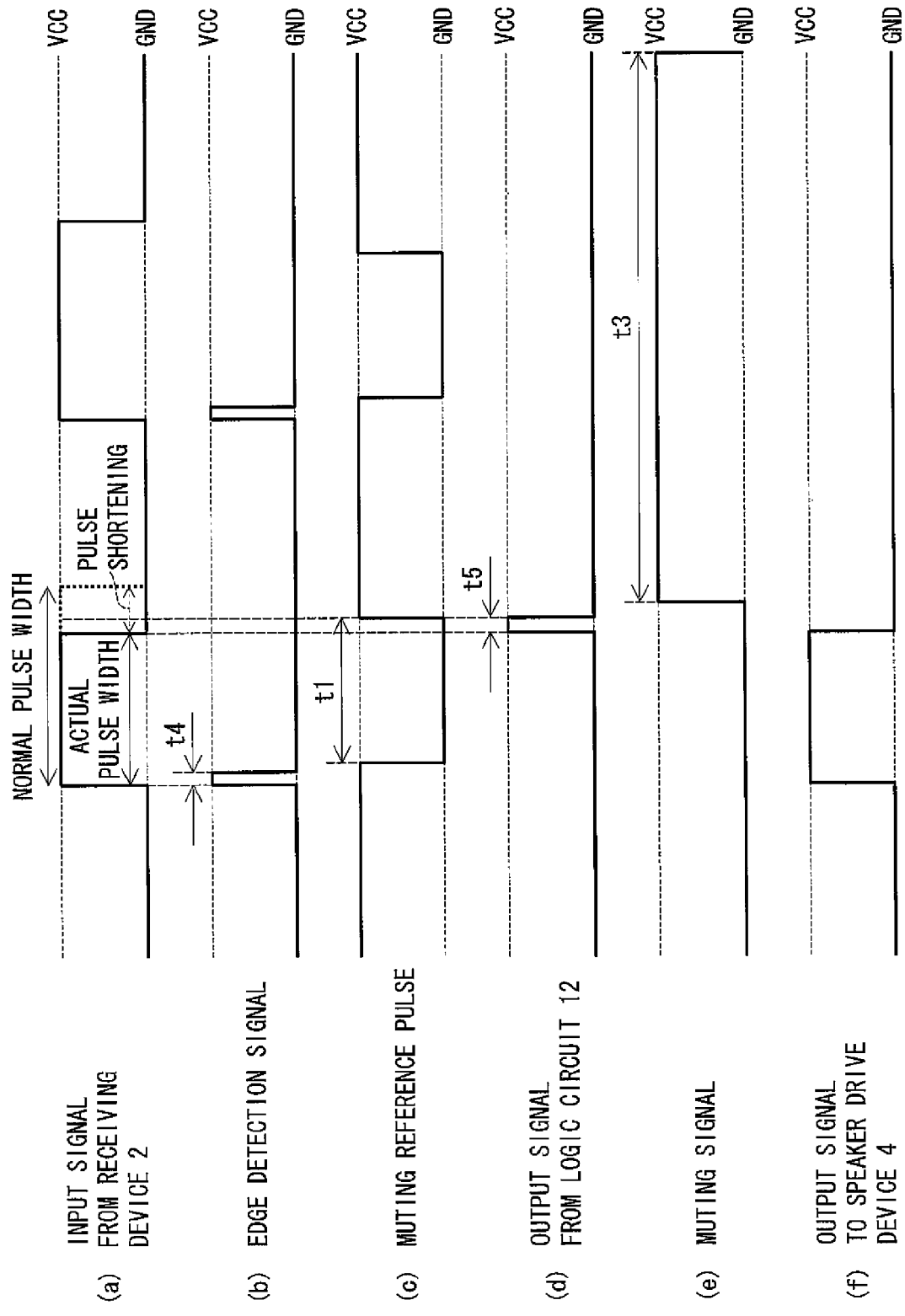
FIG. 9 is a timing chart specifically illustrating the principle of operation of the abnormal pulse detection circuit shown in FIG. 7 when pulse shortening or a false pulse having the pulse width shorter than a known pulse width occurs in an input signal, and shows the waveforms of the input signal, an edge detection signal, a muting reference pulse, an output signal supplied to a logic circuit, a muting signal, and an output signal supplied to a speaker driver.
Figure 10:
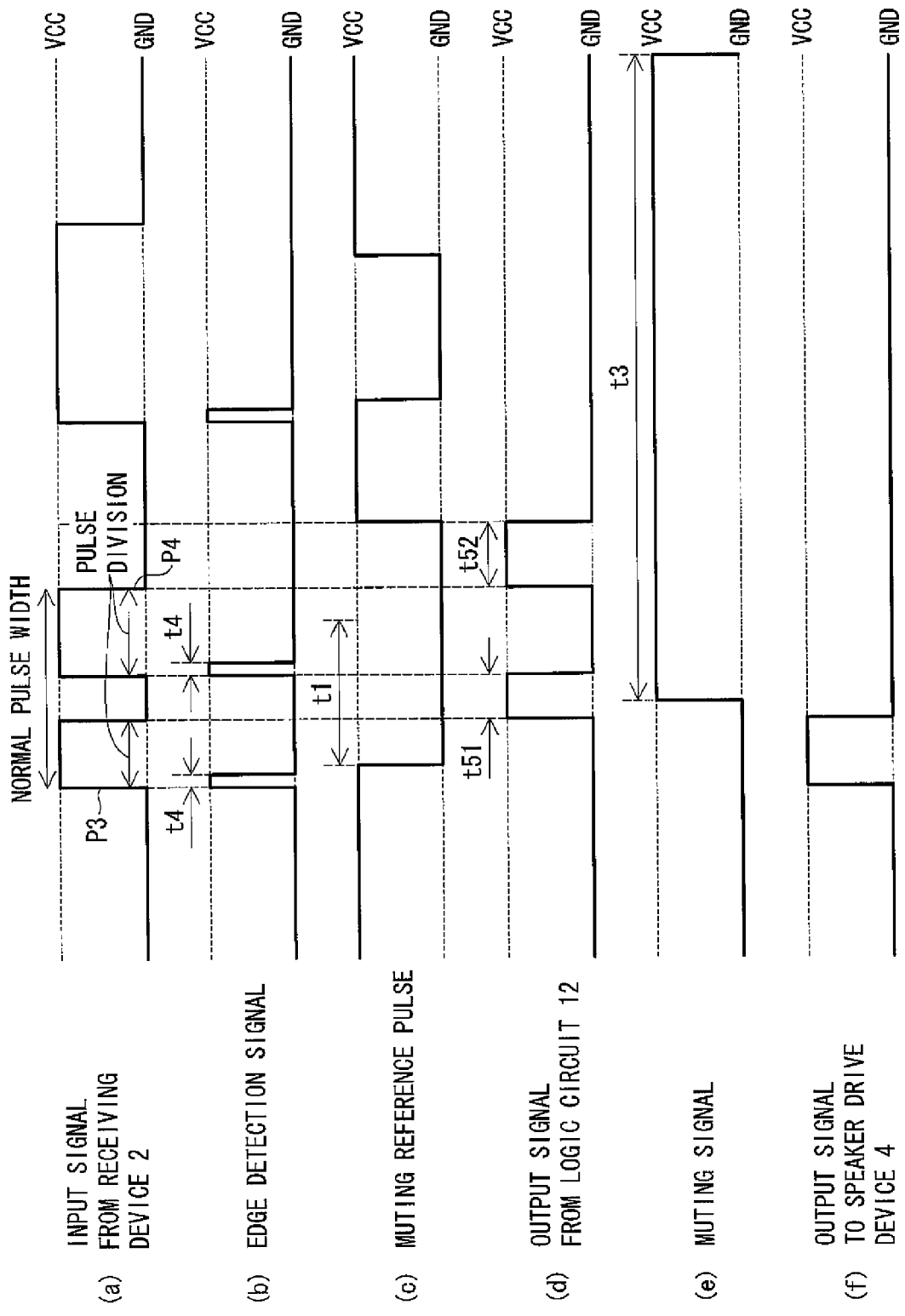
FIG. 10 is a timing chart for specifically illustrating the principle of operation of the abnormal pulse detection circuit shown in FIG. 2 when pulse division occurs in an input signal, and shows the waveforms of the input signal, an edge detection signal, a muting reference pulse, an output signal supplied to a logic circuit, a muting signal, and an output signal supplied to a speaker driver.

Referring to FIGS. 8-10, the following will specifically describe the principle of operation of the abnormal pulse detection circuit 3b.

FIG. 8 is a timing chart specifically illustrating the principle of operation of the abnormal pulse detection circuit 3b, when no variation in pulse width occurs in the input signal. FIG. 9 is a timing chart specifically illustrating the principle of operation of the abnormal pulse detection circuit 3b, when pulse shortening or a false pulse having a shorter pulse width than a known pulse width has occurred in the input signal. FIG. 10 is a timing chart specifically illustrating the principle of operation of the abnormal pulse detection circuit 3b, when pulse division has occurred in the input signal.

In the timing charts shown in FIGS. 8-10, the horizontal axis indicates time (period) whereas the vertical axis indicates a voltage level of the one-bit data string, i.e., the high level (Vcc) or the low level (GND). The pulse width of a particular pulse of the one-bit data string is equal to a period in which the particular pulse outputs a high-level (or low-level) signal. In the timing charts of FIGS. 8-10, the graph (a) shows the waveform of the input signal, the graph (b) shows the waveform of the edge detection signal, the graph (c) shows the waveform of the muting reference pulse, the graph (d) shows the waveform of the output supplied to the logic circuit 22, the graph (e) shows the waveform of the muting signal, and the graph (f) shows the waveform of the output signal supplied to the speaker driver 4.

Also, as discussed above, the abnormal pulse detection circuit 3b shown in FIG. 7 receives the input signal as a positive-logic digital signal.

Referring to FIG. 8, the following first discusses the operation of the abnormal pulse detection circuit 3b when no variation in pulse width occurs in the input signal.

When no variation in pulse width occurs, the input signal has a normal pulse width shown in (a) in FIG. 8.

The input signal shown in (a) in FIG. 8 is supplied to the incoming pulse edge detection circuit 20. The incoming pulse edge detection circuit 20 generates an edge detection signal by which the rising edge of the input signal shown in (a) in FIG. 8 is detected.

Now, referring to FIG. 11, the following discusses how the incoming pulse edge detection circuit 20 generates the edge detection signal in response to the input of the input signal.

FIG. 11 is a timing chart showing how the incoming pulse edge detection circuit 20 generates the edge detection signal. The graph (a) in FIG. 11 shows the waveform of the input signal, the graph (b) of FIG. 11 shows the waveform of the voltage at the connection point CR2, and the graph (c) of FIG. 11 shows the waveform of the edge detection signal.

The resistor R2 and the capacitor C4 of the incoming pulse edge detection circuit 20 form a typical differentiation circuit.

The input signal supplied to the incoming pulse edge detection circuit 20 (see (a) in FIG. 11) has a significantly high frequency component at the moments of rise and fall of a pulse. Therefore, at the moment of rise of the input signal, the voltage at the connection point CR2 rapidly changes from the low level to the high level, on account of the differentiation by the resistor R2 and the capacitor C4 (see (b) in FIG. 11). Thereafter, the input signal is constantly kept at the high level, and hence the voltage at the connection point CR2 gradually decreases from the high level to the low level.

In the meanwhile, at the moment of fall of the input signal, the voltage at the connection point CR2 rapidly changes to a voltage below the low level, on account of the aforesaid differentiation (see (b) in FIG. 11). The voltage at the connection point CR2 at this moment is lower than the low level. However, since the input signal is constantly kept at the low level, the voltage at the connection point CR2 gradually approaches the low level.

Because of the above, the input signal is converted at the connection point CR2 into a signal which is the waveform shown in (b) in FIG. 11 and which is at the high level during a predetermined period after the moment of rise of the input signal and is at the low level in the other periods. This signal is logically inverted twice by the inverters I7 and I8, so that the incoming pulse edge detection circuit 20 generates an edge detection signal (see (c) in FIG. 11) which is a pulse changed to the high level at the moment of rise of the input signal and has a predetermined pulse width (a period in which a pulse is output) t4 (e.g. a pulse width equivalent to about 5 to 10 nanoseconds).

Receiving the input signal shown in (a) in FIG. 8, the incoming pulse edge detection circuit 20 generates an edge detection signal shown in (b) in FIG. 8, which is a pulse changed to the high level at the moment of rise of the input signal shown in (a) in FIG. 8 and has a predetermined pulse width t4.

The edge detection signal (see (b) in FIG. 8) generated by the incoming pulse edge detection circuit 20 is supplied to the muting reference pulse generation circuit 21. The muting reference pulse generation circuit 21 generates a muting reference pulse from the supplied edge detection signal.

When the edge detection signal is input, the muting reference pulse generation circuit 21 generates the muting reference pulse in a substantially same manner as the muting reference pulse generation circuit 11 generates the muting reference pulse.

That is to say, the muting reference pulse generation circuit 21 operates in the same manner as the muting reference pulse generation circuit 11, from the input of the edge detection signal to the acquisition of the output of the comparator CMP1. As discussed above, the muting reference pulse generation circuit 21 has the same circuitry as the muting reference pulse generation circuit 11 of the abnormal pulse detection circuit 3a shown in FIG. 2, except that the inverter I2 is omitted. Therefore the output of the comparator CMP1 is not logically converted, and hence the muting reference pulse generation circuit 21 generates, as shown in (c) in FIG. 8, a muting reference pulse which is changed to the low level after a predetermined period of time passes from the rise of the edge detection signal and has a pulse width t1.

As discussed above, when the input signal is a positive-logic digital signal, the muting reference pulse above is output as a negative-logic digital signal. Also, when an abnormal pulse whose pulse width is shorter than a known pulse width is detected in the input signal, the pulse width t1 of the muting reference pulse is arranged to be shorter than the known pulse width.

The muting reference pulse shown in (c) in FIG. 8 and the input signal shown in (a) in FIG. 8 are supplied to the logic circuit 22. The logic circuit 22 outputs a signal indicating a negative OR of the muting reference pulse shown in (c) in FIG. 8 and the input signal shown in (a) in FIG. 8.

Receiving two types of signals, the NOR circuit NO1 of the logic circuit 22 outputs a high-level signal if both of the signals indicate the low level, or outputs a low-level signal in other cases. In short, the NOR circuit NO1 is a negative OR circuit.

When no variation in pulse width occurs in the input signal, there is no period in which both the muting reference pulse shown in (c) in FIG. 8 and the input signal shown in (a) in FIG. 8 are at the low level. On this account, the output signal of the NOR circuit NO1 of the logic circuit 22 is kept at the low level as shown in (d) in FIG. 8. In short, the logic circuit 22 outputs nothing.

The output signal of the logic circuit 22, which is shown in (d) in FIG. 8, is supplied to the muting signal generation circuit 13. The muting signal generation circuit 13 generates a muting signal from the output signal of the logic circuit 22, in the aforesaid manner.

When the output signal of the logic circuit 22, which is shown in (d) in FIG. 8, is supplied to the muting signal generation circuit 13, the signal supplied to the muting signal generation circuit 13 is always kept at the low level. Therefore, in this case the muting signal output from the muting signal generation circuit 13 is maintained at the low level because of the aforesaid reason, as shown in (e) in FIG. 8.

The muting signal shown in (e) in FIG. 8 and the input signal shown in (a) in FIG. 8 are supplied to the switching circuit 14. The switching circuit 14 outputs a signal to the speaker driver 4 in the aforesaid manner.

In the case of FIG. 8, the muting signal shown in (e) in FIG. 8 is maintained at the low level as described above. On this account, a signal input to one input terminal of the NAND circuit NA2 of the switching circuit 14 is maintained at the high level.

Therefore, the signal output from the NAND circuit NA2 of the switching circuit 14 is identical with the signal input to the other input terminal of the NAND circuit NA2 of the switching circuit 14, i.e. identical with the input signal shown in (a) in FIG. 8.

As a result, the abnormal pulse detection circuit 3b outputs, to the speaker driver 4, a signal which is shown in (f) in FIG. 8 and has the same waveform as the input signal shown in (a) in FIG. 8. In other words, the abnormal pulse detection circuit 3b outputs the input signal shown in (a) in FIG. 8 to the speaker driver 4, without making any changes thereto.

Referring to FIG. 9, the following will now discuss the operation of the abnormal pulse detection circuit 3b, when pulse shortening or a false pulse having a shorter pulse width than a known pulse width has occurred in the input signal.

In this case, the input signal has, as a result of pulse shortening, a pulse width shorter than a normal pulse width, as illustrated in (a) in FIG. 9.

The input signal shown in (a) in FIG. 9 is supplied to the incoming pulse edge detection circuit 20. The incoming pulse edge detection circuit 20 generates, in the aforesaid manner, an edge detection signal which is a pulse changed to the high level at the moment of rise of the input signal shown in (a) in FIG. 9 and has a predetermined pulse width t4 (see (b) in FIG. 9).

The edge detection signal generated by the incoming pulse edge detection circuit 20 is supplied to the muting reference pulse generation circuit 21. The muting reference pulse generation circuit 21 generates, in the aforesaid manner, a negative-logic muting reference pulse which is changed to the low level after a predetermined period of time passes from the rise of the edge detection signal and has a pulse width t1 (see (c) in FIG. 9).

The muting reference pulse shown in (c) in FIG. 9 and the input signal shown in (a) in FIG. 9 are supplied to the logic circuit 22. The logic circuit 22 outputs a signal indicating a negative OR of the muting reference pulse shown in (c) in FIG. 9 and the input signal shown in (a) in FIG. 9.

As shown in (a) in FIG. 9, the input signal has a shorter pulse width than a normal pulse width. As a result of this, there is a period t5 during which both the muting reference pulse shown in (c) in FIG. 9 and the input signal shown in (a) in FIG. 9 are at the low level. Therefore the output signal of the logic circuit 22 is at the high level in the period t5 as shown in (d) in FIG. 9. In other words, the logic circuit 22 outputs a signal in the period t5.

The output signal of the logic circuit 22, which is shown in (d) in FIG. 9, is then supplied to the muting signal generation circuit 13. The muting signal generation circuit 13 generates a muting signal from the output signal of the logic circuit 22, in the aforesaid manner. That is to say, the muting signal generation circuit 13 generates a muting signal which is a pulse changed to the high level after a predetermined periods of time passes from the rise of the output signal of the logic circuit 22 and has a pulse width t3 (see (e) in FIG. 9).

The muting signal shown in (e) in FIG. 9 and the input signal shown in (a) in FIG. 9 are supplied to the switching circuit 14. The switching circuit 14 outputs a signal to the speaker driver 4, in the aforesaid manner.

As a result, the abnormal pulse detection circuit 3b outputs, to the speaker driver 4, a signal generated by logically inverting by the inverter I6 a signal indicating a negative AND of the input signal shown in (a) in FIG. 9 and a signal generated by logically inverting by the inverter I5 the muting signal shown in (e) in FIG. 9. In short, the abnormal pulse detection circuit 3b outputs the signal shown in (f) in FIG. 9 to the speaker driver 4.

The output signal supplied to the speaker driver 4 is, as shown in (f) in FIG. 9, kept at the low level while the muting signal supplied from the muting signal generation circuit 13 is kept at the high level.

Since the input signal is originally input as a positive-logic signal, no signal is substantially input from the receiving device 2 to the speaker driver 4, while the output signal supplied to the speaker driver 4 is maintained at the low level.

In other words, the speaker driver 4 does not allow the speaker 5 to reproduce the input signal, i.e. the audio data, while the output signal supplied to the speaker driver 4 is kept at the low level.

Lastly, referring to FIG. 10, the following will discuss the operation of the abnormal pulse detection circuit 3b when pulse division has occurred in the input signal.

In this case, the input signal is arranged such that, as shown in (a) in FIG. 10, a pulse which should have been a single pulse is divided into two pulses P3 and P4, because of pulse division. The input signal therefore has a shorter pulse width than a normal pulse width.

The input signal shown in (a) in FIG. 10 is supplied to the incoming pulse edge detection circuit 20. The incoming pulse edge detection circuit 20 generates, in the aforesaid manner, an edge detection signal which is a pulse changed to the high level at the moment of rise of the input signal and has a predetermined pulse width t4.

As a matter of course, the edge detection signal is generated, as shown in (b) in FIG. 10, at both the rising edge of the pulse P3 and the rising edge of the pulse P4.

The edge detection signal generated by the incoming pulse edge detection circuit 20 is supplied to the muting reference pulse generation circuit 21. The muting reference pulse generation circuit 21 generates, in the aforesaid manner, a negative-logic muting reference pulse which is changed to the low level after a predetermined period of time passes from the rise of the edge detection signal and has a pulse width t1.

The muting reference pulse generation circuit 21 generates a muting reference pulse from the edge detection signal generated based on the pulse P3 and also generates another muting reference pulse from the edge detection signal generated based on the pulse P4.

In (c) in FIG. 10, these two muting reference pulses overlap one another so as to form a single muting reference pulse whose pulse width is longer than t1. These two muting reference pulses, however, do not always overlap one another.

The muting reference pulse shown in (c) in FIG. 10 and the input signal shown in (a) in FIG. 10 are supplied to the logic circuit 22. The logic circuit 22 outputs a signal indicating a negative OR of the muting reference pulse shown in (c) in FIG. 10 and the input signal shown in (a) in FIG. 10.

In this case, periods in which both the muting reference pulse shown in (c) in FIG. 10 and the input signal shown in (a) in FIG. 10 are at the low level are periods t51 and t52 shown in (d) in FIG. 10. Therefore the output signal of the logic circuit 22 is at the high level in the periods t51 and t52, as shown in (d) in FIG. 10. In other words, the logic circuit 22 outputs a signal during the periods t51 and t52.

The output signal of the logic circuit 22, which is shown in (d) in FIG. 10, is then supplied to the muting signal generation circuit 13. The muting signal generation circuit 13 generates a muting signal from the output signal of the logic circuit 22, in the aforesaid manner. That is to say, the muting signal generation circuit 13 generates a muting pulse which is changed to the high level after a predetermined period of time passes from the rise of the output signal of the logic circuit 12 and has a pulse width t3 (see (e) in FIG. 10). For the sake of convenience, the graph (e) in FIG. 10 illustrates only the muting signal generated based on the pulse P3, and the muting signal generated based on the pulse P4 is omitted from the drawing.

The muting signal shown in (e) in FIG. 10 and the input signal shown in (a) in FIG. 10 are supplied to the switching circuit 14. The switching circuit 14 outputs a signal to the speaker driver 4, in the aforesaid manner.

As a result, the abnormal pulse detection circuit 3b outputs, to the speaker driver 4, a signal generated by logically inverting by the inverter I6 a signal indicating a negative AND of the input signal shown in (a) in FIG. 10 and a signal generated by logically inverting by the inverter I5 the muting signal shown in (e) in FIG. 10. In short, the abnormal pulse detection circuit 3b outputs the signal shown in (f) in FIG. 10 to the speaker driver 4.

The output signal supplied to the speaker driver 4 is, as shown in (f) in FIG. 10, kept at the low level while the muting signal supplied from the muting signal generation circuit 13 is kept at the high level.

Since the input signal is originally input as a positive-logic signal, no signal is substantially supplied from the receiving device 2 to the speaker driver 4, while the output signal supplied to the speaker driver 4 is maintained at the low level. In other words, the speaker driver 4 does not allow the speaker 5 to reproduce the input signal, i.e. the audio data, while the output signal supplied to the speaker driver 4 is maintained at the low level.

In this manner, the abnormal pulse detection circuit 3b shown in FIG. 7 stops the reproduction of the input signal, i.e. the audio data, when pulse shortening or a false pulse whose pulse width is shorter than a known pulse width has occurred.

Embodiment 3

Figure 12:
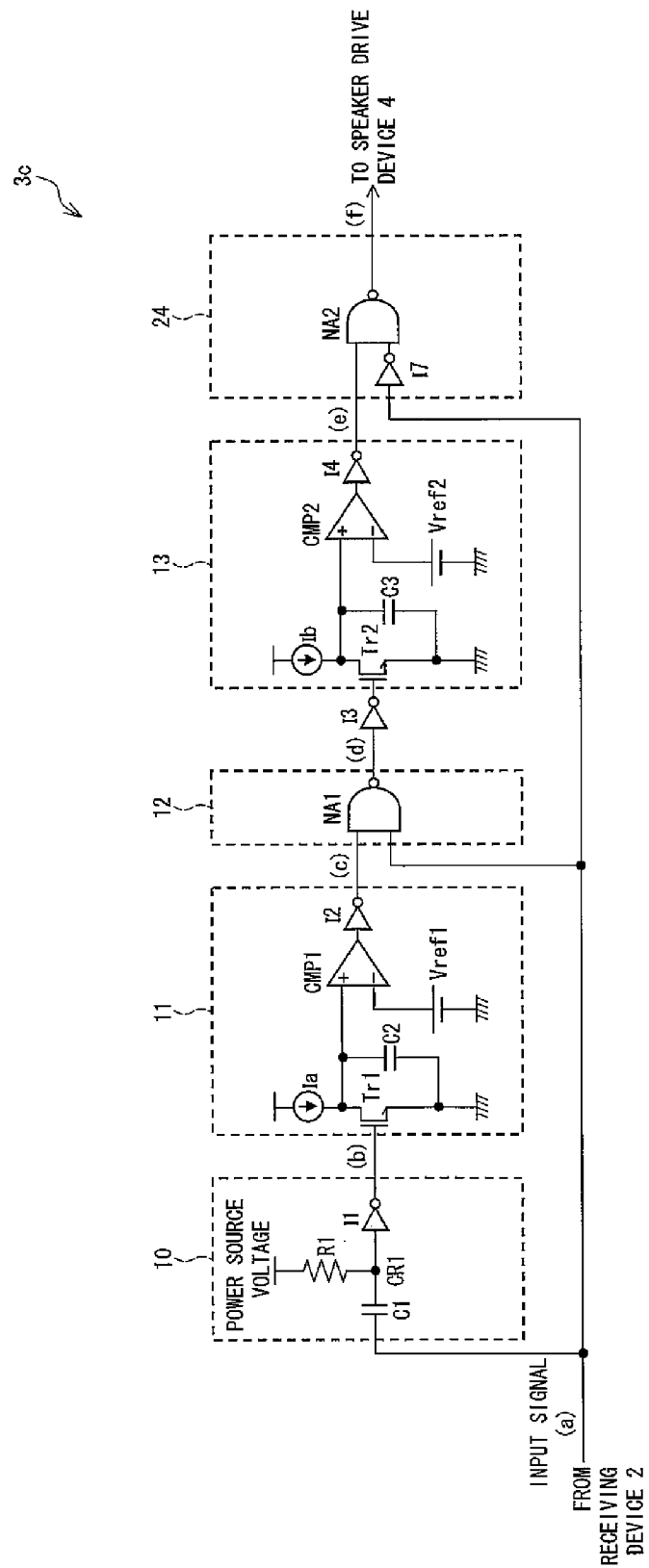
FIG. 12 relates to a further embodiment of the present invention and is a block diagram showing an abnormal pulse detection circuit of a receiver of the present invention.
Figure 13:
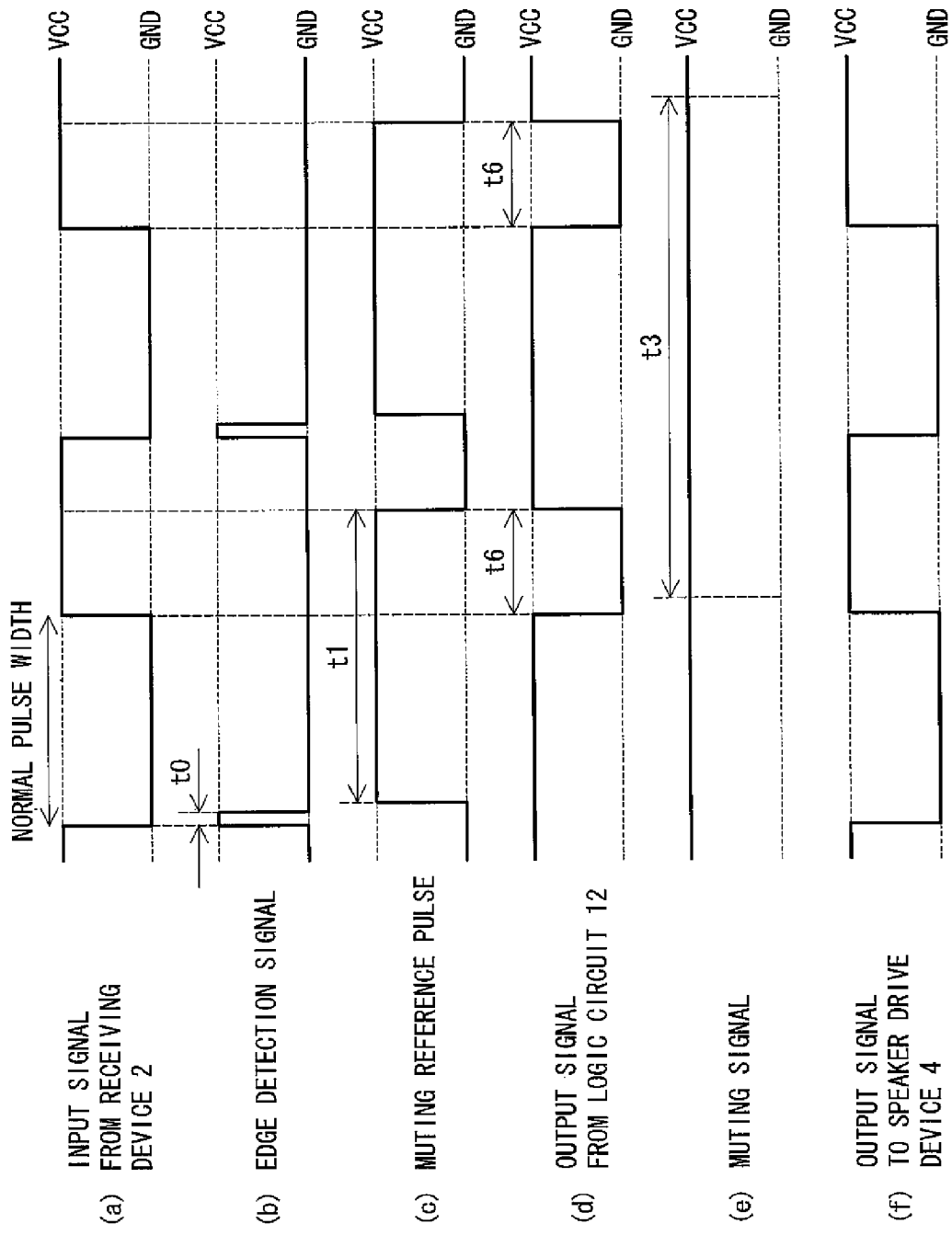
FIG. 13 is a timing chart for illustrating the principle of operation of the abnormal pulse detection circuit shown in FIG. 12 when no variation in pulse width occurs in an input signal, and shows waveforms of the input signal, an edge detection signal, a muting reference pulse, an output signal supplied to a logic circuit, a muting signal, and an output signal supplied to a speaker driver.
Figure 14:
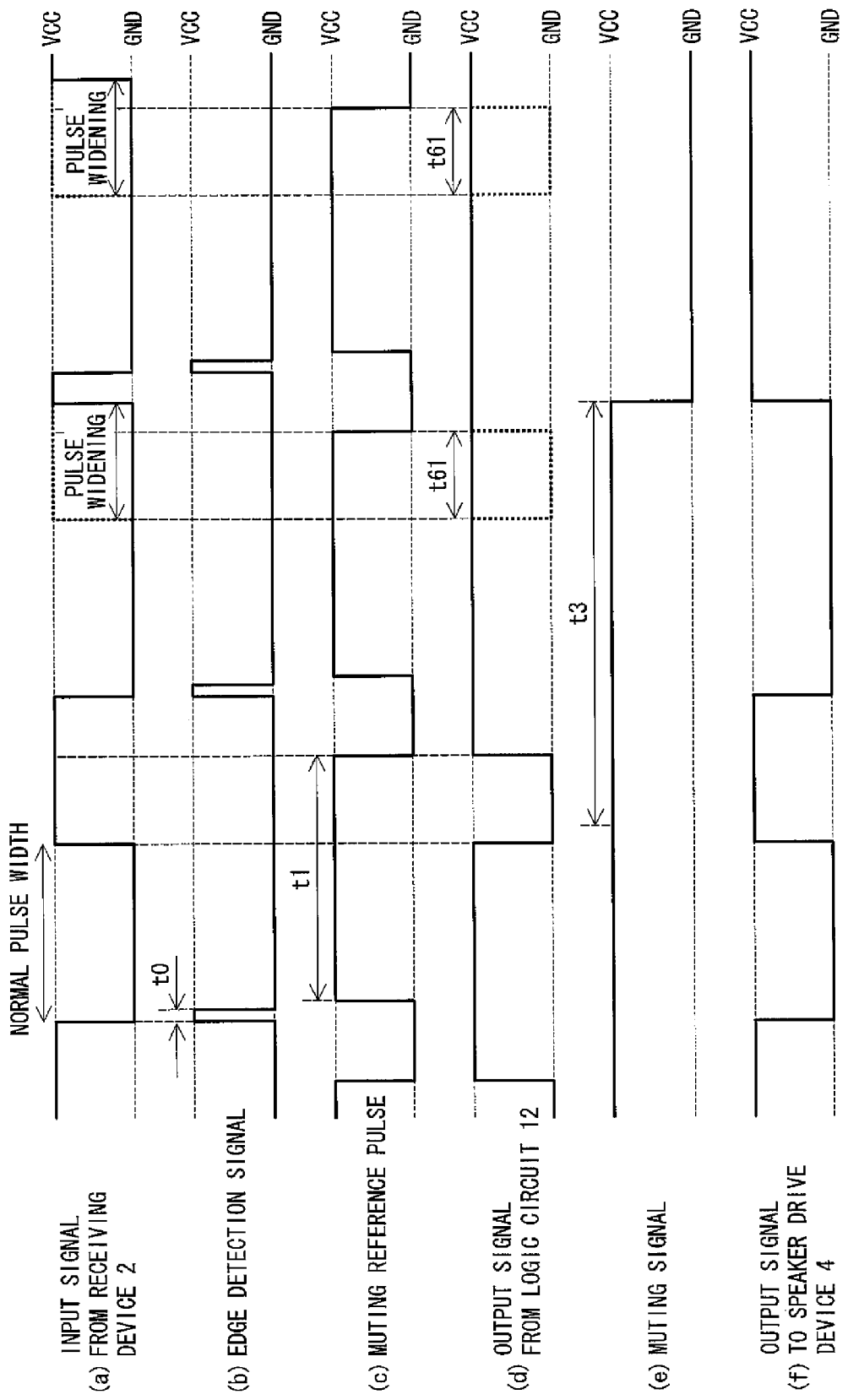
FIG. 14 is a timing chart specifically illustrating the principle of operation of the abnormal pulse detection circuit shown in FIG. 12 when pulse widening or a false pulse having the pulse width longer than a known pulse width occurs in an input signal, and shows the waveforms of the input signal, an edge detection signal, a muting reference pulse, an output signal supplied to a logic circuit, a muting signal, and an output signal supplied to a speaker driver.

The following will describe another embodiment of the present invention with reference to FIGS. 12 through 14. By the way, members having the same functions as those already described with reference to figures are given the same numbers, so that the descriptions are omitted for the sake of convenience.

FIG. 12 is a block diagram showing a further example of the abnormal pulse detection circuit. Being similar to the abnormal pulse detection circuit 3a shown in FIG. 2 and the abnormal pulse detection circuit 3b shown in FIG. 7, the abnormal pulse detection circuit (abnormal pulse detection means) 3c shown in FIG. 12 is suitably used as the abnormal pulse detection circuit 3 in the optical receiver 1 shown in FIG. 1. The abnormal pulse detection circuit 3c shown in FIG. 12 receives a negative-logic digital signal as an input signal.

The abnormal pulse detection circuit 3c shown in FIG. 12 is an example suitable for detecting in the input signal an abnormal pulse (e.g. pulse widening or the generation of a false pulse whose pulse length is longer than a known pulse width) whose pulse width is longer than a known pulse width.

The abnormal pulse detection circuit 3c shown in FIG. 12 is identical with the abnormal pulse detection circuit 3a shown in FIG. 2, except that the switching circuit 14 is replaced with a switching circuit (output stop means) 24. This switching circuit 24 is identical with the switching circuit 14 except that the inverters I5 and I6 are replaced with an inverter I7. The input terminal of the inverter I7 is connected to the same power source line as the receiving device 2. The output terminal of the inverter I7 is connected to the other input terminal of the NAND circuit NA2. One input terminal of the NAND circuit NA2 of the switching circuit 24 receives a muting signal from the muting signal generation circuit 13. The other input terminal of the NAND circuit NA2 of the switching circuit 24 receives the input signal after being logically inverted by the inverter I7. The NAND circuit NA2 of the switching circuit 24 then outputs, to the speaker driver 4, a signal indicating a negative AND of the muting signal and a signal produced by logically inverting by the inverter I7 the input signal.

To detect in the input signal an abnormal pulse whose pulse width is longer than a known pulse width, a pulse width t1 of a muting reference pulse generated by the muting reference pulse generation circuit 11 (or the muting reference pulse generation circuit 21), which is determined by the aforesaid numerical expression (1), is arranged to be longer than a known pulse width but shorter than one cycle of the input signal.

To detect in the input signal an abnormal pulse whose pulse width is longer than a known pulse width, a pulse width t3 of a muting signal generated by the muting signal generation circuit 13, which is determined by the aforesaid numerical expression (2), is preferably arranged to be more or less equivalent to the maximum cycle in which no pulse occurs in the input signal. That is to say, when one or more pulse occurs during four cycles of the input signal, the pulse width t3 of the muting signal is preferably determined to be, for example, about four times as long as a single cycle of the input signal.

Referring to FIGS. 13 and 14, the following will specifically describe the principle of operation of the abnormal pulse detection circuit 3c.

FIG. 13 is a timing chart specifically illustrating the principle of operation of the abnormal pulse detection circuit 3c, when no variation in pulse width occurs in the input signal. FIG. 14 is a timing chart specifically illustrating the principle of operation of the abnormal pulse detection circuit 3b, when an abnormal pulse having a longer pulse width than a known pulse width has occurred.

In the timing charts shown in FIGS. 13 and 14, the horizontal axis indicates time (period) whereas the vertical axis indicates a voltage level of the one-bit data string, i.e., the high level (Vcc) or the low level (GND). The pulse width of a particular pulse of the one-bit data string is equal to a period in which the particular pulse outputs a high-level (or low-level) signal. In the timing charts of FIGS. 13 and 14, the graph (a) shows the waveform of the input signal, the graph (b) shows the waveform of the edge detection signal, the graph (c) shows the waveform of the muting reference pulse, the graph (d) shows the waveform of the output supplied to the logic circuit 12, the graph (e) shows the waveform of the muting signal, and the graph (f) shows the waveform of the output signal supplied to the speaker driver 4.

Referring to FIG. 13, the following first discusses the operation of the abnormal pulse detection circuit 3c when no variation in pulse width occurs in the input signal.

When no variation in pulse width occurs, the input signal has a normal pulse width shown in (a) in FIG. 13.

The input signal shown in (a) in FIG. 13 is supplied to the incoming pulse edge detection circuit 10. Receiving the input signal shown in (a) in FIG. 13, the incoming pulse edge detection circuit 10 generates an edge detection signal which is a pulse changed to the high level at the moment of fall of the input signal shown in (a) in FIG. 13 and has a predetermined pulse width t0 (see (b) in FIG. 13).

The edge detection signal generated by the incoming pulse edge detection circuit 10 is supplied to the muting reference pulse generation circuit 11. The muting reference pulse generation circuit 11 generates a positive-logic muting reference pulse from the supplied edge detection signal.

As discussed above, the pulse width t1 of the muting reference pulse is longer than a known pulse width but shorter than one cycle of the input signal. Therefore the muting reference pulse generated by the muting reference pulse generation circuit 11 has, for example, the waveform shown in (c) in FIG. 13.

The muting reference pulse shown in (c) in FIG. 13 and the input signal shown in (a) in FIG. 13 are supplied to the logic circuit 12. The logic circuit 12 outputs a signal indicating a negative AND of the muting reference pulse shown in (c) in FIG. 13 and the input signal shown in (a) in FIG. 13.

If no variation in pulse width has occurred in the input signal, each cycle of the input signal is provided with a period t6 in which both the muting reference pulse shown in (c) in FIG. 13 and the input signal shown in (a) in FIG. 13 are at the high level. Therefore the output signal of the logic circuit 12 is at the low level in the period t6, as shown in (d) in FIG. 13. In other words, the logic circuit 12 outputs a signal during the period t6.

The output signal of the logic circuit 12, which is shown in (d) in FIG. 13, is logically inverted by the inverter I3 and then supplied to the muting signal generation circuit 13. The muting signal generation circuit 13 generates a muting signal from the output signal of the inverter I3.

The pulse width t3 of the muting signal generated by the muting signal generation circuit 13 is arranged so as to be more or less equivalent to the maximum cycle in which no pulse occurs in the input signal. In this case, the pulse width t3 of the muting signal is arranged to be not shorter than one cycle of the input signal. Also, the muting signal generation circuit 13 generates a muting signal in each cycle of the input signal, based on the output signal of the logic circuit 12, which is shown in (d) in FIG. 13. As a result, the muting signal is kept at the high level as shown in (e) in FIG. 13.

The muting signal shown in (e) in FIG. 13 and the input signal shown in (a) in FIG. 13 are logically inverted by the inverter I7 and then supplied to the switching circuit 24.

In the case of FIG. 13 the muting signal shown in (e) in FIG. 13 is kept at the high level as discussed above. For this reason, a signal input to one input terminal of the NAND circuit NA2 of the switching circuit 24 is kept at the high level.

Therefore the NAND circuit NA2 of the switching circuit 24 outputs a signal generated by logically inverting the signal having been input to the other input terminal, i.e. outputs the signal shown in (f) in FIG. 13.

As a result, the abnormal pulse detection circuit 3c outputs, to the speaker driver 4, the signal shown in (f) in FIG. 13, i.e. a signal having the same waveform as the input signal shown in (a) in FIG. 13. In other words, the abnormal pulse detection circuit 3c outputs the input signal shown in (a) in FIG. 13, without making any changes thereto.

Referring to FIG. 14, the following will discuss the operation of the abnormal pulse detection circuit 3c when an abnormal pulse having a longer pulse width than a known pulse width has occurred in the input signal.

In this case, on account of pulse widening, the input signal has a longer pulse width than a normal pulse width as shown in (a) in FIG. 14.

The input signal shown in (a) in FIG. 14 is supplied to the incoming pulse edge detection circuit 10. Receiving the input signal shown in (a) in FIG. 14, the incoming pulse edge detection circuit 10 generates an edge detection signal which is a pulse changed to the high level at the moment of fall of the input signal shown in (a) in FIG. 14 and has a predetermined pulse width t0 (see (b) in FIG. 14).

The edge detection signal generated by the incoming pulse edge detection circuit 10 is supplied to the muting reference pulse generation circuit 11. The muting reference pulse generation circuit 11 generates a positive-logic muting reference pulse from the edge detection signal (see (c) in FIG. 14).

The muting reference pulse shown in (c) in FIG. 14 and the input signal shown in (a) in FIG. 14 are supplied to the logic circuit 12. The logic circuit 12 outputs a signal indicating a negative AND of the muting reference pulse shown in (c) in FIG. 14 and the input signal shown in (a) in FIG. 14.

As shown in (a) in FIG. 14, the pulse width of the input signal is longer than a normal pulse width at a part where pulse widening has occurred. As a result, in the part where the pulse widening has occurred, the period in which both the muting reference pulse shown in (c) in FIG. 14 and the input signal shown in (a) in FIG. 14 are at the high level, i.e. a period equivalent to the period t6 shown in (d) in FIG. 13 is not provided. In short, the logic circuit 12 does not output a signal during a period t61 shown in (d) in FIG. 14.

The output signal of the logic circuit 12, which is shown in (d) in FIG. 14, is logically inverted by the inverter I3 and then supplied to the muting signal generation circuit 13. The muting signal generation circuit 13 generates a muting signal from the output signal of the inverter I3.

The pulse width t3 of the muting signal generated by the muting signal generation circuit 13 is arranged to be more or less equivalent to the maximum cycle at which no pulse occurs in the input signal. The muting signal generation circuit 13, however, cannot generate the muting signal in the aforesaid part where there is no period in which both the muting reference pulse shown in (c) in FIG. 14 and the input signal shown in (a) in FIG. 14 are at the high level. As a result, the muting signal is changed from the high level to the low level at the same time as the output for the pulse width t3 finishes (see (e) in FIG. 14).

The muting signal shown in (e) in FIG. 14 and the input signal shown in (a) in FIG. 14 are supplied to the switching circuit 24. The switching circuit 24 outputs a signal to the speaker driver 4, in the aforesaid manner.

As a result, the abnormal pulse detection circuit 3c outputs, to the speaker driver 4, a signal indicating a negative AND of the muting signal (e) in FIG. 14 and the signal generated by logically inverting by the inverter I7 the input signal shown in (a) in FIG. 14, i.e. the abnormal pulse detection circuit 3c outputs the signal shown in (f) in FIG. 14 to the speaker driver 4.

As shown in (f) in FIG. 14, the output signal supplied to the speaker driver 4 is maintained at the high level while the muting signal supplied from the muting signal generation circuit 13 is maintained at the low level.

Since the input signal has originally been input as a negative-logic signal, substantially no signal is supplied from the receiving device 2 to the speaker driver 4, while the output signal supplied to the speaker driver 4 is maintained at the high level. In other words, the speaker driver 4 does not allow the speaker 5 to reproduce the input signal, i.e. the audio data, while the output signal supplied to the speaker driver 4 is maintained at the high level.

In this way, the abnormal pulse detection circuit 3c shown in FIG. 12 stops the reproduction of the input signal, i.e. the audio data, while an abnormal pulse having a longer pulse width than a known pulse width, such as pulse widening, has occurred.

Embodiment 4

Figure 15:
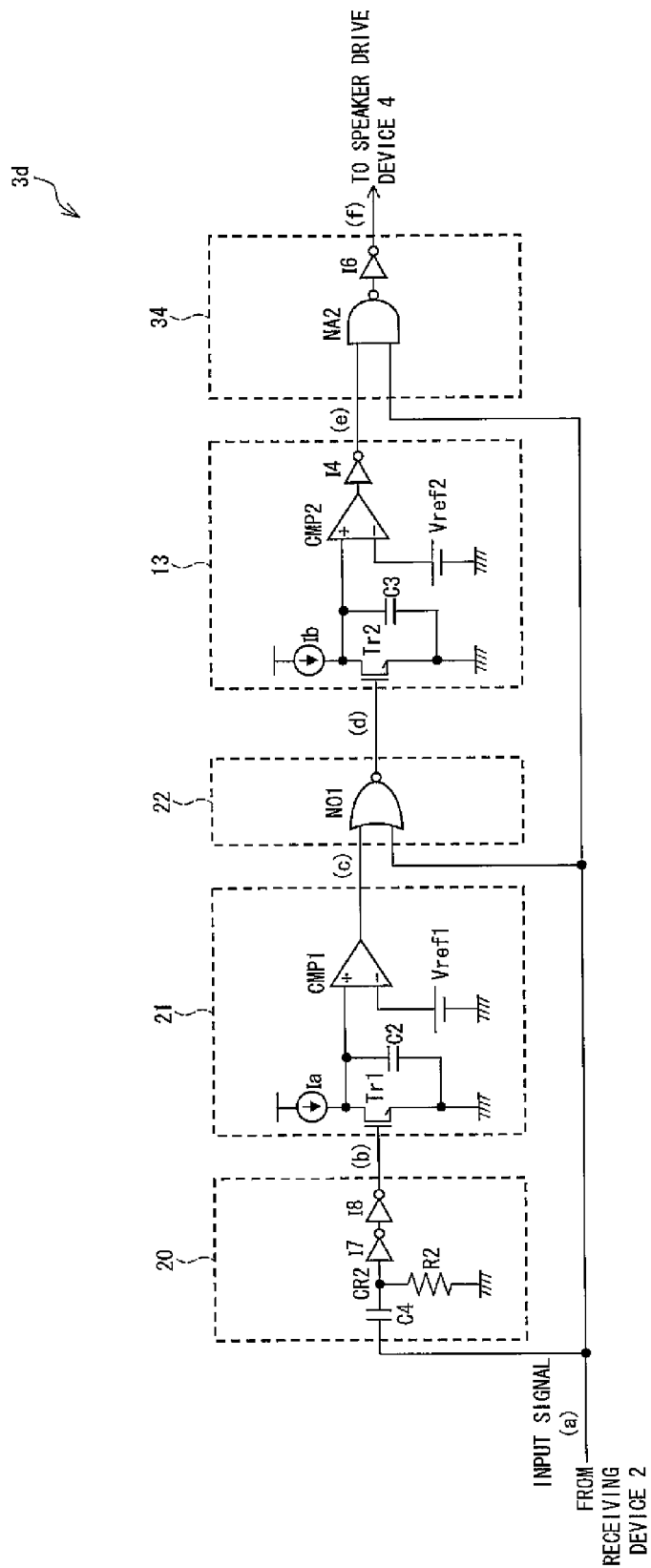
FIG. 15 relates to yet another embodiment of the present invention and is a block diagram showing an abnormal pulse detection circuit of a receiver of the present invention.
Figure 16:
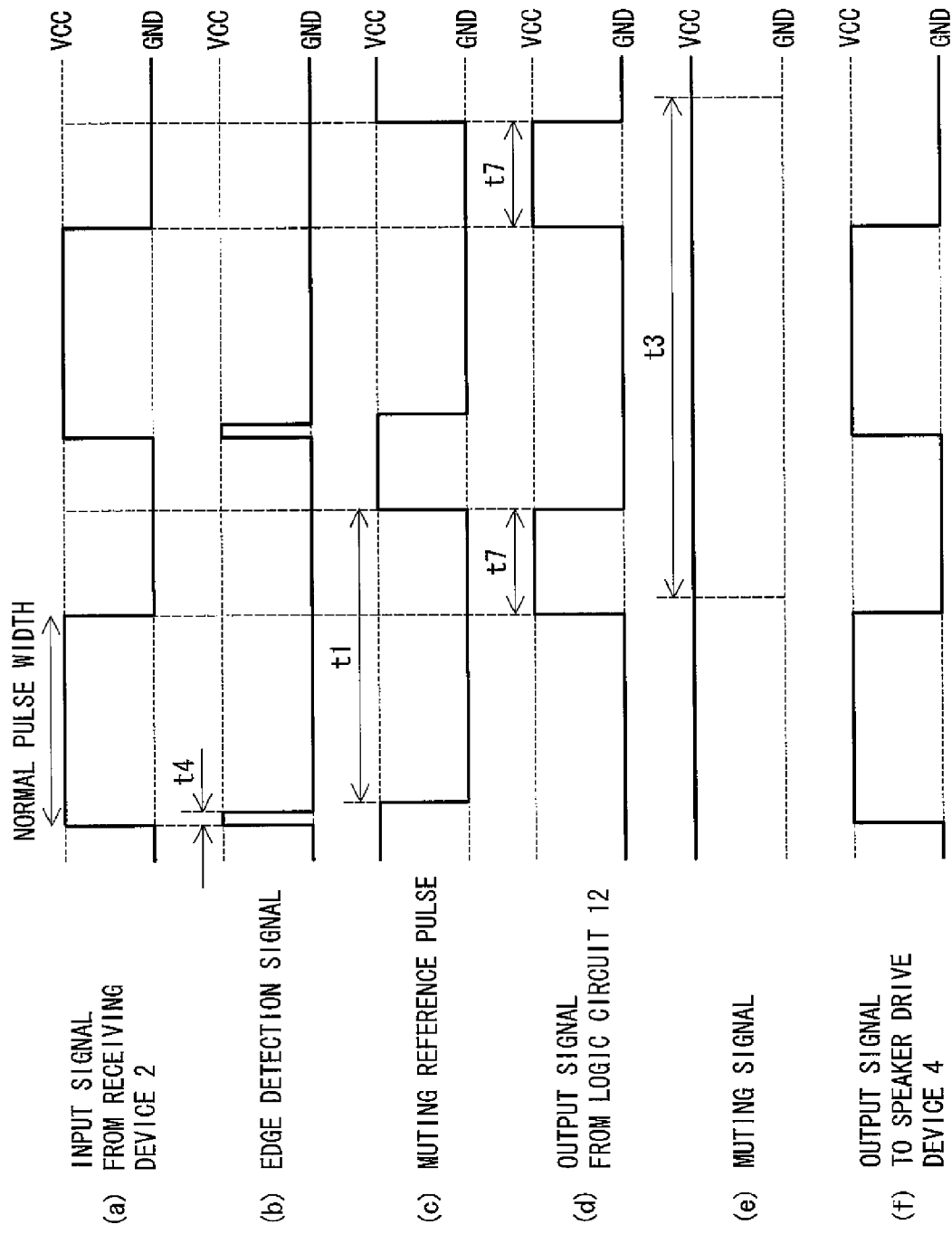
FIG. 16 is a timing chart for illustrating the principle of operation of the abnormal pulse detection circuit shown in FIG. 15 when no variation in pulse width occurs in an input signal, and shows the waveforms of the input signal, an edge detection signal, a muting reference pulse, an output signal supplied to a logic circuit, a muting signal, and an output signal supplied to a speaker driver.
Figure 17:
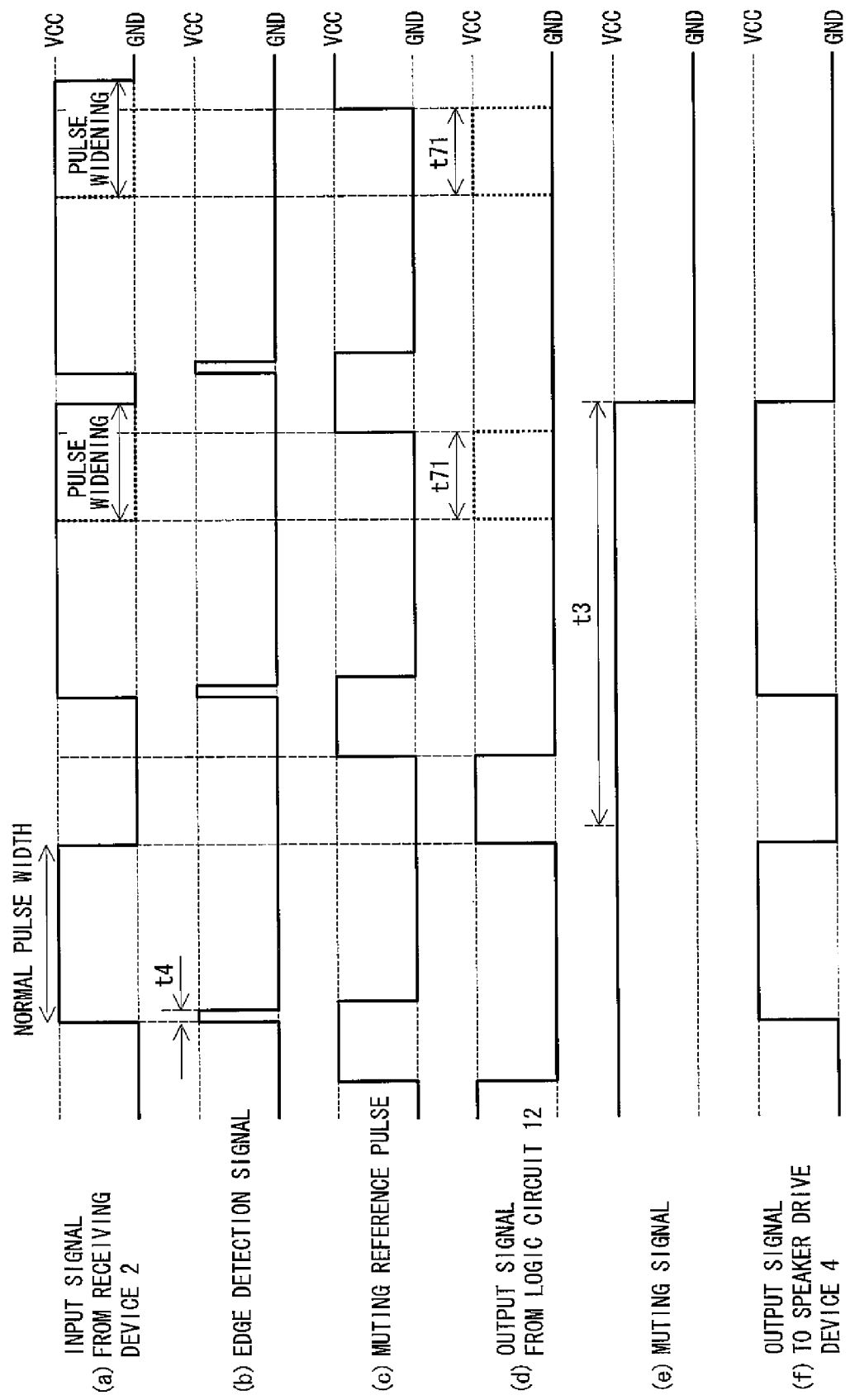
FIG. 17 is a timing chart specifically illustrating the principle of operation of the abnormal pulse detection circuit shown in FIG. 15 when pulse widening or a false pulse having the pulse width longer than a known pulse width occurs in an input signal, and shows the waveforms of the input signal, an edge detection signal, a muting reference pulse, an output signal supplied to a logic circuit, a muting signal, and an output signal supplied to a speaker driver.

The following will describe yet another embodiment of the present invention with reference to FIGS. 15 through 17. By the way, members having the same functions as those already described with reference to figures are given the same numbers, so that the descriptions are omitted for the sake of convenience.

FIG. 15 is a block diagram showing yet another example of the abnormal pulse detection circuit. Being similar to the abnormal pulse detection circuit 3a shown in FIG. 2, the abnormal pulse detection circuit 3b shown in FIG. 7, and the abnormal pulse detection circuit 3c shown in FIG. 12, the abnormal pulse detection circuit (abnormal pulse detection means) 3d shown in FIG. 15 is suitably used as the abnormal pulse detection circuit 3 in the optical receive shown in FIG. 1. The abnormal pulse detection circuit 3d shown in FIG. 15 receives a positive-logic digital signal as an input signal.

The abnormal pulse detection circuit 3d shown in FIG. 15 is an example suitable for detecting in the input signal an abnormal pulse whose pulse width is longer than a known pulse width.

The abnormal pulse detection circuit 3d shown in FIG. 15 is identical with the abnormal pulse detection circuit 3b shown in FIG. 7 except that the switching circuit 14 is replaced with a switching circuit (output stop means) 34 which is identical with the switching circuit 14 but the inverter I5 is not provided therein. One input terminal of the NAND circuit NA2 of the switching circuit 34 receives a muting signal supplied from the muting signal generation circuit 13. The other input terminal of the NAND circuit NA2 of the switching circuit 34 receives the input signal. The NAND circuit NA2 of the switching circuit 34 logically inverts by the inverter I6 a signal indicating a negative AND of the muting signal and the input signal and outputs the resultant signal to the speaker driver 4.

Referring to FIGS. 16 and 17, the following will specifically describe the principle of operation of the abnormal pulse detection circuit 3d.

FIG. 16 is a timing chart specifically illustrating the principle of operation of the abnormal pulse detection circuit 3d, when no variation in pulse width occurs in the input signal. FIG. 17 is a timing chart specifically illustrating the principle of operation of the abnormal pulse detection circuit 3d, when an abnormal pulse having a longer pulse width than a known pulse width has occurred.

In the timing charts shown in FIGS. 16 and 17, the horizontal axis indicates time (period) whereas the vertical axis indicates a voltage level of the one-bit data string, i.e., the high level (Vcc) or the low level (GND). The pulse width of a particular pulse of the one-bit data string is equal to a period in which the particular pulse outputs a high-level (or low-level) signal. In the timing charts of FIGS. 16 and 17, the graph (a) shows the waveform of the input signal, the graph (b) shows the waveform of the edge detection signal, the graph (c) shows the waveform of the muting reference pulse, the graph (d) shows the waveform of the output supplied to the logic circuit 22, the graph (e) shows the waveform of the muting signal, and the graph (f) shows the waveform of the output signal supplied to the speaker driver 4.

Referring to FIG. 16, the following first discusses the operation of the abnormal pulse detection circuit 3d when no variation in pulse width occurs in the input signal.

When no variation in pulse width occurs, the input signal has a normal pulse width shown in (a) in FIG. 16.

The input signal shown in (a) in FIG. 16 is supplied to the incoming pulse edge detection circuit 20. Receiving the input signal shown in (a) in FIG. 16, the incoming pulse edge detection circuit 20 generates an edge detection signal which is a pulse changed to the high level at the moment of rise of the input signal shown in (a) in FIG. 13 and has a predetermined pulse width t4 (see (b) in FIG. 16).

The edge detection signal generated by the incoming pulse edge detection circuit 20 is supplied to the muting reference pulse generation circuit 21. The muting reference pulse generation circuit 21 generates a negative-logic muting reference pulse from the supplied edge detection signal.

As discussed above, the pulse width t1 of the muting reference pulse is longer than a known pulse width but shorter than one cycle of the input signal. Therefore the muting reference pulse generated by the muting reference pulse generation circuit 21 has, for example, the waveform shown in (c) in FIG. 16.

The muting reference pulse shown in (c) in FIG. 16 and the input signal shown in (a) in FIG. 16 are supplied to the logic circuit 22. The logic circuit 22 outputs a signal indicating a negative OR of the muting reference pulse shown in (c) in FIG. 16 and the input signal shown in (a) in FIG. 16.

If no variation in pulse width has occurred in the input signal, each cycle of the input signal is provided with a period t7 in which both the muting reference pulse shown in (c) in FIG. 16 and the input signal shown in (a) in FIG. 16 are at the low level. Therefore the output signal of the logic circuit 22 is at the high level in the period t7, as shown in (d) in FIG. 16. In other words, the logic circuit 22 outputs a signal during the period t7.

The output signal of the logic circuit 22, which is shown in (d) in FIG. 16, is supplied to the muting signal generation circuit 13. The muting signal generation circuit 13 generates a muting signal from the output signal of the logic circuit 22.

The pulse width t3 of the muting signal generated by the muting signal generation circuit 13 is arranged so as to be more or less equivalent to the maximum cycle in which no pulse occurs in the input signal. That is to say, the pulse width t3 of the muting signal is arranged to be not shorter than one cycle of the input signal. Also, the muting signal generation circuit 13 generates a muting signal in each cycle of the input signal. As a result, the muting signal is kept at the high level as shown in (e) in FIG. 16.

The muting signal shown in (e) in FIG. 16 and the input signal shown in (a) in FIG. 16 are supplied to the switching circuit 34. The switching circuit 34 outputs a signal to the speaker driver 4, in the aforesaid manner.

The muting signal shown in (e) in FIG. 16 is kept at the high level as discussed above. For this reason, a signal input to one input terminal of the NAND circuit NA2 of the switching circuit 34 is kept at the high level.

Therefore the NAND circuit NA2 of the switching circuit 34 outputs a signal generated by logically inverting the signal having been input to the other input terminal, i.e. outputs the signal shown in (f) in FIG. 16.

As a result, the abnormal pulse detection circuit 3d outputs, to the speaker driver 4, the signal shown in (f) in FIG. 16, i.e. a signal having the same waveform as the input signal shown in (a) in FIG. 16. In other words, the abnormal pulse detection circuit 3d outputs the input signal shown in (a) in FIG. 16, without making any changes thereto.

Referring to FIG. 17, the following will discuss the operation of the abnormal pulse detection circuit 3d when an abnormal pulse having a longer pulse width than a known pulse width has occurred in the input signal.

In this case, on account of pulse widening, the input signal has a longer pulse width than a normal pulse width as shown in (a) in FIG. 17.

The input signal shown in (a) in FIG. 17 is supplied to the incoming pulse edge detection circuit 20. Receiving the input signal shown in (a) in FIG. 17, the incoming pulse edge detection circuit 20 generates an edge detection signal which is a pulse changed to the high level at the moment of rise of the input signal shown in (a) in FIG. 17 and has a predetermined pulse width t4 (see (b) in FIG. 17).

The edge detection signal generated by the incoming pulse edge detection circuit 20 is supplied to the muting reference pulse generation circuit 21. The muting reference pulse generation circuit 21 generates a negative-logic muting reference pulse from the edge detection signal (see (c) in FIG. 17).

The muting reference pulse shown in (c) in FIG. 17 and the input signal shown in (a) in FIG. 17 are supplied to the logic circuit 22. The logic circuit 22 outputs a signal indicating a negative OR of the muting reference pulse shown in (c) in FIG. 17 and the input signal shown in (a) in FIG. 17.

As shown in (a) in FIG. 17, the pulse width of the input signal is longer than a normal pulse width at a part where pulse widening has occurred. As a result, in the part where the pulse widening has occurred, the period in which both the muting reference pulse shown in (c) in FIG. 17 and the input signal shown in (a) in FIG. 17 are at the low level, i.e. a period equivalent to the period t7 shown in (d) in FIG. 16 is not provided. In short, the logic circuit 22 does not output a signal during a period t71 shown in (d) in FIG. 17.

The output signal of the logic circuit 22, which is shown in (d) in FIG. 17, is supplied to the muting signal generation circuit 13. The muting signal generation circuit 13 generates a muting signal from the output signal of the logic circuit 22.

The pulse width t3 of the muting signal generated by the muting signal generation circuit 13 is arranged to be more or less equivalent to the maximum cycle at which no pulse occurs in the input signal. The muting signal generation circuit 13, however, cannot generate the muting signal in the aforesaid part where there is no period in which both the muting reference pulse shown in (c) in FIG. 17 and the input signal shown in (a) in FIG. 17 are at the low level. As a result, the muting signal is changed from the high level to the low level at the same time as the output for the pulse width t3 finishes.

The muting signal shown in (e) in FIG. 17 and the input signal shown in (a) in FIG. 17 are supplied to the switching circuit 34. The switching circuit 34 outputs a signal to the speaker driver 4, in the aforesaid manner.

As a result, the abnormal pulse detection circuit 3d outputs, to the speaker driver 4, a signal generated by logically inverting by the inverter I6 a signal indicating a negative AND of the muting signal (e) in FIG. 17 and the input signal shown in (a) in FIG. 17, i.e. the abnormal pulse detection circuit 3d outputs the signal shown in (f) in FIG. 17 to the speaker driver 4.

As shown in (f) in FIG. 17, the output signal supplied to the speaker driver 4 is maintained at the low level while the muting signal supplied from the muting signal generation circuit 13 is maintained at the low level.

Since the input signal has originally been input as a positive-logic signal, substantially no signal is supplied from the receiving device 2 to the speaker driver 4, while the output signal supplied to the speaker driver 4 is maintained at the low level. In other words, the speaker driver 4 does not allow the speaker 5 to reproduce the input signal, i.e. the audio data, while the output signal supplied to the speaker driver 4 is maintained at the low level.

In this way, the abnormal pulse detection circuit 3d shown in FIG. 15 stops the reproduction of the input signal, i.e. the audio data, while an abnormal pulse having a longer pulse width than a known pulse width, such as pulse widening, has occurred.

It is noted that the abnormal pulse detection circuit 3 provided in the optical receiver 1 is not necessarily identical with any one of the abnormal pulse detection circuit 3a shown in FIG. 2, the abnormal pulse detection circuit 3b shown in FIG. 7, the abnormal pulse detection circuit 3c shown in FIG. 12, and the abnormal pulse detection circuit 3d shown in FIG. 15.

In other words, the circuitry of the abnormal pulse detection circuit 3 provided in the optical receiver 1 is not particularly limited, on condition that the aforesaid detection of a variation in pulse width is carried out by comparing audio data received by the optical receiver 1 and a muting reference pulse generated based on the audio data, and the external output of the received audio data is stopped for a predetermined period of time if a variation of pulse width is detected.

It is also noted that the optical receiver 1 is suitably used as a receiver in an electronic device which receives a transmitted optical signal in a wireless manner.

Comparative Example 2

Figure 31:
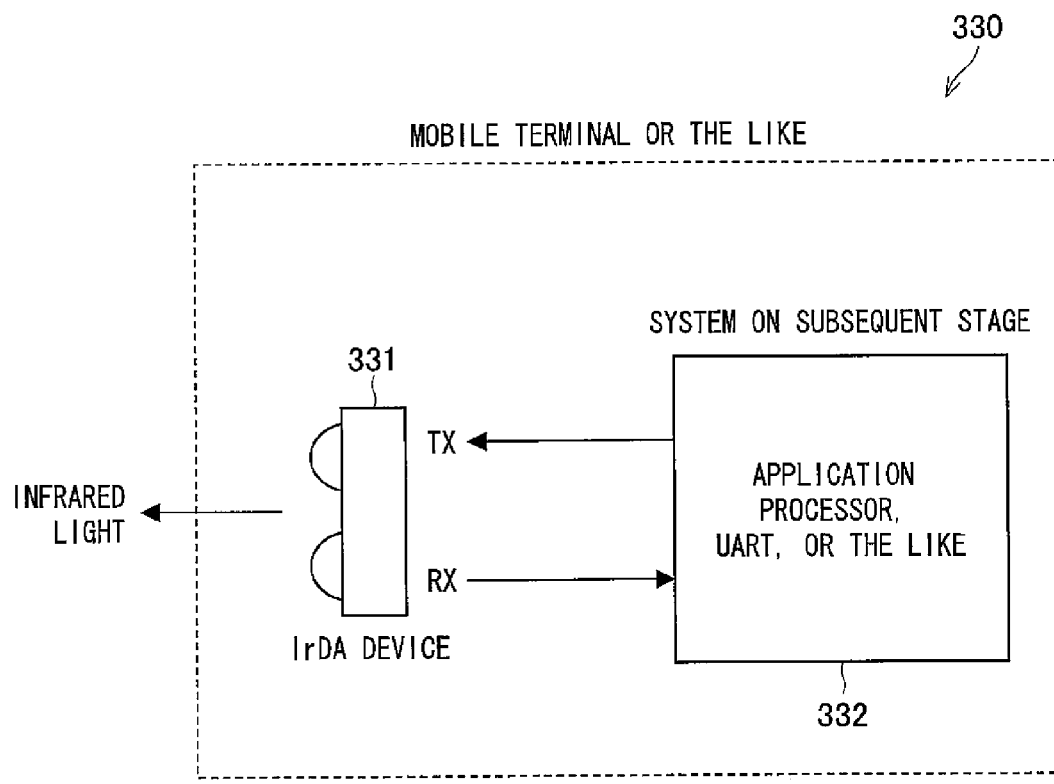
FIG. 31 relates to a comparative example 2 and is a block diagram showing an example of a typical connection arrangement of an electronic device including an IrDA communication device.
Figure 32:
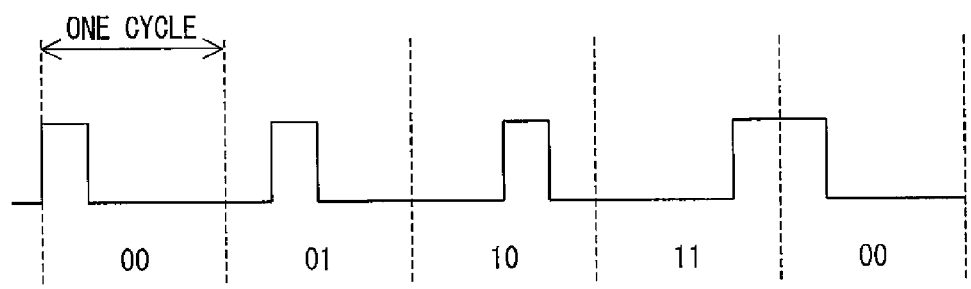
FIG. 32 shows an example of a pulse train in four-valued PPM.

As a comparative example 2, the following shows an example of a typical connection arrangement of an electronic device including an IrDA communication device, with reference to FIG. 31.

As shown in FIG. 31, an electronic device 330 includes an IrDA communication device (IrDA device) 331 as a receiver, and a control system (subsequent-stage system) 332 is connected as the subsequent stage. The control system 332 variously controls the IrDA communication device 331. Examples of the control system 332 include an application processor and a UART (Universal Asynchronous Receiver/Transmitter). It is noted that the sign "RX" in FIG. 31 indicates an optical signal that the IrDA communication device 331 acquires from the outside by infrared data communication, whereas the sign "TX" in FIG. 31 indicates a control signal by which the control system 332 controls the IrDA communication device 331.

In the electronic device 330 shown in FIG. 31, the IrDA communication device 331 has the aforesaid problem of variation in pulse width. That is to say, for example, assume that the aforesaid variation in pulse width occurs in a data string in which a pulse position is specified in units of two bits, in infrared data communication compliant with FIR. In such a case, an electronic device in which an infrared communication device is provided as a receiver may confuse a single pulse with a double pulse. With such confusion, the electronic device is hardly possible to correctly receive data. Therefore such an electronic device is required to discern a single pulse from a double pulse.

In this regard, the following will describe, as a receiver of the present invention, a receiver which performs data transmission by using an optical signal with two types of known pulse widths and in which a possibility of outputting an erroneous signal to the outside is reduced.

Embodiment 5

The following will describe an embodiment of the present invention with reference to FIGS. 19 through 30.

FIG. 19 is a block diagram showing another receiver of the present invention.

The optical receiver (receiver) 201 shown in FIG. 19 is arranged to include a receiving device 211 and a pulse width monitoring device (pulse width variation monitoring means) 212. The stage connected subsequent to the pulse width monitoring device 212 is, for example, a control system (not illustrated) such as an application processor and a UART.

The receiving device 211 receives a signal from, for example, a transmitter (not illustrated) and outputs the signal to the pulse width monitoring device 212.

As the receiving device 211, for example, an IrDA communication device compliant with FIR of IrDA is suitably used. In case where the receiving device 211 is an IrDA communication device, the signal that the receiving device 211 receives is, for example, an optical signal having been modulated by four-valued PPM.

It is noted that devices suitably used as the receiving device 211 are not limited to the above. Any type of devices may be adopted as the receiving device 211 on condition that the device can receive an optical signal as a digital signal which is a pulse train having known pulse widths and constituted by two types of pulses with different pulse widths. An example of such a receiving device 211 is a device receiving an optical signal having been modulated by 16-valued PPM.

The pulse width monitoring device 212 carries out the following process based on a signal supplied from the receiving device 211.

Based on a signal supplied from the receiving device 211, the pulse width monitoring device 212 generates two types of reference digital signals, which are a first reference digital signal and a second reference digital signal, and compares these reference digital signals with one another. Then the pulse width monitoring device 212 detects a variation in pulse width occurring in the signal supplied from the receiving device 211, with reference to the result of the comparison. When a variation in pulse width is detected, the pulse width monitoring device 212 stops an external input to the circuit of the subsequent stage, e.g. the control system. Details regarding the pulse width monitoring device 212 will be given later.

When no variation in pulse width is detected in the signal supplied from the receiving device 211, the pulse width monitoring device 212 outputs the signal supplied from the receiving device 211 to the circuit on the subsequent stage, without making any changes to the signal.

Figure 20:
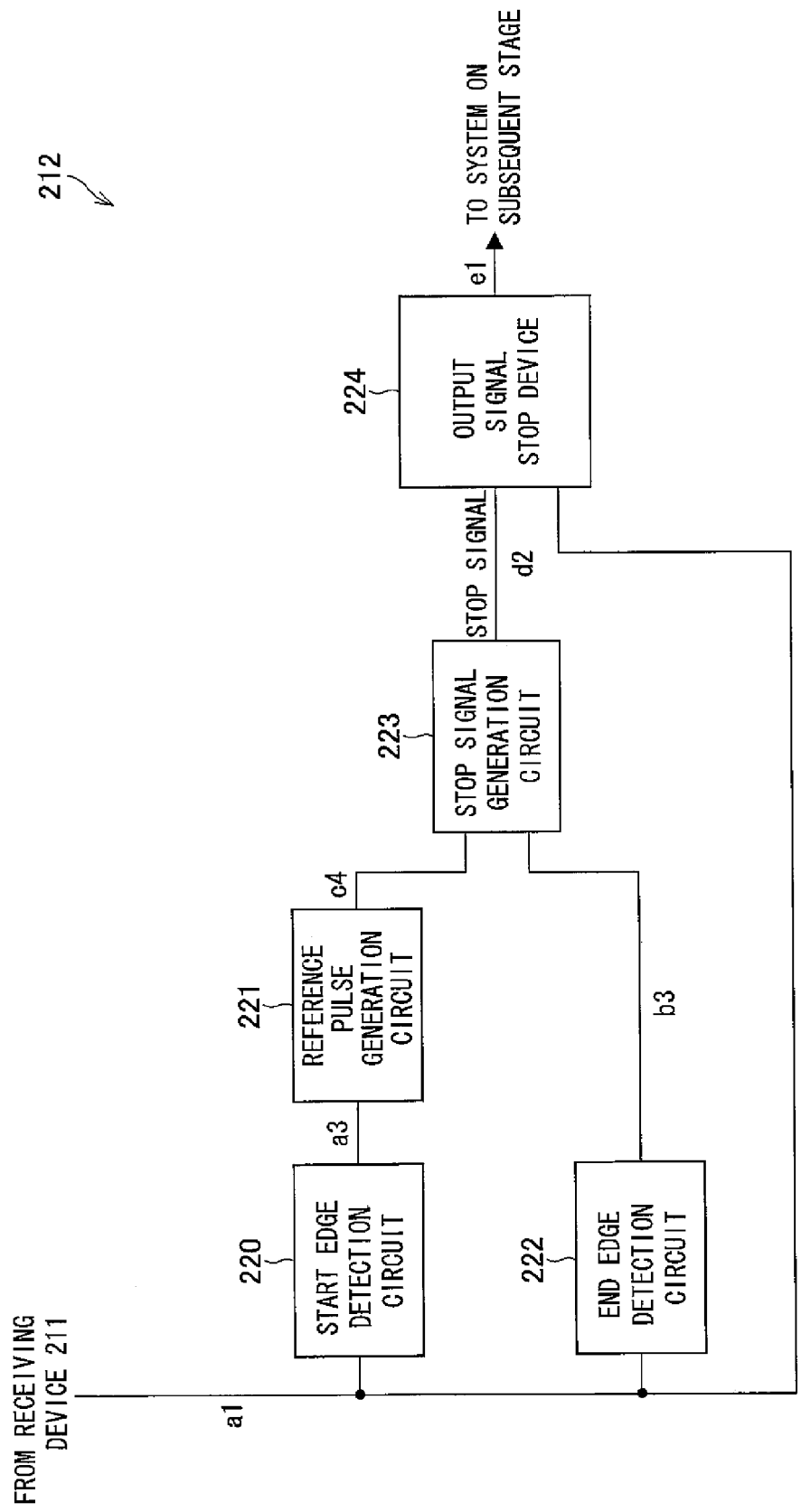
FIG. 20 is a block diagram showing a pulse width monitoring device of the present invention, in case where a signal of negative logic is input.

The following will discuss the pulse width monitoring device 212 of the present invention, with reference to FIG. 20.

The pulse width monitoring device 212 of the present invention receives a digital signal which is a pulse train with known pulse widths and is a pulse train constituted by two types of pulses having different pulse widths, i.e. the pulse width monitoring device 212 receives the below-mentioned input signal a1. In the present embodiment, for the sake of suitably describing the present invention, among the two types of pulses the pulse with the shorter pulse width is termed first pulse whereas the pulse with the longer pulse width is termed second pulse. The first and second pulses are both pulses with known pulse widths but the pulse width of the second pulse is longer than the pulse width of the first pulse. When the pulse width monitoring device 212 of the present invention receives a signal from an IrDA communication device compliant with FIR of IrDA, a single pulse corresponds to the first pulse and a double pulse corresponds to the second pulse.

The present embodiment assumes, as an example, that a single cycle of the input signal a1 is 500 (nsec), a period corresponding to the pulse width of the first pulse is 125 (nsec), and a period corresponding to the pulse width of the second pulse is 250 (nsec).

The present embodiment also assumes that the input signal a1 is a negative-logic signal.

FIG. 20 is a block diagram showing the pulse width monitoring device 212.

The pulse width monitoring device 212 shown in FIG. 20 includes a start edge detection circuit (start edge detection means) 220, a reference pulse generation circuit (first reference digital signal generation means) 221, an end edge detection circuit (second reference digital signal generation means) 222, a stop signal generation circuit (stop signal generation means) 223, and an output signal stop device 224.

The start edge detection circuit 220 receives the input signal a1 from the receiving device 211. Then the start edge detection circuit 220 generates an edge detection signal a3 by which the falling edge of the input signal a1 is detected, and outputs the generated edge detection signal a3 to the reference pulse generation circuit 221. The falling edge of the signal indicates the moment at which a pulse of the signal falls.

The reference pulse generation circuit 221 is provided on the stage directly subsequent to the start edge detection circuit 220. This reference pulse generation circuit 221 generates a reference pulse (first reference digital signal) c4 based on the edge detection signal a3 and outputs the generated reference pulse c4 to the stop signal generation circuit 223.

The end edge detection circuit 222 is provided in parallel to the start edge detection circuit 220, and receives the input signal a1 along with the start edge detection circuit 220. The end edge detection circuit 222 generates an edge detection signal b3 by which the rising edge of the input signal a1 is detected, and outputs the generated edge detection signal b3 to the stop signal generation circuit 223. This edge detection signal b3 is a second reference digital signal in the present invention. The rising edge of a signal indicates the moment of rise of a pulse in the signal.

The stop signal generation circuit 223 is provided on the stage subsequent to the reference pulse generation circuit 221 and the end edge detection circuit 222. This stop signal generation circuit 223 generates a stop signal d2 based on the reference pulse c4 and the edge detection signal b3, i.e. by comparing the reference pulse c4 with the edge detection signal b3, and then outputs the generated stop signal d2 to the output signal stop device 224.

The output signal stop device 224 receives the input signal a1, along with the start edge detection circuit 220 and the end edge detection circuit 222. Also, as discussed above, the output signal stop device 224 receives the stop signal d2 generated by the stop signal generation circuit 223. In accordance with the stop signal d2, the output signal stop device 224 performs switch-over between (i) the state in which the input signal a1 is output to the circuit of the subsequent stage without making any changes to the signal and (ii) the state in which the output of the input signal a1 to that circuit of the subsequent stage is stopped for a predetermined period of time. In the present case, a signal output from the output signal stop device 224 is termed e1.

Now the following will give details of the members constituting the pulse width monitoring device 212 and the operations thereof, with reference to FIG. 21 through FIG. 28.

FIG. 21 is a circuit diagram showing an example of the start edge detection circuit 220, and is a graph showing the waveform of a signal passing through the start edge detection circuit 220. In each of the graphs (b) through (d) in FIG. 21, the vertical axis indicates the level of a signal whereas the horizontal axis indicates time.

As shown in (a) in FIG. 21, the start edge detection circuit 220 includes a capacitor 231, a resistor 232, and an inverter 233. One terminal of the capacitor 231 is connected to the receiving device 211. The other terminal of the capacitor 231 is connected to the input terminal of the inverter 233. The output terminal of the inverter 233 is connected to the reference pulse generation circuit 221. One terminal of the resistor 232 is connected to the connection point 234 provided between the other terminal of the capacitor 231 and the input terminal of the inverter 233, whereas the other terminal of the resistor 232 is connected to the drive voltage source (not illustrated; see power source voltage in FIG. 21).

The capacitor 231 and the resistor 232 of the start edge detection circuit 220 forms a typical differentiation circuit. The input signal a1 having the waveform shown in (b) in FIG. 21 has a significantly high frequency component at the moments of rise and fall of a pulse. Therefore the voltage at the connection point 234 rapidly changes from the high level to the low level on account of the differentiation by the capacitor 231 and the resistor 232, at the moment of fall of the input signal a1.

Thereafter the input signal a1 is constantly kept at the low level. The voltage at the connection point 234 therefore gradually increases from the low level to the high level.

In the meanwhile, at the moment of rise of the input signal a1, the voltage at the connection point 234 rapidly changes to a voltage exceeding the high level, on account of the aforesaid differentiation. At this moment, the voltage exceeding the high level appears at the connection point 234, but the input signal a1 is constantly kept at the high level. The voltage at the connection point 234 therefore gradually decreases from the voltage exceeding the high level to the high level.

As a result of the operation above, the input signal a1 is converted to a signal a2 having the waveform shown in (c) in FIG. 21, at the connection point 234.

The signal a2 is output via the inverter 233 so that the start edge detection circuit 220 outputs an edge detection signal a3 having the waveform shown in (d) in FIG. 21. That is to say, the inverter 233 compares the signal a2 with a predetermined threshold (typically a voltage value not lower than the low level and not higher than the high level) that the inverter 233 has. The inverter 233 outputs the low level if the level of the signal a2 is not lower than the threshold, or outputs the high level if the level of the signal a2 is lower than the threshold. As a result, the start edge detection circuit 220 outputs the signal a2 via the inverter 233 so as to generate and output the edge detection signal a3 having the waveform shown in (d) in FIG. 21.

The start edge detection circuit 220 outputs the generated edge detection signal a3 to the reference pulse generation circuit 221.

This edge detection signal a3 is a signal whose voltage increases from the low level to the high level slightly after the moment of fall of the input signal a1. This delay time, which can be faintly adjusted in accordance with the electrostatic capacity of the capacitor 231 and the resistance of the resistor 232, is about 5 (nsec).

FIG. 22 is a block diagram showing an example of the reference pulse generation circuit 221, and is a graph showing the waveform of a signal passing through the reference pulse generation circuit 221. In each of the graphs (b)-(e) in FIG. 22, the vertical axis indicates the level of a signal whereas the horizontal axis indicates time.

The reference pulse generation circuit 221 is arranged such that the outputs of parallel one-shot circuits 241 and 242 are connected to the respective input terminals of an EXOR (exclusive OR) circuit 243. The output terminal of the EXOR (exclusive OR) circuit 243 is connected to the stop signal generation circuit 223.

The edge detection signal a3, which has been input to the reference pulse generation circuit 221 and has the waveform shown in (b) in FIG. 22, is supplied to the one-shot circuits 241 and 242. The one-shot circuit 241 generates and outputs a pulse signal (first reference pulse) c2 which is changed to the high level immediately after the rise of the edge detection signal a3, is at the high level during a period t241, and has the waveform shown in (c) in FIG. 22. The one-shot circuit 242 generates and outputs a pulse signal (second reference pulse) c3 which is changed to the high level immediately after the rise of the edge detection signal a3, is at the high level during a period t242, and has the waveform shown in (d) in FIG. 22. The period t241 is different from the period t242.

The pulse signal c2 output from the one-shot circuit 241 and the pulse signal c3 output from the one-shot circuit 242 are input into the EXOR circuit 243. The EXOR circuit 243 generates, as a reference pulse c4, a pulse signal which indicates an exclusive OR of the pulse signal c2 and the pulse signal c3 and has the waveform shown in (e) in FIG. 22. The EXOR circuit 243 then outputs the generated signal to the stop signal generation circuit 223.

Now an example of an arrangement of a one-shot circuit is discussed with reference to FIGS. 23 through 25.

Figure 23:
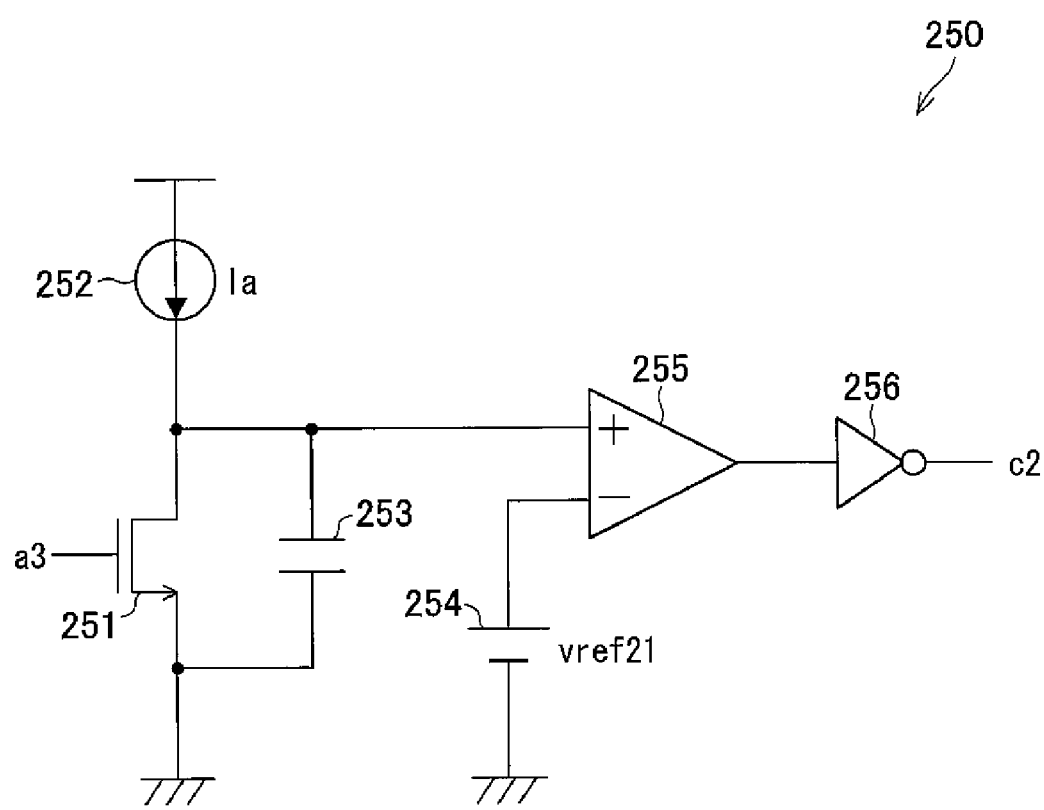
FIG. 23 is a circuit diagram of a one-shot circuit which is preferably used in the present invention.

FIG. 23 is a circuit diagram showing a one-shot circuit suitably used in the one-shot circuit of the present invention.

The one-shot circuit 250 shown in FIG. 23 is a so-called mono-stable multi-vibrator circuit including a transistor 251, a current source 252, a capacitor 253, a reference voltage source 254, a comparator 255, and an inverter 256. The base terminal of the transistor 251 is connected to the output terminal of the inverter 233 (see FIG. 21) of the start edge detection circuit 220. The collector terminal of the transistor 251 is connected to the current source 252. The emitter terminal of the transistor 251 is grounded. Between the collector terminal of the transistor 251 and the current source 252, the noninverting input terminal of the comparator 255 is provided. One terminal of the capacitor 253 is connected to the collector terminal of the transistor 251, whereas the other terminal of the capacitor 253 is connected to the emitter terminal of the transistor 251. The positive-side terminal of the reference voltage source 254 is connected to the inverting input terminal of the comparator 255, whereas the negative-side terminal of the reference voltage source 254 is grounded. The output terminal of the comparator 255 is connected to the input terminal of the inverter 256. The output terminal of the inverter 256 is connected to the input terminal of the EXOR circuit 243 (see FIG. 22).

When the base terminal of the transistor 251 receives a pulse signal (e.g. the edge detection signal a3 in the case of the one-shot circuit 241), the transistor 251 is turned on only while the signal thus input is at the high level. At this stage, the capacitor 253 releases the accumulated electric charge via the transistor 251. Also at this stage, the power source line to which the capacitor 253 is connected is at the ground level, and hence the voltage applied to the noninverting input terminal of the comparator 255 is zero. In the meanwhile, the inverting input terminal of the comparator 255 receives a reference voltage vref21 from the reference voltage source 254. As a result, the voltage on the noninverting input terminal of the comparator 255 is lower than the voltage on the inverting input terminal of the comparator 255, and hence the comparator 255 outputs the low level.

Subsequently, when the signal input to the base terminal of the transistor 251 changes from the high level to the low level, the transistor 251 is turned off. At this stage, the collector terminal of the transistor 251 receives a current from the current source 252. Because of this, the capacitor 253 is charged by the current source 252. Also at this stage, the voltage of the power source line to which the capacitor 253 is connected gradually increases, so that the voltage applied to the noninverting input terminal of the comparator 255 gradually increases. When the voltage applied to the noninverting input terminal of the comparator 255 becomes not lower than the reference voltage vref21, the output of the comparator 255 changes to the high level.

The period t during which the output of the comparator 255 is at the low level can be determined by the following numerical expression (3).

$$t = (C \cdot vref21)/Ia \text{(nanoseconds)} \quad (3)$$

(In the numerical expression, C indicates the electrostatic capacity of the capacitor 253, vref21 indicates the reference voltage supplied from the reference voltage source 254, and Ia indicates the current supplied to the collector terminal of the transistor 251.)

The output of the comparator 255 obtained as a result of the above is output via the inverter 256. For example, in the case of the one-shot circuit 241, the signal output from the inverter 256 is a signal c2 shown in (b) in FIG. 22.

As a result, based on the pulse signal supplied to the base terminal of the transistor 251, the one-shot circuit 250 generates a pulse signal which is changed to the high level immediately after the rise of the pulse signal supplied to the base terminal of the transistor 251 and which is at the high level during the period t.

In case where this one-shot circuit 250 is adopted as the one-shot circuit 241 shown in (a) in FIG. 22, the aforesaid period t is equivalent to a period t241 during which the pulse signal c2 output from the one-shot circuit 241 is at the high level. In case where the one-shot circuit 250 is adopted as the one-shot circuit 242 shown in (a) in FIG. 22, the aforesaid period t is equivalent to a period t242 during which the pulse signal c3 output from the one-shot circuit 242 is at the high level. When the one-shot circuit 250 is used as a below-mentioned one-shot circuit 291 shown in FIG. 27, the aforesaid period t is equivalent to a period t23 during which the stop signal d2 output from the one-shot circuit 291 is at the high level.

Figure 24:
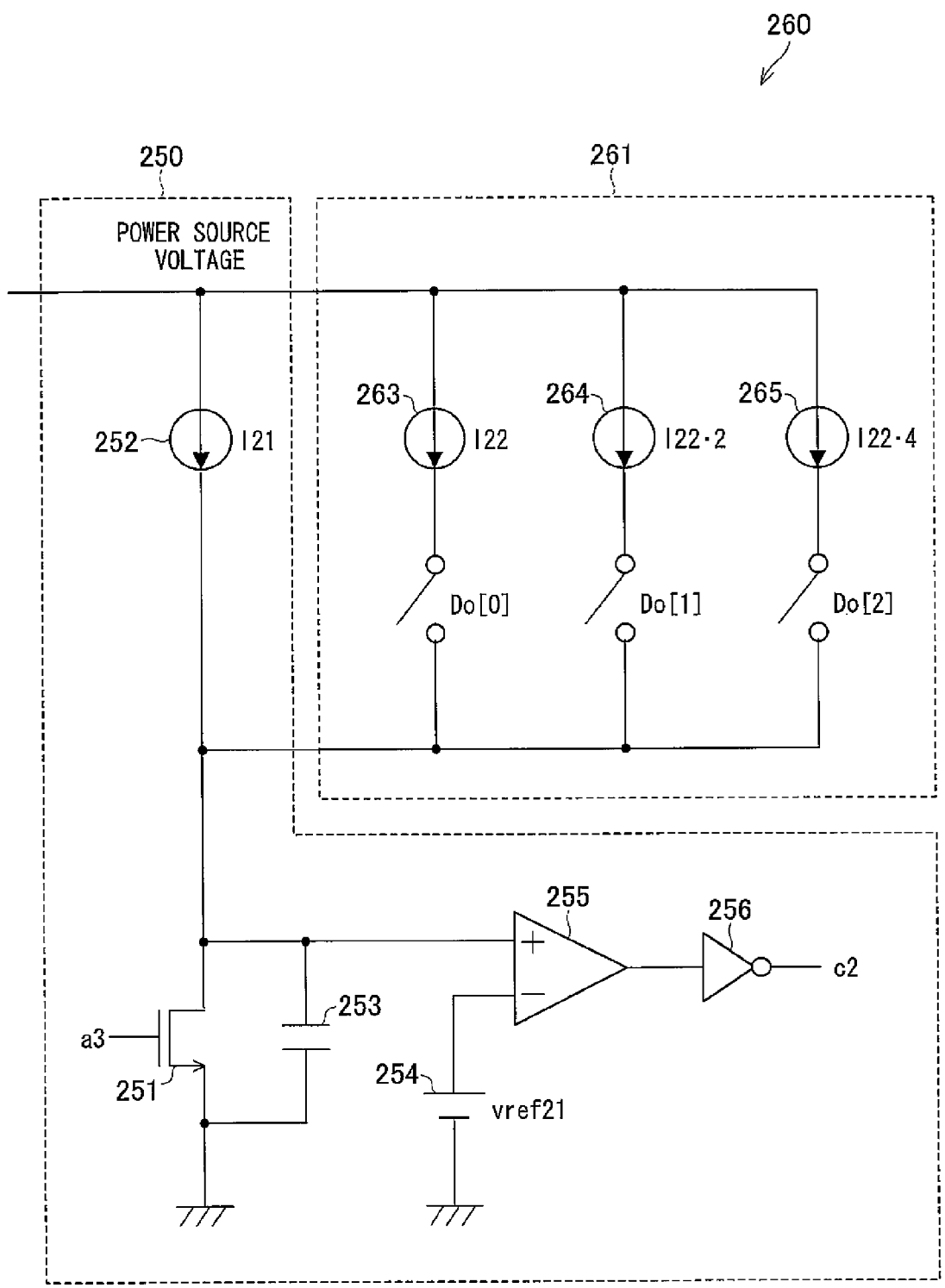
FIG. 24 is a circuit diagram of another one-shot circuit which is preferably used in the present invention.

FIG. 24 is a circuit diagram showing another arrangement of the one-shot circuit suitably used in the present invention.

The one-shot circuit 260 shown in FIG. 24 is identical with the one-shot circuit 250 shown in FIG. 23 except that a trimming circuit (variable current supplying means) 261 is further provided.

As shown in FIG. 24, the trimming circuit 261 is arranged such that a series circuit formed by a current source 263 and a switch Do[0], a series circuit formed by a current source 264 and a switch Do[1], and a series circuit formed by a current source 265 and a switch Do[2] are connected in parallel to one another so as to form a circuit, and this circuit connects one terminal of the current source 252 with the other terminal of the current source 252. Each of the series circuit formed by the current source 263 and the switch Do[0], the series circuit formed by the current source 264 and the switch Do[1], and the series circuit formed by the current source 265 and the switch Do[2] is arranged such that the switch side is connected to the collector terminal of the transistor 251 whereas the current source side is connected to a drive voltage source (not illustrated; see power source voltage in FIG. 24).

The currents supplied from the current sources 263 through 265 relate one another as follows.

(current of current source 264)=(current of current source 263)·2

(current of current source 265)=(current of current source 263)·4

In the one-shot circuit 260, the current supplied to the collector terminal of the transistor 251 can be optionally determined by switching on/off the switches Do[0] through Do[2] connected in series with the current sources 263 through 265.

This allows the one-shot circuit 260 to control, without design change, the period t during which the output of the comparator 255 is at the low level, by suitably changing the current supplied to the collector terminal of the transistor 251. It is therefore possible to realize a flexible system design.

In the one-shot circuit 260, the period t' during which output of the comparator 255 is at the low level can be determined by the following numerical expression (4), assuming that the current from the current source 252 is I21 and the current from the current source 263 is I22.

$$t'=(C \cdot vref21)/(I21+n \cdot I22)(\text{nanoseconds}) \quad (4)$$

That is, in the case above, the switching of the switches Do[0] through Do[2] indicates a change in the variable "n" in the numerical expression (4).

In the one-shot circuit 260 shown in FIG. 24, the current sources are the aforesaid current sources 263-265 whose currents have the aforesaid relationship, and hence the current supplied to the collector terminal of the transistor 251 is controlled as an eight-valued (3-bit) variable. The present invention, however, is not limited to this arrangement. That is to say, in a circuit equivalent to the one-shot circuit 260 shown in FIG. 24, a current supplied to a collector terminal of a transistor equivalent to the transistor 251 of the one-shot circuit 260 may be controlled as a non-eight-valued variable. It is noted that, as the number of levels of the variable increases, a one-shot circuit equivalent to that shown in FIG. 24 can more minutely set a period in which the reference pulse generated by the circuit is at the high level.

Figure 25:
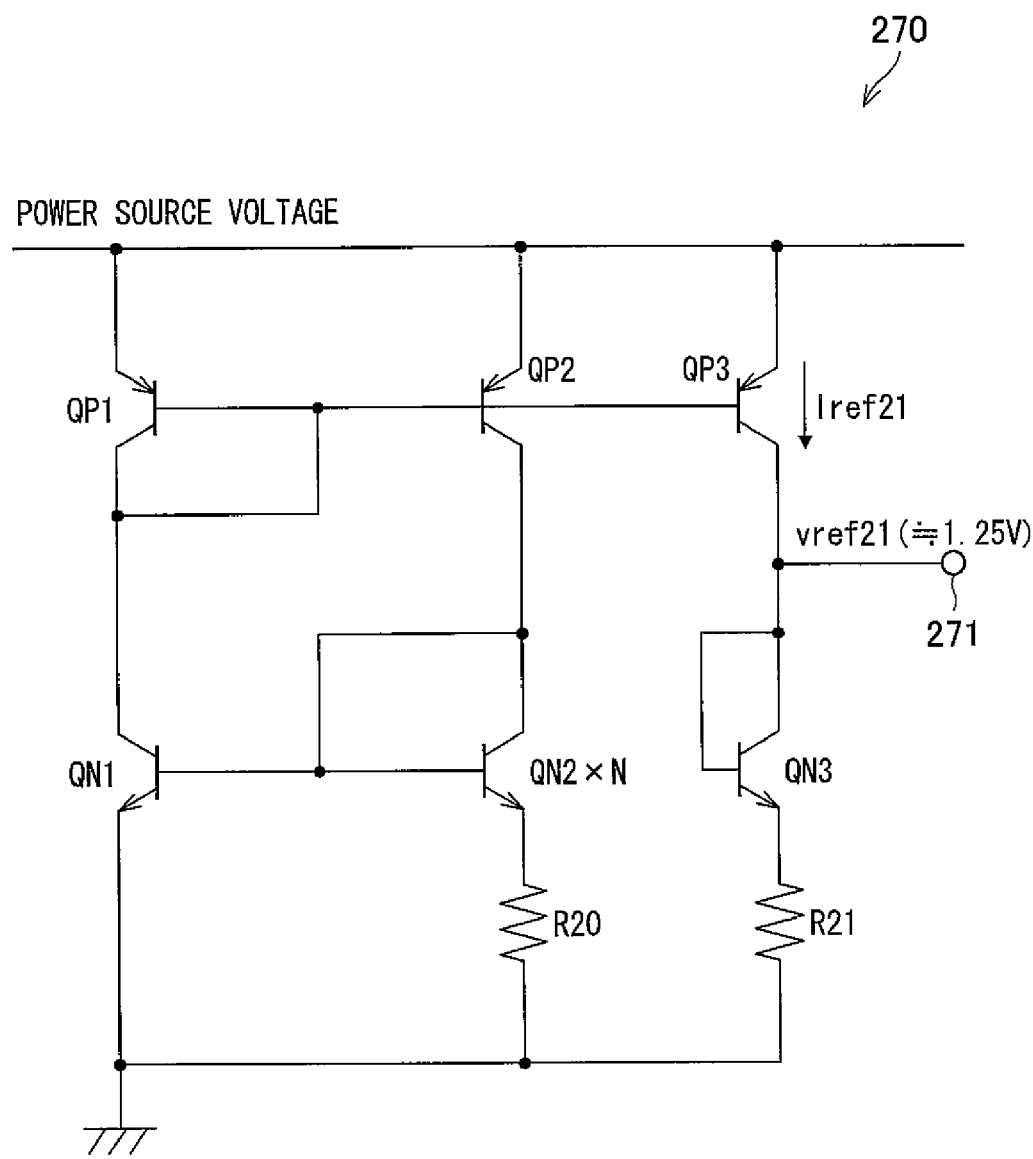
FIG. 25 is a circuit diagram of a band gap voltage source which is preferably used in the present invention.

FIG. 25 is a circuit diagram of a band gap voltage source suitable used in the present invention.

The band gap voltage source 270 shown in FIG. 25 outputs a reference voltage vref21 as the reference voltage source 254 of the one-shot circuit 250 shown in FIG. 23 and the one-shot circuit 260 shown in FIG. 24. Using the band gap voltage source 270 as the reference voltage source 254, it is possible to generate a voltage of about 1.25V as the reference voltage vref21, regardless of temperature changes.

The band gap voltage source 270 shown in FIG. 25 is provided with PNP MOS (Metal Oxide Semiconductor) field effect transistors QP1-QP3. The base terminal of the transistor QP1, the base terminal of the transistor QP2, and the base terminal of the transistor QP3 are connected to one another. The emitter terminals of the transistors QP1-QP3 are connected to the power source line. The base terminal of the transistor QP1 is further connected to the collector terminal of the transistor QP1.

The band gap voltage source 270 shown in FIG. 25 is further provided with NPN MOS field effect transistors QN1 and QN2. The base terminal of the transistor QN1 and the base terminal of the transistor QN2 are connected to each other. The emitter terminal of the transistor QN1 is grounded. The emitter terminal of the transistor QN2 is grounded via the resistor R20. The base terminal of the transistor QN2 is further connected to the collector terminal of the transistor QN2.

The band gap voltage source 270 shown in FIG. 25 is further provided with an NPN MOS field effect transistor QN3. The collector terminal of the transistor QN3 is connected to the collector terminal of the transistor QP3. The collector terminal of the transistor QN3 is further connected to the base terminal of the transistor QN3. The emitter terminal of the transistor QN3 is grounded via the resistor R21.

In the band gap voltage source 270 shown in FIG. 25, furthermore, an output terminal 271 is provided between the collector terminal of the transistor QP3 and the collector terminal of the transistor QN3. This output terminal 271 corresponds to the positive-side terminal of the reference voltage source 254 in the one-shot circuit 250 shown in FIG. 23 or the one-shot circuit 260 shown in FIG. 24.

It is typically easy to generate a PTAT (proportional to absolute temperature) current by using a monolithic IC.

The PTAT current Iref21 is represented by the following numerical expressions (5) and (6).

$$Iref21=Vt \cdot (\ln N)/R20 \quad (5)$$

$$Vt=k \cdot T/q \quad (6)$$

(In the numerical expressions, k indicates a Boltzmann constant, T indicates an absolute temperature, q indicates an elementary charge of an electron, and N indicates the size ratio between the transistors QP1 and QN1 and the transistors QP2 and QN2.)

Assuming that the reference voltage vref21 is calculated by vref21=R21·Iref21+Vbe, the reference voltage vref21 is represented by the following numerical expression (7).

$$vref21=R21 Vt \cdot (\ln N)/R20+Vbe \quad (7)$$

The temperature coefficient is represented by the following numerical expressions (8) through (11).

$$(\partial vref21/\partial T)=\{R21 \cdot Vt \cdot (\ln N)/R20\}/T+(\partial Vbe/\partial T) \quad (8)$$

$$(\partial vref21/\partial T)/vref21=A \cdot (1/T)+B(\partial Vbe/\partial T)/Vbe \quad (9)$$

$$A=\{R21 \cdot Vt \cdot (\ln N)/R20\}/vref21 \quad (10)$$

$$B=Vbe/vref21 \quad (11)$$

In the numerical expression (9), (1/T) is positive whereas (∂Vbe/∂T)/Vbe is negative. Therefore it is possible to bring the temperature coefficient to be close to zero by adjusting A by the numerical expression (10) and adjusting B by the numerical expression (11).

When the temperature coefficient is asymptotic to zero, the reference voltage vref21 is about 1.25V. This reference voltage vref21 is used as a reference voltage of the one-shot-circuits of the present invention.

With the arrangement above, when the aforesaid band gap voltage source is adopted as the reference voltage source, it is possible to set the reference voltage regardless of the power source voltage and temperatures, and hence it is possible to restrain a variation in pulse width in the reference pulse due to a change in the environment in which the receiver of the present invention is used.

FIG. 26 is a circuit diagram showing an example of the end edge detection circuit 222 and a graph showing the waveform of a signal passing through the end edge detection circuit 222. In each of the graphs (b) through (d) in FIG. 26, the vertical axis indicates the level of a signal whereas the horizontal axis indicates time.

As shown in (a) in FIG. 26, the end edge detection circuit 222 is identical with the start edge detection circuit 220 shown in (a) in FIG. 21 except that the other terminal of the resistor 232 is grounded. The other terminal of the resistor 232 is not connected to the drive voltage source. Also, as the stage subsequent to the inverter 233, an inverter 235 is further provided. In the end edge detection circuit 222 shown in (a) in FIG. 26, one terminal of the capacitor 231 is connected to the receiving device 211, the output terminal of the inverter 233 is connected to the input terminal of the inverter 235, and the output terminal of the inverter 235 is connected to the stop signal generation circuit 223.

Being similar to the start edge detection circuit 220, the end edge detection circuit 222 receives an input signal a1 (see (b) in FIG. 26). although the operation of the end edge detection circuit 222 is similar to that of the start edge detection circuit 220, the connection point 234 of the end edge detection circuit 222 is normally kept at the ground level, i.e. the low level, because the other terminal of the resistor 232 is grounded. For this reason, the signal b2 obtained at the connection point 234 has the waveform shown in (c) in FIG. 26. The signal shown in (c) in FIG. 26 is output through the inverter 233 and the inverter 235 so that the signal b2 is logically inverted twice. As a result the end edge detection circuit 222 outputs an edge detection signal b3 with the waveform shown in (d) in FIG. 26. The end edge detection circuit 222 supplies the edge detection signal b3 to the stop signal generation circuit 223.

The aforesaid edge detection signal b3 is a signal whose voltage increases from the low level to the high level slightly after the moment of rise of the input signal a1. This delay time, which can be faintly adjusted in accordance with the electrostatic capacity of the capacitor 231 and the resistance of the resistor 232, is about 5 (nsec).

Figure 27:
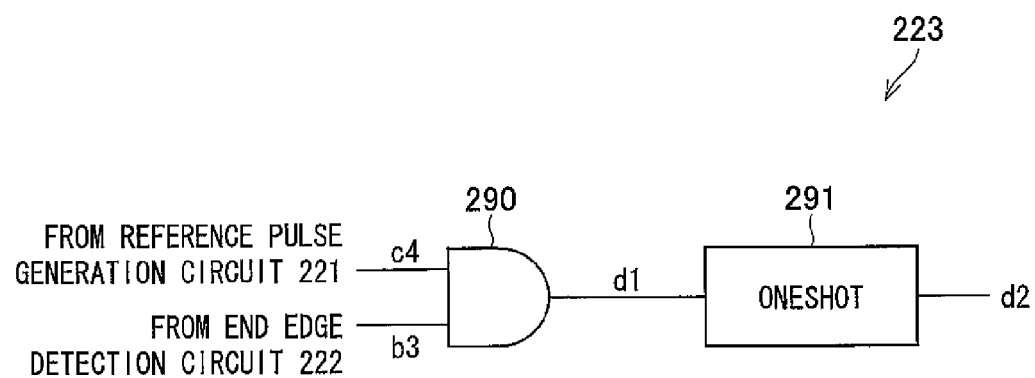
FIG. 27 is a circuit diagram showing an example of a stop signal generation circuit of the present invention.

FIG. 27 is a circuit diagram showing an example of the stop signal generation circuit 223.

The stop signal generation circuit 223 shown in FIG. 27 is arranged to include an AND circuit 290 and a one-shot circuit 291.

The AND circuit 290 is arranged such that one input terminal is connected to the output of the reference pulse generation circuit 221, the other input terminal is connected to the output of the end edge detection circuit 222, and the output terminal is connected to the one-shot circuit 291. Receiving the reference pulse c4 output from the reference pulse generation circuit 221 and the edge detection signal b3 output from the end edge detection circuit 222, the AND circuit 290 generates a signal d1 indicating an AND of these signals and outputs the generated signal to the one-shot circuit 291.

Figure 29:
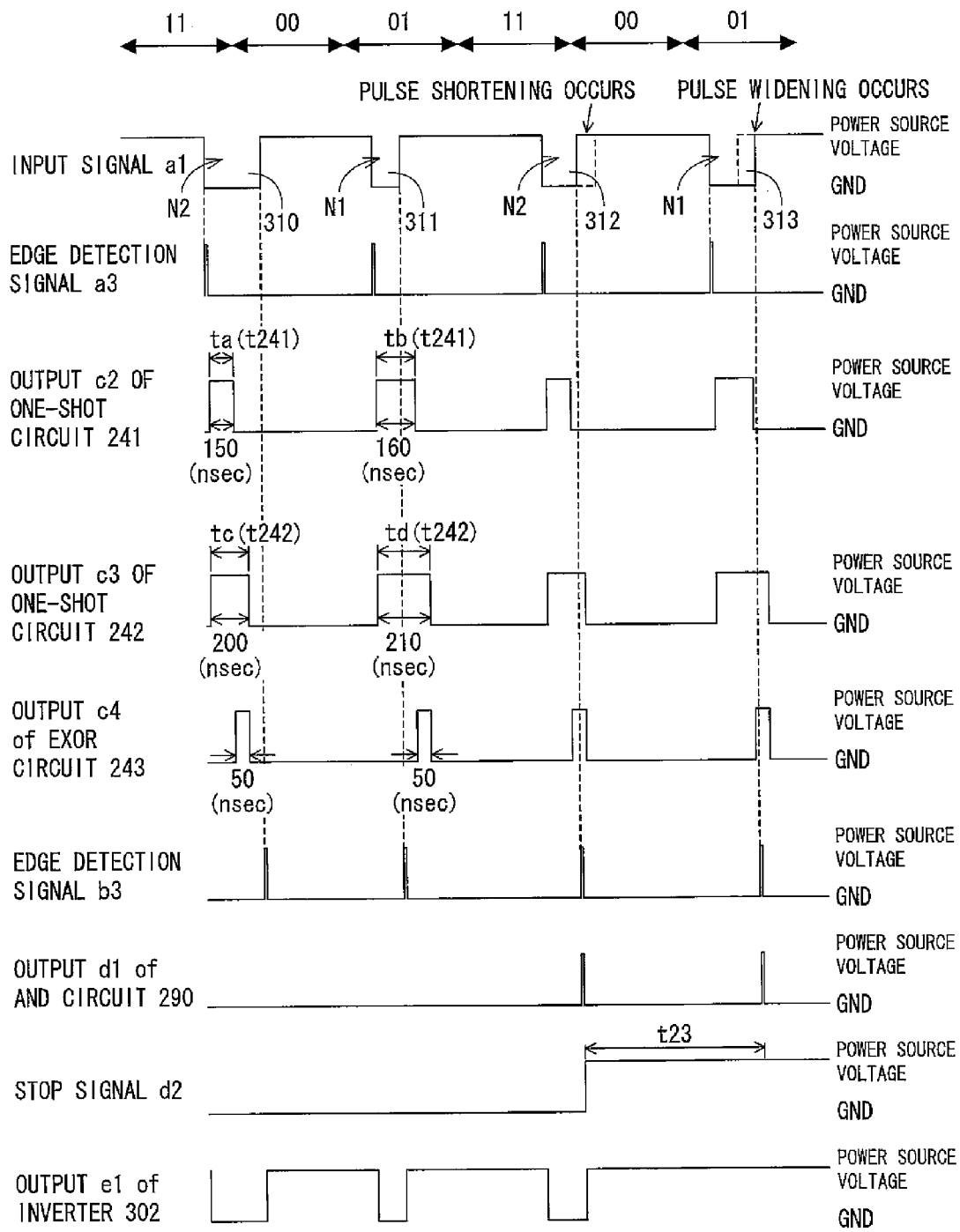
FIG. 29 is a timing chart for specifically illustrating the principle of operation of a pulse width monitoring device of the present invention.

The one-shot circuit 291 has a circuitry identical with those of, for example, the one-shot circuit 250 shown in FIG. 23 and the one-shot circuit 260 shown in FIG. 24. As a matter of course, the one-shot circuit 291 may include the band gap voltage source 270. Therefore details of the one-shot circuit 291 are not given here. The one-shot circuit 291 generates a stop signal d2 which is a pulse changed to the high level immediately after the rise of the signal d1 supplied from the AND circuit 290 and is at the high level during a period t23. The waveform of the stop signal d2 is indicated in FIG. 29. The one-shot circuit 291 outputs the stop signal d2 to the output signal stop device 224.

Figure 28:
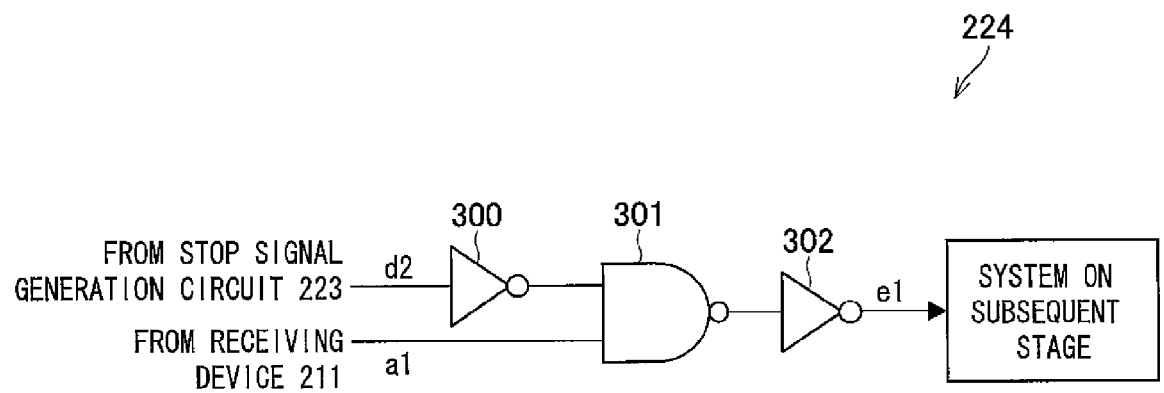
FIG. 28 is a circuit diagram showing an example of a output signal stop device of the present invention.

FIG. 28 is a circuit diagram showing an example of the output signal stop device 224.

The output signal stop device 224 shown in FIG. 28 is arranged to include an inverter 300, a NAND (negative AND) circuit 301, and an inverter 302.

The input terminal of the inverter 300 is connected to the output of the stop signal generation circuit 223. The output terminal of the inverter 300 is connected to one input terminal of the NAND circuit 301. The other input terminal of the NAND circuit 301 is connected to the receiving device 211. The output terminal of the NAND circuit 301 is connected to the input terminal of the inverter 302. The output terminal of the inverter 302 is connected to the circuit on the subsequent stage, e.g. the system of the subsequent stage shown in FIG. 28.

The NAND circuit 301 receives a stop signal d2 via the inverter 300 and also receives an input signal a1. Receiving the stop signal d2 having passed through the inverter 300 and the input signal a1, the NAND circuit 301 generates a signal indicating a negative AND of these signals and outputs the generated signal via the inverter 302. The signal output from the inverter 302 is termed t1.

As a result, the output signal stop device 224 is arranged so that the waveform of the input signal a1 is identical with the waveform of the signal e1 output from the inverter 302, while the stop signal d2 is at the low level. On the other hand, the output signal stop device 224 is arranged so that the signal e1 output from the inverter 302 is kept at the high level irrespective of the waveform of the input signal a1, while the stop signal d2 is at the high level.

FIG. 29 shows a timing chart for illustrating the principle of operation of the above-described pulse width variation monitoring means of the present invention. In the timing chart shown in FIG. 29, the vertical axis indicates the level of a signal whereas the horizontal axis indicates time (period). The following will discuss the principle of operation of the pulse width variation monitoring means of the present invention, from the detection of a variation in pulse width to the stop of external output.

An input signal a1 shown in FIG. 29 is an optical signal having been modulated by four-valued PPM. In this case, the input signal a1 is made up of four types of pulses "00", "01", "10", and "11" which are first pulses N1 but different in pulse positions. In the input signal a1, in a part where the pulse "00" is output immediately after the output of the pulse "11", a second pulse N2 appears because the first pulse N1 of the pulse "11" is joined with the first pulse N1 of the pulse "00".

The edge detection signal a3 shown in FIG. 29 is obtained by detecting the falling edge of the input signal a1. More specifically, the edge detection signal a3 is at the high level for a very short period of time immediately after the fall of the input signal a1.

The output c2 of the one-shot circuit 241 shown in FIG. 29 is a pulse which is changed to the high level immediately after the rise of the edge detection signal a3. The period during which the output c2 of the one-shot circuit 241 is kept at the high level is t241.

The output c2 of the one-shot circuit 241 shown in FIG. 29 adopts, as the period t241, two types of periods ta and tb. This can be achieved by adopting the one-shot circuit 260 shown in FIG. 24 as the one-shot circuit 241 and controlling the period t241 in the aforesaid manner. The period t241 may be only a single type of period as a matter of course, and may be three or more types of periods.

The period t241 is preferably longer than the period corresponding to the pulse width of the first pulse N1 and shorter than the below-mentioned period t242. As discussed above, the period corresponding to the pulse width of the first pulse N1 is 125 (nsec). Therefore the period t241 is arranged, for example, such that the period ta is 150 (nsec) which is 1.2 times as long as the period corresponding to the pulse width of the first pulse N1 and the period tb is 160 (nsec) which is slightly longer than the period ta.

The output c3 of the one-shot circuit 242 shown in FIG. 29 is a pulse changed to the high level immediately after the rise of the edge detection signal a3. The period during which the output c3 of the one-shot circuit 242 is kept at the high level is t242.

Being similar to the output c2 of one-shot circuit 241, the output c3 of the one-shot circuit 242 shown in FIG. 29 adopts as the period t242 two types of periods tc and td. The present invention, however, is not limited to this arrangement The period t242 may be only a single type of period as a matter of course, or may be three or more types of periods.

The period t242 is preferably longer than the aforesaid period t241 and shorter than the period corresponding to the pulse width of the second pulse N2. As described above the period corresponding to the pulse width of the second pulse N2 is 250 (nsec). Therefore the period t242 is arranged such that, for example, the period tc is 200 (nsec) which is 0.8 times as long as the period corresponding to the pulse width of the second pulse N2, and the period td is arranged to be 210 (nsec) which is slightly longer than the period tc.

As a result of this, the output c4 of the EXOR circuit 243 shown in FIG. 29 is arranged such that a pulse which is at the high level during the period of 50 (nsec) is output in each cycle of the input signal a1.

In the meanwhile, the edge detection signal b3 shown in FIG. 29 is a signal obtained by detecting the rising edge of the input signal a1. More specifically, the edge detection signal b3 is a signal which is at the high level for a very short period of time immediately after the rise of the input signal a1.

The output d1 of the AND circuit 290 shown in FIG. 29 indicates, as discussed above, an AND of the reference pulse c4 and the edge detection signal b3.

In case where no variation in pulse width occurs in the input signal a1, there is no period in which both the output c4 of the EXOR circuit 243 shown in FIG. 29 and the edge detection signal b3 are at the high level. In FIG. 29, the case where no variation in pulse width occurs in the input signal a1 indicates a case where a normal second pulse 310 or a normal first pulse 311 appears on the input signal a1. In this case the output d1 of the AND circuit 290 is kept at the low level.

In the meanwhile, when a variation in pulse width occurs in the input signal a1, there is a period in which both the output c4 of the EXOR circuit 243 shown in FIG. 29 and the edge detection signal b3 are at the high level. In FIG. 29, the case where a variation in pulse width occurs in the input signal a1 indicates a case where, in the input signal a1, the second pulse 312 involves pulse shortening or the first pulse 313 involves pulse widening. In this case the output d1 of the AND circuit 290 is at the high level during this period.

The stop signal d2 shown in FIG. 29 is a pulse which is changed to the high level immediately after the rise of the output d1 of the AND circuit 290. The period during which the stop signal d2 is kept at the high level is t23. This period t23 is required to be at least equal to or longer than one cycle of the input signal a1, and is preferably equivalent to the period corresponding to one packet of the input signal a1.

The output e1 of the inverter 302 shown in FIG. 29 has the same waveform as the signal that the receiver of the present invention supplies to the circuit of the subsequent stage, e.g. the system of the subsequent stage shown in FIG. 28. In short, the signal e1 is an external output of the optical receiver 201.

When the stop signal d2 is kept at the low level, the output e1 of the inverter 302 shown in FIG. 29 has the same waveform as the input signal a1.

In the meanwhile, when the stop signal d2 is kept at the high level, the output e1 of the inverter 302 shown in FIG. 29 is kept at the high level in the similar manner as the stop signal d2.

The input signal a1 is originally input as a negative-logic signal. Therefore, while the output e1 of the inverter 302 shown in FIG. 29 is kept at the high level, substantially no signal is supplied from the receiving device 211 to the aforesaid circuit of the subsequent stage. In other words, the external output of the input signal a1 is disallowed while the output e1 of the inverter 302 shown in FIG. 29 is kept at the high level.

As a result, the output signal stop device 224 of the pulse width monitoring device 212, which is shown in FIG. 20 for example, can stop the external output of the input signal a1 while the period t23 in which the stop signal d2 output from the stop signal generation circuit 223 is kept at the high level.

In this manner, in the receiver of the present invention, the pulse width monitoring device makes it possible to stop external output to the circuit of the subsequent stage, when a variation in pulse width is detected in the signal supplied from the receiving device.

The subject application assumes that the signal supplied from the receiving device, i.e. the input signal a1, is a negative-logic signal.

However, even when the signal from the receiving device is a positive-logic signal, the receiver of the present invention can detect a variation in pulse width in the signal from the receiving device and stop an external output to the circuit of the subsequent stage if a variation is detected, in the same manner as above.

Figure 30:
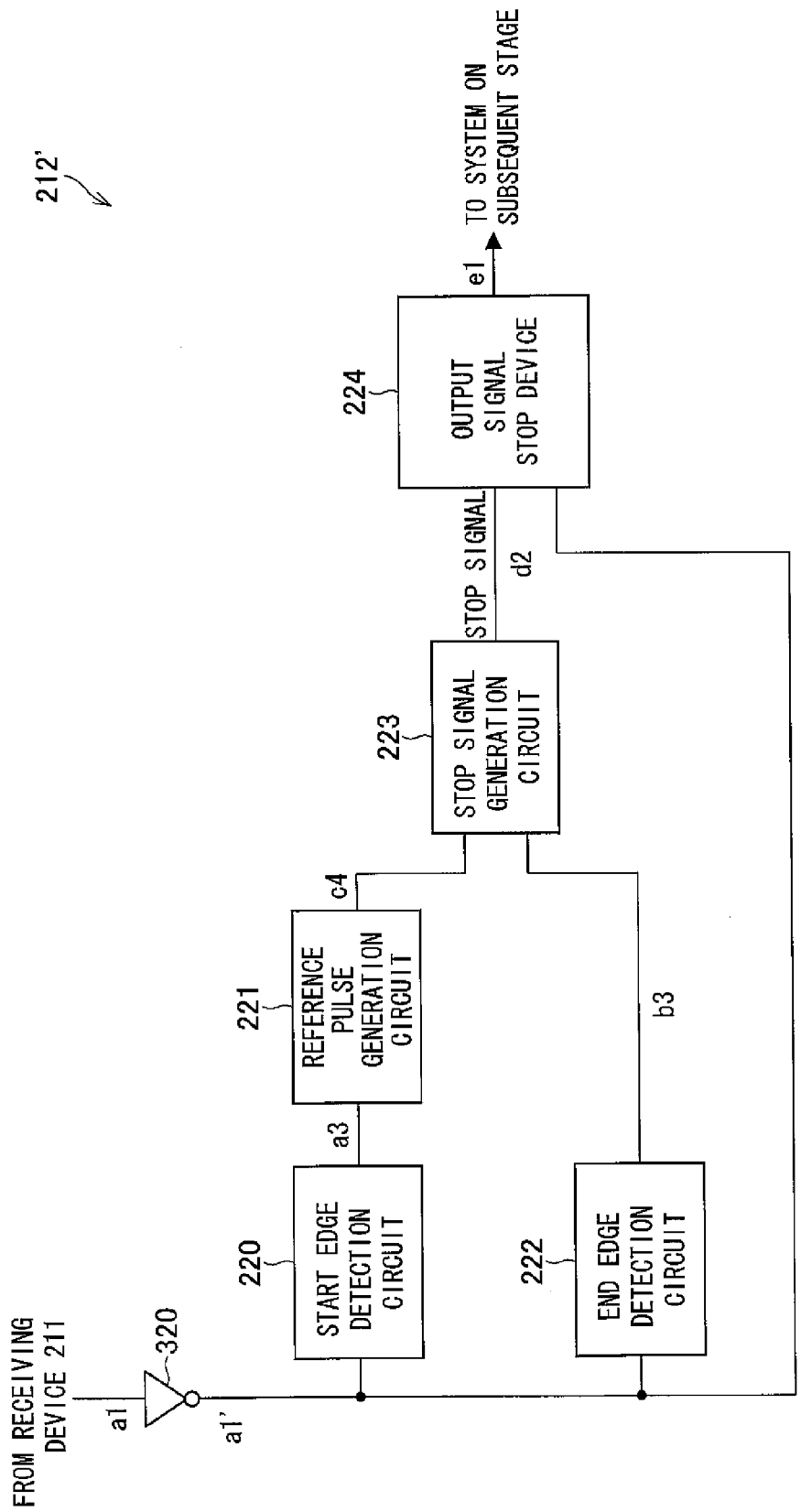
FIG. 30 is a block diagram showing an example of a pulse width monitoring device of the present invention in case where a signal of positive logic is input.

That is to say, when the signal supplied from the receiving device is a positive-logic signal, a pulse width monitoring device 212' shown in FIG. 30 is used. This pulse width monitoring device 212' is identical with the pulse width monitoring device 212 shown in FIG. 20 except that an inverter 320 is provided at the first stage. In the pulse width monitoring device 212', an input signal a1 supplied from the receiving device, which has been logically inverted, is supplied to the start edge detection circuit 220, the end edge detection circuit 222, and the output signal stop device 224. That is to say, the signal a1' which is supplied to the start edge detection circuit 220, the end edge detection circuit 222, and the output signal stop device 224 is considered as a signal which is generated by converting a positive-logic input signal a1 into a negative-logic signal. In the pulse width monitoring device 212' shown in FIG. 30, the start edge detection circuit 220, the reference pulse generation circuit 221, the end edge detection circuit 222, the stop signal generation circuit 223, and the output signal stop device 224 perform the aforesaid processes onto the signal a1'. As a result, even when the signal from the receiving device is a positive-logic signal, the receiver of the present invention can detect a variation in pulse width in the signal from the receiving device and stop an external output to the circuit of the subsequent stage if a variation is detected, in the same manner as above.

The receiver of the present invention is suitably used as a receiver of an electronic device receiving a transmitted optical signal. Examples of such an electronic device include mobile terminals such as mobile phones, infrared wireless earphones, and the like, which receive a transmitted optical signal in a wireless manner.

Embodiment 6

Figure 33:
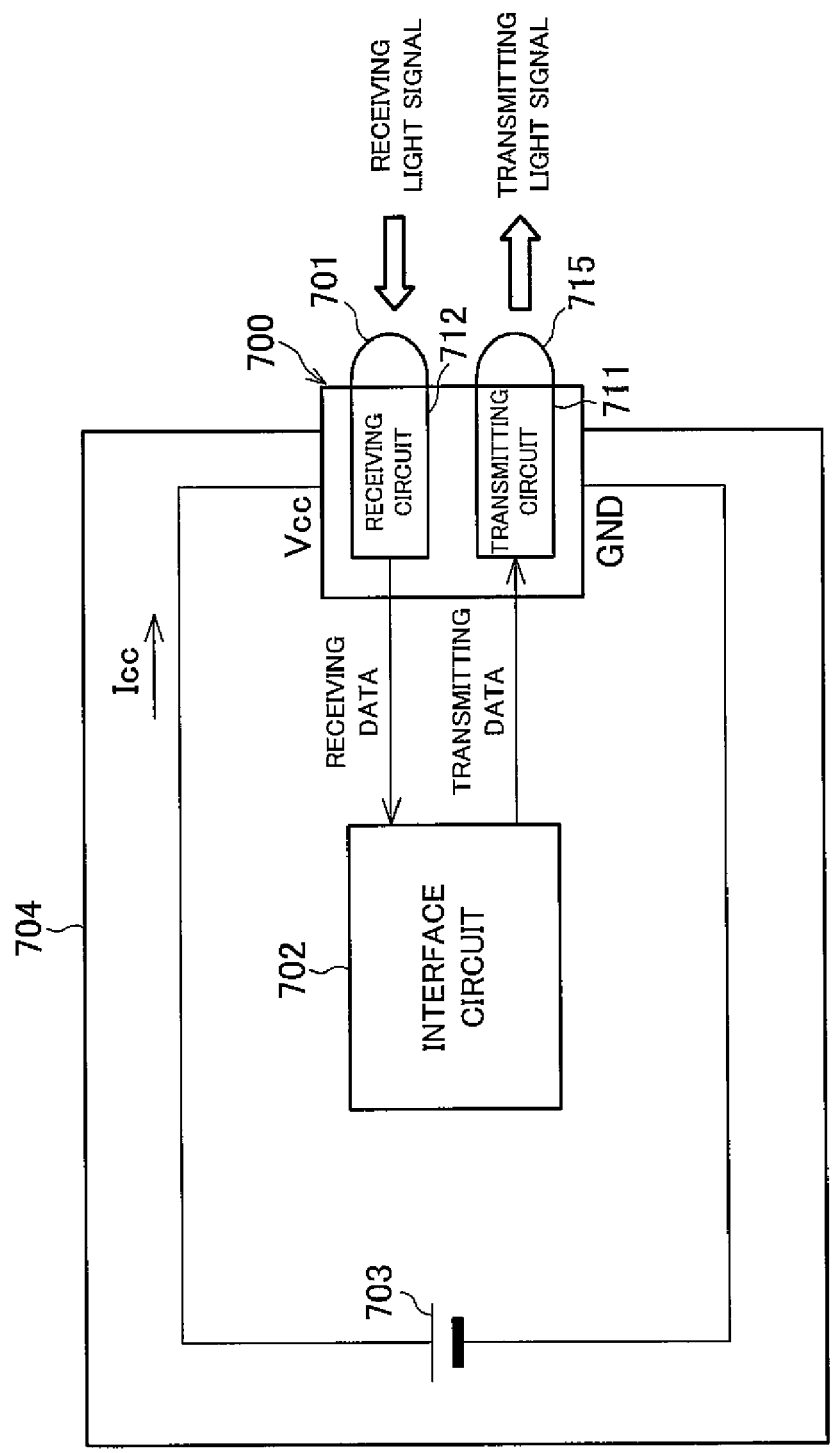
FIG. 33 is a block diagram of an electronic device including a receiver of the present invention.

FIG. 33 relates to an embodiment of the present invention and is a block diagram showing an example of an electronic device. By the way, members having the same functions as those already described with reference to figures are given the same numbers, so that the descriptions are omitted for the sake of convenience.

As shown in FIG. 33, this electronic device has, for example, an infrared communication function compliant with IrDA, and performs data communications with another communication device by infrared light. The electronic device shown in FIG. 33 includes an IrDA module 700, an interface circuit 702, a battery 703, and a housing 704.

The IrDA module 700 which is an infrared communication element includes a transmitting circuit 711, a receiving circuit 712, a light emitting element 715, and a light receiving element 701. The light emitting element 715 and the light receiving element 701 are attached to the housing 704 so as to expose to the outside. Inside the housing 704, the interface circuit 702 and the battery 703 are provided.

The interface circuit 702 performs modulation or the like based on transmitted information, so as to generate transmission data (transmission signal) supplied to the transmitting circuit 711. The interface circuit 702 outputs receiving information by performing modulation or the like based on receiving data (receiving signal) from the receiving circuit 712.

The battery 703 is provided to supply electric power to the IrDA module 700, and is connected to the IrDA module 700 via a power source line (Vcc) and a GND line. This battery 703 may supply power to the interface circuit 702. The member with the reference sign Icc, which is not described here, is a power source line for a protection circuit (not illustrated).

The receiving circuit 712 amplifies an electric signal obtained by performing photoelectric conversion of an optical signal received by the light receiving element 701, so as to output receiving data. The receiving circuit 712 is the optical receiver 1 (see FIG. 1) or the optical receiver 201 (see FIG. 19).

The transmitting circuit 711 includes a drive circuit which drives a light emitting element 715 in order to convert a transmitting signal (electric signal) into an optical signal by the light emitting element 715 and output the signal to the outside.

Adopting the optical receiving 1 in the receiving circuit 712, it is possible to realize a receiver which can reduce an unpleasant noise which is caused by a noise in an audio signal due to a variation in pulse width.

Furthermore, adopting the optical receiver 201 in the receiving circuit 712, it is possible to reduce, in a receiver which performs data transmission by an optical signal with two types of known pulse widths, a possibility of outputting an erroneous signal to the outside.

In this way, the receiver of the present invention can be suitably used as a receiver of an electronic device receiving a transmitted optical signal. Examples of such an electronic device include mobile terminals such as mobile phones and infrared wireless earphones.

To achieve the objective, the present invention optical receiver (receiver) of the present invention, which receives a transmitted optical signal as a digital signal constituted by a pulse train with a known pulse width, includes an abnormal pulse detection circuit which detects, by comparing the received optical signal with a reference digital signal generated based on the optical signal, a variation in pulse width in the optical signal being transmitted, and stops external output of the received optical signal for a predetermined period of time if a variation in the pulse width is detected in the optical signal.

In this arrangement, the received optical signal is compare with a reference pulse generated by the circuit based on the optical signal so that detection of a variation in the pulse width of the optical signal being transmitted is carried out, and external output of the received optical signal is stopped for a predetermined period of time if a variation in the pulse width is detected.

It is therefore possible to realize an optical receiver which can reduce discomfort in hearing reproduced sound when noise occurs in the audio signal on account of a variation in pulse width.

In the arrangement above, furthermore, the received optical signal is compared with a reference pulse generated by the circuit based on the optical signal. Therefore, it is possible to realize an optical receiver which can detect a minute loss of the pulse and a variation in the pulse width in the width direction of the pulse, when noise occurs in the audio signal for the reason of a variation in the pulse width.

The optical receiver of the present invention receives the optical signal as a negative-logic digital signal constituted by a low level indicating a signal "1" and a high level indicating a signal "0", and the abnormal pulse detection circuit includes: an incoming pulse edge detection circuit which detects the moment of fall of the received optical signal and outputs the result of the detection as an edge detection signal; a muting reference pulse generation circuit which generates, based on the edge detection signal output from the incoming pulse edge detection circuit, the reference digital signal as a positive-logic digital signal constituted by a low level indicating a signal "0" and a high level indicating a signal "1"; a logic circuit which outputs a signal indicating a negative AND of the optical signal and the reference digital signal; a muting signal generation circuit which generates a muting signal which disallows the external output of the received optical signal for a predetermined period time, based on a signal generated by logically inverting the signal indicating the negative AND output from the logic circuit; and a switching circuit which stops the external output of the optical signal for the predetermined period of time if the muting signal is input.

In the arrangement above, when the optical signal is input as a negative-logic digital signal, the moment of fall of the input optical signal is detected and the result of the detection is output as an edge detection signal. Subsequently, based on the edge detection signal, a reference digital signal is generated as a positive-logic digital signal. Then a muting signal is generated based on a signal generated by logically inverting a signal indicating a negative AND of the optical signal and the reference digital signal. Using this muting signal, the external output of the received optical signal is switched on/off.

The optical receiver of the present invention receives the optical signal as a positive-logic digital signal constituted by a low level indicating a signal "0" and a high level indicating a signal "1", and the abnormal pulse detection circuit includes: an incoming pulse edge detection circuit which detects the moment of rise of the received optical signal and outputs the result of the detection as an edge detection signal; a muting reference pulse generation circuit which generates, based on the edge detection signal output from the incoming pulse edge detection circuit, the reference digital signal as a negative-logic digital signal constituted by a low level indicating a signal "1" and a high level indicating a signal "0"; a logic circuit which outputs a signal indicating a negative OR of the optical signal and the reference digital signal; a muting signal generation circuit which generates a muting signal which disallows the external output of the received optical signal for a predetermined period of time, based on the signal indicating negative OR output from the logic circuit; and a switching circuit which stops the external output of the received optical signal for the predetermined period of time when the muting signal is input.

In the arrangement above, when the optical signal is input as a positive-logic digital signal, the moment of rise of the input optical signal is detected and the result of the detection is output as an edge detection signal. Subsequently, based on the edge detection signal, a reference digital signal is generated as a negative-logic digital signal. Then a muting signal is generated based on a signal indicating a negative OR of the optical signal and the reference digital signal. Using this muting signal, the external output of the received optical signal is switched on/off.

The optical receiver of the present invention may be arranged such that the pulse width of the reference digital signal is shorter than the known pulse width of the optical signal and the pulse width of the muting signal is not shorter than a pulse width corresponding to one cycle of the optical signal. The optical receiver of the present invention may be arranged such that the pulse width of the reference digital signal is longer than the known pulse width of the optical signal but shorter than a pulse width corresponding to one cycle of the pulse train of the optical signal, and the pulse width of the muting signal corresponds to the maximum cycle in which no pulse occurs in the optical signal.

To detect in the optical signal an abnormal pulse whose pulse width is shorter than a known pulse width, such as pulse shortening, pulse division, generation of a false pulse whose pulse width is shorter than a known pulse width, it is preferable that the pulse width of the reference digital signal is arranged to be shorter than the known pulse width of the optical signal and the pulse width of the muting signal is arranged to be not shorter than a pulse width corresponding to one cycle of the optical. On the other hand, to detect in the optical signal an abnormal pulse whose pulse width is longer than a known pulse width, such as pulse widening and generation of a false pulse whose pulse width is longer than the known pulse width, it is preferable that the pulse width of the reference digital signal is arranged to be longer than the known pulse width of optical signal and to be shorter than a pulse width corresponding to one cycle of the pulse train of the optical signal, and the pulse width of the muting signal is arranged to be the maximum cycle in which no pulse occurs in the optical signal.

In the subject application, "one cycle of the optical signal" indicates a period from the moment of rise of a particular pulse of the optical signal to the moment of rise of the pulse directly subsequent to said particular pulse. Also, in the subject application, "the maximum cycle in which no pulse occurs in the optical signal" indicates a cycle in which, among n (n is an integer) cycles in which no pulse occurs in the optical signal, this integer n is maximum. That is to say, in a period longer than this cycle, at least one pulse occurs in the optical signal.

The optical receiver of the present invention, which receives a transmitted optical signal as a digital signal which is a pulse train constituted by a first pulse having a known pulse width and a second pulse having another known pulse width which is longer than the known pulse width of the first pulse, includes a pulse width variation monitoring device for generating a first reference digital signal and a second reference digital signal based on the received optical signal, detecting a variation in pulse width in the received optical signal by comparing the first and second reference digital signals with one another, and stopping external output of the received optical signal for a predetermined period of time if the variation in pulse width is detected.

In the arrangement above, the optical receiver of the present invention receives a transmitted optical signal as a digital signal which is a pulse train constituted by a first pulse having a known pulse width and a second pulse having another known pulse width which is longer than the pulse width of the first pulse. When the optical receiver of the present invention receives a signal in compliant with FIR of IrDA, the first pulse corresponds to a single pulse and the second pulse corresponds to a double pulse.

The optical receiver of the present invention includes a pulse width monitoring device. This pulse width monitoring device stops the external output of the received optical signal for a predetermined period of time, when a variation in pulse width is detected in the received optical signal.

In the arrangement above, when a variation in pulse width occurs in the optical signal for the reason of, for example, a rapid change in the reception characteristic of the optical receiver, the external output of the optical signal is stopped. Therefore the optical receiver of the present invention has a significantly lower possibility of outputting an erroneous signal to the outside.

The pulse width monitoring device generates a first reference digital signal and a second reference digital signal based on the received optical signal, and performs a detection of a variation in pulse width occurring in the received optical signal by comparing the first and second reference digital signals with one another.

Therefore, when a pulse in which a variation in pulse width occurs is a single pulse or double pulse defined by the packet format, it is possible to detect a variation in the single pulse or double pulse defined by the packet format, by the operation above. When a pulse in which a variation in pulse width occurs is a single pulse or double pulse of the aforesaid pulse data) it is possible to detect a variation in the single pulse or double pulse of the pulse data, by the operation above. It other words, a variation in pulse width occurring in a single pulse or double pulse defined by the packet format does not interfere the correct discernment of a single pulse from a double pulse in the pulse data. The optical receiver of the present invention can therefore further reduce a possibility of outputting an erroneous signal to the outside.

On this account, in an optical receiver which performs data transmission by an optical signal with two types of known pulse widths, it is possible to reduce a possibility of outputting an erroneous signal to the outside.

The optical receiver of the present invention receives the optical signal as a negative-logic digital signal, and the pulse width monitoring device includes: start edge detection circuit which generates and outputs an edge detection signal which is a digital signal changed to the high level immediately after the fall of the received optical signal; a reference pulse generation circuit which generates and outputs the first reference digital signal based on the edge detection signal output from the start edge detection circuit; an end edge detection circuit which generates and outputs the second reference digital signal which is a digital signal changed to the high level immediately after the rise of the received optical signal; a stop signal generation circuit which generates and outputs a stop signal which is a digital signal changed to the high level immediately after the rise of a signal indicating a logical AND of the first reference digital signal and the second reference digital signal; and an output signal stop device which stops the external output of the received optical signal while the stop signal output from the stop signal generation circuit is at the high level, and the first reference digital signal generated by and output from the reference pulse generation circuit is a signal indicating an exclusive OR of (i) a first reference pulse which is a digital signal changed to the high level immediately after the rise of the edge detection signal output from the start edge detection circuit and (ii) a second reference pulse which is a digital signal changed to the high level immediately after the rise of the edge detection signal, a period during which the first reference pulse is at the high level being different from the period during which the second reference pulse is at the high level.

In the arrangement above, the start edge detection circuit outputs an edge detection signal which is a digital signal changed to the high level immediately after the fall of the received optical signal, and the reference pulse generation circuit outputs a first reference digital signal based on the edge detection signal. In the meanwhile, the end edge detection circuit outputs the second reference digital signal which is a digital signal changed to the high level immediately after the rise of the received optical signal. The first reference digital signal indicates an exclusive OR of (i) a first reference pulse which is a digital signal changed to the high level immediately after the rise of the edge detection signal output from the start edge detection circuit and (ii) a second reference pulse which is a digital signal changed to the high level immediately after the rise of the edge detection signal, a period during which the first reference pulse is at the high level being different from the period during which the second reference pulse is at the high level.

Then the stop signal generation circuit calculates a logical AND of the first reference digital signal and the second reference digital signal so as to perform a comparison of these reference digital signals. That is to say, when the signal indicating the logical AND of the first reference digital signal and the second reference digital signal is at the high level, i.e. when the first reference digital signal and the second reference digital signal are simultaneously output, the stop signal generation circuit generates and outputs a stop signal which is a digital signal changed to the high level immediately after the rise of the signal indicating the logical AND. This indicates that the stop signal generation circuit can detect a variation in pulse width of the optical signal by setting the periods in which the first reference pulse and the second reference pulse are at the high level, respectively, in such a way that the period in which the first reference digital signal is at the high level is equal to the period in which the optical signal in which a variation in pulse width occurs rises.

The output signal stop device stops the external output of the received optical signal while the stop signal output from the stop signal generation circuit is at the high level.

The start edge detection circuit is only required to output a high-level signal immediately after the fall of a digital signal supplied thereto. The start edge detection circuit can therefore have a very simple arrangement adopting a publicly-known differentiation circuit or the like. For the same reason the end edge detection circuit can have a very simple arrangement adopting a publicly-known differentiation circuit or the like.

The reference pulse generation circuit and the stop signal generation circuit are only required to be able to set a period during which a digital signal supplied thereto is at the high level to be a predetermined period. Therefore each of the reference pulse generation circuit and the stop signal generation circuit can have a very simple arrangement adopting a publicly-known one-shot circuit or the like.

The output signal stop device is only required to be able to stop the external output of the received optical signal while the stop signal supplied from the stop signal generation circuit is at the high level. Therefore it is possible to easily realize the output signal stop device by combining a logic circuit which an inverter, without adopting any complicated arrangements.

As such all of the aforesaid members constituting the pulse width monitoring device can be easily realized by means of publicly-known circuits.

The optical receiver of the present invention is arranged such that the pulse width of the first reference pulse is shorter than the pulse width of the second reference pulse but longer than the pulse width of the first pulse, and the pulse width of the second reference pulse is shorter than the pulse width of the second pulse.

In this arrangement, a signal indicating an exclusive OR of the first reference pulse and the second reference pulse has a high-level period from the rise of the first pulse to the rise of the second pulse. Setting the first reference pulse and the second reference pulse in this way, the optical receiver of the present invention can simultaneously detect pulse widening in a first pulse and pulse shortening in a second pulse.

The optical receiver of the present invention is arranged such that the pulse width of the stop signal is longer than a pulse width corresponding to one cycle of the received optical signal.

In this arrangement, it is possible to surely stop the external output of the optical signal in which a variation in pulse width is occurring, by setting the pulse width of the stop signal to be longer than a pulse width corresponding to one cycle of the received optical signal.

The optical receiver of the present invention is arranged such that the reference pulse generation circuit is arranged to include a one-shot circuit, and the one-shot circuit includes a trimming circuit by which the pulse width of the first reference digital signal is adjusted.

In this arrangement, since the pulse width of the first reference digital signal is adjustable by the trimming circuit, it is possible to suitably control the pulse width of the first reference digital signal, without design change.

The optical receiver of the present invention is arranged such that the reference pulse generation circuit is arranged to include a one-shot circuit and the one-shot circuit includes a comparator whose inverting input terminal receives a voltage from a band gap voltage source.

In this arrangement, the inverting input terminal of the comparator of the one-shot circuit of the reference pulse generation circuit outputting first reference digital signal receives a voltage from a band gap voltage source. It is therefore possible to apply a voltage independent from the power source voltage and temperatures to the inverting input terminal of the comparator. As a result, it is possible to restrain a variation in pulse width of the first reference digital signal, which is caused by changes in the environment of the optical receiver of the present invention.

An electronic device of the present invention includes any one of the aforesaid optical receivers and receives a transmitted optical signal by means of the optical receiver.

In this arrangement, it is possible to realize an optical receiver which can reduce discomfort in hearing reproduced sound when noise occurs in the audio signal on account of a variation in pulse width.

Furthermore, in the aforesaid electronic device including the optical receiver of the present invention, it is possible to reduce a possibility of sending an erroneous signal to the stage subsequent to the optical receiver. For example, when the stage subsequent to the electronic device of the present invention is a control system for controlling the optical receiver, it is possible to reduce a possibility of sending an erroneous signal to the control system. As a result of this, in the control system a possibility of failing to properly control the optical receiver is reduced, and a possibility of receiving errors is reduced in the entirety of the electronic device.

The present invention is suitably used for, for example, a receiver which receives audio data in a wireless manner and an electronic device which receives transmitted audio data in a wireless manner by the receiver.

Also, the present invention is suitably used as a receiver which receives an optical signal as a digital signal which is a pulse train constituted by a first pulse with a known pulse width and a second pulse with another known pulse width which is longer than that of the first pulse.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

What is claimed is:

1. A receiver which receives a transmitted optical signal as a digital signal constituted by a pulse train with a known pulse width, the receiver comprising abnormal pulse detection means for detecting, by comparing the received optical signal with a reference digital signal generated based on the optical signal, a variation in pulse width in the optical signal being transmitted, and stopping external output of the received optical signal for a predetermined period of time if the variation in the pulse width is detected in the optical signal, wherein, the optical signal is input as a negative-logic digital signal constituted by a low level indicating a signal "1" and a high level indicating a signal "0", and the abnormal pulse detection means includes:

incoming pulse edge detection means for detecting a moment of fall of the received optical signal and outputting a result of detection as an edge detection signal;

reference pulse generation means for generating the reference digital signal as a positive-logic digital signal constituted by a low level indicating a signal "0" and a high level indicating a signal "1", based on the edge detection signal output from the incoming pulse edge detection means;

logic means for outputting a signal indicating a negative AND of the optical signal and the reference digital signal;

muting signal generation means for generating, based on a signal generated by logically inverting the signal indicating the negative AND output from the logic means, a muting signal which disallows the external output of the received optical signal for the predetermined period of time; and output stop means for stopping the external output of the received optical signal for the predetermined period of time, if the muting signal is input.

2. The receiver as defined in claim 1, wherein, the reference digital signal has a shorter pulse width than the known pulse width of the optical signal, and the muting signal has a pulse width equal to or longer than a pulse width corresponding to one cycle of the optical signal.

3. The receiver as defined in claim 1, wherein, the reference digital signal has a pulse width which is longer than the known pulse width of the optical signal but is shorter than a pulse width corresponding to one cycle of the pulse train of the optical signal, and the muting signal has a pulse width corresponding to a maximum cycle in which no pulse occurs in the optical signal.

4. A receiver which receives a transmitted optical signal as a digital signal constituted by a pulse train with a known pulse width, the receiver comprising abnormal pulse detection means for detecting, by comparing the received optical signal with a reference digital signal generated based on the optical signal, a variation in pulse width in the optical signal being transmitted, and stopping external output of the received optical signal for a predetermined period of time if the variation in the pulse width is detected in the optical signal, wherein, the optical signal is input as a positive-logic digital signal constituted by a low level indicating a signal "0" and a high level indicating a signal "1", and the abnormal pulse detection means includes:

incoming pulse edge detection means for detecting a moment of rise of the received optical signal and outputting a result of detection as an edge detection signal;

reference pulse generation means for generating the reference digital signal as a negative-logic digital signal constituted by a low level indicating a signal "1" and a high level indicating a signal "0", based on the edge detection signal output from the incoming pulse edge detection means;

logic means for outputting a signal indicating a negative OR of the optical signal and the reference digital signal;

muting signal generation means for generating, based on the signal indicating the negative OR output from the logic means, a muting signal which disallows the external output of the received optical signal for the predetermined period of time; and output stop means for stopping the external output of the received optical signal for the predetermined period of time, if the muting signal is input.

5. The receiver as defined in claim 4, wherein, the reference digital signal has a shorter pulse width than the known pulse width of the optical signal, and the muting signal has a pulse width equal to or longer than a pulse width corresponding to one cycle of the optical signal.

6. The receiver as defined in claim 4, wherein, the reference digital signal has a pulse width which is longer than the known pulse width of the optical signal but is shorter than a pulse width corresponding to one cycle of the pulse train of the optical signal, and the muting signal has a pulse width corresponding to a maximum cycle in which no pulse occurs in the optical signal.

* * * * *